(12) United States Patent
Zhang et al.

(10) Patent No.: US 10,715,789 B2
(45) Date of Patent: Jul. 14, 2020

(54) LIGHT-DEFLECTION THREE-DIMENSIONAL IMAGING DEVICE AND PROJECTION DEVICE, AND APPLICATION THEREOF

(71) Applicant: NINGBO SUNNY OPOTECH CO., LTD., Ningbo, Zhejiang (CN)

(72) Inventors: Kouwen Zhang, Ningbo (CN); Baozhong Zhang, Ningbo (CN); Huanbiao Zhou, Ningbo (CN); Qiang Li, Ningbo (CN); Jie Zheng, Ningbo (CN); Ding Lu, Ningbo (CN); Junjie Zeng, Ningbo (CN); Peng Lu, Ningbo (CN); Zhifu Yu, Ningbo (CN); Bainian Chu, Ningbo (CN); Zongze Wang, Ningbo (CN)

(73) Assignee: Ningbo Sunny Opotech Co., Ltd., Ningbo, Zhejiang (CN)

( * ) Notice: Subject to any disclaimer, the term of this patent is extended or adjusted under 35 U.S.C. 154(b) by 347 days.

(21) Appl. No.: 15/309,202

(22) PCT Filed: May 6, 2015

(86) PCT No.: PCT/CN2015/078366
§ 371 (c)(1),
(2) Date: Nov. 6, 2016

(87) PCT Pub. No.: WO2015/169220
PCT Pub. Date: Nov. 12, 2015

(65) Prior Publication Data
US 2017/0094257 A1 Mar. 30, 2017

(30) Foreign Application Priority Data

May 6, 2014 (CN) .......................... 2014 1 0187525
May 6, 2014 (CN) .................... 2014 2 0232662 U (Continued)

(51) Int. Cl.
*H04N 13/254* (2018.01)
*H04N 13/30* (2018.01)
(Continued)

(52) U.S. Cl.
CPC .......... *H04N 13/254* (2018.05); *F21V 5/008* (2013.01); *F21V 13/04* (2013.01); *G01B 11/25* (2013.01);
(Continued)

(58) Field of Classification Search
None
See application file for complete search history.

(56) References Cited

U.S. PATENT DOCUMENTS

| 6,141,105 A * | 10/2000 | Yahashi | G01B 11/005 |
| | | | 356/623 |
| 6,252,659 B1 * | 6/2001 | Norita | G01B 11/2522 |
| | | | 356/625 |

(Continued)

FOREIGN PATENT DOCUMENTS

JP        2014059301 A *  4/2014  ............ G01S 17/89

*Primary Examiner* — Kate H Luo
(74) *Attorney, Agent, or Firm* — Raymond Y. Chan; David and Raymond Patent Firm

(57) ABSTRACT

A light-deflection three-dimensional imaging device and a projection device, and the application thereof are provided. The light-deflection three-dimensional imaging device includes a projection device, a receiving device and a processor. The projection device includes a light source, a grating, a condensing lens group, a light deflection element and an emission lens, wherein after the modulation by the grating, the aggregation by the condensing lens group and the deflection by the light deflection element, the projection light transmitted by the light source penetrates the emission lens and is emitted from a side surface of the projection device. The light deflection element is provided to change a projection path of light emitted from the light source, (Continued)

thereby changing an installation manner of the projection device, so that the thickness thereof is significantly reduced, thereby facilitating the installation in lighter and thinner electronic mobile devices, such as a mobile phone, a laptop, a tablet computer, etc.

8 Claims, 52 Drawing Sheets

(30) Foreign Application Priority Data

| Dec. 19, 2014 | (CN) | .......................... 2014 1 0797771 |
|---|---|---|
| Feb. 2, 2015 | (CN) | .......................... 2015 1 0051633 |
| Feb. 10, 2015 | (CN) | .......................... 2015 1 0068183 |
| Feb. 10, 2015 | (CN) | ..................... 2015 2 0092995 U |

(51) Int. Cl.

| H01L 33/64 | (2010.01) |
|---|---|
| H02J 7/00 | (2006.01) |
| G01B 11/25 | (2006.01) |
| G02B 7/04 | (2006.01) |
| G03B 35/18 | (2006.01) |
| F21V 5/00 | (2018.01) |
| F21V 13/04 | (2006.01) |
| G02B 27/42 | (2006.01) |
| H04N 5/225 | (2006.01) |

(52) U.S. Cl.
CPC ............ *G02B 7/04* (2013.01); *G02B 27/425* (2013.01); *G03B 35/18* (2013.01); *H01L 33/64* (2013.01); *H02J 7/00* (2013.01); *H04N 5/2252* (2013.01); *H04N 5/2254* (2013.01); *H04N 13/30* (2018.05)

(56) References Cited

U.S. PATENT DOCUMENTS

| 9,332,167 | B1* | 5/2016 | Pance | ................. H04N 5/2258 |
|---|---|---|---|---|
| 2002/0060788 | A1* | 5/2002 | Ohtomo | ............... G01C 15/002 |
| | | | | 356/139.1 |
| 2003/0136901 | A1* | 7/2003 | Ohtomo | ............... G01C 15/004 |
| | | | | 250/234 |
| 2009/0235543 | A1* | 9/2009 | Hayashi | ................... G01C 3/02 |
| | | | | 33/293 |
| 2012/0246899 | A1* | 10/2012 | Yamada | ................. G01B 11/24 |
| | | | | 29/407.04 |
| 2013/0010469 | A1* | 1/2013 | Pitkanen | ................... F21S 4/24 |
| | | | | 362/235 |
| 2013/0188154 | A1* | 7/2013 | Tomioka | .............. G03B 21/008 |
| | | | | 353/31 |
| 2013/0235385 | A1* | 9/2013 | Nakajima | .......... G01B 9/02004 |
| | | | | 356/489 |
| 2013/0236850 | A1* | 9/2013 | Wu | ..................... A61B 1/00172 |
| | | | | 433/29 |
| 2013/0250066 | A1* | 9/2013 | Abraham | ........... G01B 11/2513 |
| | | | | 348/46 |
| 2016/0033771 | A1* | 2/2016 | Tremblay | ............... G02B 26/10 |
| | | | | 345/8 |

* cited by examiner

LIGHT-DEFLECTION THREE-DIMENSIONAL IMAGING DEVICE AND PROJECTION DEVICE, AND APPLICATION THEREOF

CROSS REFERENCE OF RELATED APPLICATION

This is a U.S. National Stage under 35 U.S.C. 371 of the International Application Number PCT/CN2015/078366, filed May 6, 2015, which claims priority under 35 U.S.C. 119(a-d) to Chinese applications, application number 201410187525.0, filed May 6, 2014, application number 201420232662.7, filed May 6, 2014, application number 201410797771.8, filed Dec. 19, 2014, application number 201510051633.X, filed Feb. 2, 2015, application number 201510068183.5, filed Feb. 10, 2015, application number 201520092995.9, filed Feb. 10, 2015, application number 201510078530.2, filed Feb. 13, 2015, and application number 201510110047.8, filed Mar. 13, 2015. The afore-mentioned patent applications are hereby incorporated by reference in their entireties.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to an optical imaging device, in particular, to a light-deflection three-dimensional imaging device and projection device, and application thereof, which alters projection path of the light that was emitted from the light source by providing a light deflection element, so as to reduce the thickness and facilitate the installation of the projection device.

Description of Related Arts

In the field of advanced electronic device, devices, like mobile phones especially, have integrated a lot of functions. For other electronic device, the typical input and output devices are gradually switched from single devices, such as keyboards and mice, to integrated equipment, which means that more diverse and spatial devices can all be combine to a single equipment.

The combination refers to a future trend, which is to broaden the profundity and variety of camera being an input device. With decades of development, majority of the electronic devices are equipped with camera, such as mobile phone, television, and computer. The traditional camera provides basic functions like picture shooting and action capturing that is a great convenience to people. The future trend is not just to collect signals from a plane surface, but to provide 3D Stereoscopic Imaging and further functions like measuring, drawing, and thereof.

There is a relatively mature three-dimensional imaging technology in the market, which is structured light technology. Structured light technology is an active optical measuring method. The basic principle is to have structured light to project on the measured object with controllable light spot, light bar, or light structure, and to obtain the image via image sensing device (e.g. camera), and to create the three-dimensional coordinate of the object by triangulation method and geometry of the system. The structured light measuring method features simple calculation, smaller cube, lower price, and easy to install and maintain. It is widely used in actual 3D profile measurement The most common method is to project light through projection device. The light will pass through a specific grating pattern and a set of camera lens. Then the light emitted by the projection device will be projected on the surface of the measured object. Because the grated image remarked by the grating pattern will be reflected, the phase and amplitude will be distorted by the modulation of the height of the surface of the object. The receiving device can sense the distortion cause by the modulation of the height of the surface of the object. This distortion of grated image can be explained as a spatial carrier signal of the modulated phase and amplitude. This distorted grated image is collected and demodulated through processor to obtain the phase information. Then the specific height and depth information are calculated by triangulation method or other algorithms.

Specifically speaking, first of all, common light sources of a projection device are mainly vertical cavity surface emitting laser, laser diode, light emitting diode, etc. The major features of these light source emitter are focused on even emitted light and strong enough luminous power.

The light of the projection device emits through a grating which is an optical element that periodically spatially modulates the amplitude or phase (or both) of the input light. The number of notch of each grating is determined by the wavelength range of the spectrophotometry, wherein the distance between two notches should be close to the order of magnitude of the wavelength. The more the notches are within one unit length, the larger the degree of dispersion is. The resolution performance of a grating is determined by the number of notch. Common gratings are diffraction grating that uses diffraction effect to modulate light. The design of a grating is related to the backstage algorithm of the three-dimensional imaging device.

Then, the light modulated by the grating is projected to a set of lenses, wherein the set of lenses can refract the grating modulated light. Common lens usually applies the form of compound camera lens to compose a plurality of various forms and types of convex and concave lenses into a converged lens. However, the lens itself is composed by many convex and concave lenses which make the volume big and thick, which becomes a critical part of the whole camera lens module. The combination of light source, grating, and lens is thick, that hinders the current three-dimensional imaging device from being thinner. This difficulty also blocks the development of thinner mobile phone, laptop, tablet computer, and the other electronic mobile devices.

The light aggregated by the lenses and modulated by the grating is projected to the outside and on the surface of target object and reflected. Meanwhile, there is a receiving device collecting all the light signals with the phase and amplitude changes modulated by the grating. The light signals are processed and demodulated by a background processor on the basis of triangulation method or other computation theories to come out with the distances of multiple dots or moving dots and the height information of the target object.

Therefore, it forms an image information with 3D stereoscopic sensation. Also the information of the dots can be compiled into an image, so as to form a stereoscopic image that has the information of depth, height, etc.

More specifically, FIGS. 1 and 2 illustrate a projection device 10' of a three-dimensional imaging device according to prior art. Referring to FIG. 1, the projection device 10' comprises a light source 11', a grating 12', a set of lens assembly 13', and an emission lens 14' in order. Nonetheless, for conventional three-dimensional imaging device, especially the projection device 10', the optical length presents the distance between the emission lens 14' and a light source 11'. Other than common camera lens, this projection device 10' has multilayer of optical structure, and each layer is indispensable. In this case, the three-dimensional imaging device shows a larger volume than the other common lens equipped with one lens and one receiving device. Referring to FIG. 2, when a conventional three-dimensional imaging device 10' is installed on an electronic mobile device 40' such us mobile phone, the light source 11', the grating 12', the lens 13', and the emission lens 14' are aligned linearly, so its thickness T' increases the thickness t' of mobile phone. In other words, according to the structure of the projection device 10' of a conventional three-dimensional imaging device, it can only be aligned along the direction of the thickness t' of a mobile phone, so as to increase the thickness t' of the mobile phone. As a result, such device 10' of conventional three-dimensional imaging device is not suitable to be installed in a thinner or compact mobile phone.

In addition, referring to FIG. 2, electronic mobile device for installing such three-dimensional imaging device is restricted by its limited internal space. Therefore, it is not easy to provide cooling mechanism for the light source 11'. With this said, the solution for the heat dissipation problem of conventional three-dimensional imaging device projection device 10' will further increase the volume and thickness of the projection device 10' of the three-dimensional imaging device.

The 3D imaging has a wide application prospect that it simplifies measuring steps and saves measuring time. Besides, the accuracy of measure and its effect can be developed for further innovative application. So far, the three-dimensional imaging device has been constrained by the volume and other factors thereof, so it is only used on common devices rather than electronic devices that are preferred to be lighter and thinner, such as mobile phone, laptop, tablet computer, etc. The limited usage impacts the popularity and application of the three-dimensional imaging. Therefore, the way to further thinner the three-dimensional imaging device and to overcome all the related issues emerged in this thickness reduction process are the problems that the present invention aims to resolve.

SUMMARY OF THE PRESENT INVENTION

An object of the present invention is to provide a light-deflection three-dimensional imaging device for projection device, and application thereof, which alters projection path of the light that was emitted from the light source by providing a light deflection element, so as to reduce the thickness and facilitate the installation of the projection device.

An object of the present invention is to provide a light-deflection three-dimensional imaging device and projection device, and application thereof, wherein because the thickness of the projection device has been effectively reduced, it is adapted for being installed in electronic mobile devices that are seeking for becoming lighter and thinner, comprising mobile phone, laptop, and tablet electronic devices like tablet computer.

An object of the present invention is to provide a light-deflection three-dimensional imaging device and projection device, and application thereof, wherein the light delivered from the light source will pass through the grating and condensing lens group, reach the light deflection element, be deflected, and be eventually projected from the emission lens. Therefore, the effective thickness of the projection device will correspond to the total thickness of the light deflection element and the emission lens, which is significantly lower comparing with the thickness of a conventional projection device that is decided by the staked light source, grating, condensing lens group, and emission lens.

An object of the present invention is to provide a light-deflection three-dimensional imaging device and projection device, and application thereof, wherein the emission lens and the light deflection element of the projection device are arranged along the thickness direction of the electronic mobile device, while the light source, the grating, and the lens assembly can be arranged along the length direction (height direction) or the width direction of the electronic mobile device, so that the projection device of the light-deflection three-dimensional imaging device is more suitable for being installed in a compact electronic mobile device.

An object of the present invention is to provide a light-deflection three-dimensional imaging device and projection device, and application thereof, wherein the light deflection element can reflect and/or refract the light that is from the light source, so as to make the light that is from the light source deflected and eventually be emitted from the emission lens.

An object of the present invention is to provide a light-deflection three-dimensional imaging device and projection device, and application thereof, wherein the emission lens may not be linearly arranged with the condensing lens group, the grating, and the light source. In other words, the present invention of the projection device is not staked as regular linear form, it has turning portion. The thickness of the turning portion decides the thickness of the projection device, so the thickness of light-deflection three-dimensional imaging device of the projection device decreases effectively.

An object of the present invention is to provide a light-deflection three-dimensional imaging device and projection device, and application thereof, wherein the light source of projection device is not arranged along the thickness direction. The projection device provides more useful space where the heating issue of the light source on the projection device can be resolved. With assistance of a background processor, the projection device being arranged on a metal radiation frame corrects the deviation caused by wavelength drift due to the heated light source and other factors.

An object of the present invention is to provide a light-deflection three-dimensional imaging device and projection device, and application thereof, wherein the thickness of every device including the projection device of the light-deflection three-dimensional imaging device reduces to under 6 mm which can be wholly installed on the interior of an electronic mobile device.

An object of the present invention is to provide a light-deflection three-dimensional imaging device and projection device, and application thereof, wherein the projection device and the receiving device of the light-deflection three-dimensional imaging device of the present invention face the same or the opposite direction of the display device of the electronic mobile device, so as to greatly enhance the application scope of the three-dimensional imaging device and to optimization user's experience.

An object of the present invention is to provide a light-deflection three-dimensional imaging device and projection device, and application thereof, wherein in order to ensure the quality of imaging and increase the product yield rate, a cylinder hung is arranged between a camera lens and a lens holder of the projection device to conduct focusing.

An object of the present invention is to provide a light-deflection three-dimensional imaging device and projection device, and application thereof. Contrasting to prior art, the camera lens and the lens holder do not use screw for assembling, so the size of the projection device decreases significantly. This feature is beneficial in assembling the device on a compact mobile electronic device, e.g. mobile phone, tablet computer.

An object of the present invention is to provide a light-deflection three-dimensional imaging device and projection device, and application thereof, the arrangement between the camera lens and the lens holder also resolves the blur caused by screwing, and the torque problem between camera lens and/or lens holder. Thereby, the present invention decreases the packaging difficulty of the camera lens and the lens holder.

An object of the present invention is to provide a light-deflection three-dimensional imaging device and projection device, and application thereof, wherein when packaging the camera lens and the lens holder, it is not necessary to drive the camera lens and the lens holder with revolving force. In this way, it not only enhances the packaging accuracy for the camera lens and the lens holder, but also reduces the packaging time and the complexity of packaging equipment, which helps achieve better production efficiency.

An object of the present invention is to provide a light-deflection three-dimensional imaging device and projection device, and application thereof, wherein contrasting to the packaging surface structure of conventional camera lens, the camera lens provides at least three side walls with a plurality of media bay on the packaging surface. In this way, it ensures sufficient interconnecting media for the reliability of the formed projection device after packaging. Besides, it prevents the liquid interconnecting media from overflowing, so the appearance of the projection device and the subsequent installation would not be affected by the overflowed interconnecting media.

An object of the present invention is to provide a light-deflection three-dimensional imaging device and projection device, and application thereof, design of the media bay can decrease the difficulty of glue filling afterward, and this guarantees constant and smooth conduct toward the projection device.

An object of the present invention is to provide a light-deflection three-dimensional imaging device and projection device, and application thereof, wherein because the interconnecting media would not overflow from the media bay, therefore, it is not necessary to have labor to remove the overflowed interconnecting media after the packaging of the camera lens and the lens holder, so as to decrease work process and save labor cost.

An object of the present invention is to provide a light-deflection three-dimensional imaging device and projection device, and application thereof, wherein in order to maximize the yield rate of the adjusted projection device, it enables fixing the issues of leaning, deviation, angle deviance, etc., by only moving the relative position of the lens holder during the focusing of the camera lens and lens holder.

An object of the present invention is to provide a light-deflection three-dimensional imaging device and projection device, and application thereof, which avoid repetitive operations to the camera lens and the lens holder during the adjustment process of the camera lens and the lens holder, so as to enhance the packaging efficiency.

An object of the present invention is to provide a light-deflection three-dimensional imaging device and projection device, and application thereof, wherein, contrasting to prior art, the testing device applies buckling rather than clamping to the lens holder, so as to ensure the stability for the moving and adjusting processes of the lens holder and therefore to ensure the accuracy and yield rate.

An object of the present invention is to provide a light-deflection three-dimensional imaging device and projection device, and application thereof, which can pre-fix the camera lens and the lens holder and subsequently conduct glue filling to the camera lens and the lens holder after focusing of the camera lens and the lens holder are finished, so as to enhance the yield rate of the packaged product. In other words, the relative positions of the camera lens and the lens holder will not change after focusing and before glue filling, so as to ensure the imaging quality of the projection device that is formed after packaging.

An object of the present invention is to provide a light-deflection three-dimensional imaging device and projection device, and application thereof, wherein the testing device is allowed to complete the operation of a plurality of processes of the assembling, core aligning, focusing, testing, etc. of the camera lens and the lens holder at once, and to avoid second clamping to the camera lens and the lens holder as far as possible, so as to control the post-packaging error and to, therefore, increase the yield rate of the product. Besides, such method can also reduce the turnaround phenomenon from occurring during the assembling process of the projection device, so as to prevent outside pollutant from polluting the internal structure of the projection device.

An object of the present invention is to provide a light-deflection three-dimensional imaging device and projection device, and application thereof, wherein the circuit board comprises a heat dispersing unit that helps conduct interior heat of the circuit board device to the outside thereof to lower the working temperature of the circuit board device.

An object of the present invention is to provide a light-deflection three-dimensional imaging device and projection device, and application thereof, wherein the reinforcement of the heat dispersing unit helps enhance the overall strength of the circuit board, so as to effectively solves the problem of distortion of the circuit board caused by high temperature, and improve the evenness of the circuit board. In other words, the heat dispersing unit facilitates the heat dissipation and maintains its evenness.

An object of the present invention is to provide a light-deflection three-dimensional imaging device and projection device, and application thereof, wherein the heat dispersing unit disperses the heat production of chip component in time, and leads temperature of the chip component to the outside through the heat dispersing unit, which decreases the temperature of the chip component so as to be adapted for effective heat dissipation of the projection device.

An object of the present invention is to provide a light-deflection three-dimensional imaging device and projection device, and application thereof, wherein the circuit board comprises a main circuit board that provides a butt coupling space for the chip component and the heat dispersing unit, so as to allow the chip component to transfers heat from its heating area to the heat dispersing unit, which helps highly effectively export heat generated by projection light source and is suitable for resolving heat dissipation issue of structured light technology.

An object of the present invention is to provide a light-deflection three-dimensional imaging device and projection device, and application thereof, wherein it applies the good heat conductivity feature of soldering tin, so that when the chip component and the heat dispersing unit are welded and soldered together, it prevents from over-heating caused by D/A glue, and helps enhance heat conduction speed between the chip component and heat dispersing unit.

An object of the present invention is to provide a light-deflection three-dimensional imaging device and projection device, and application thereof, wherein the welding method utilizes symmetrical bonding pad, which reduces the uncontrollability of reflow of soldering tin, so as to greatly decrease the deviation while attaching the chip component.

An object of the present invention is to provide a light-deflection three-dimensional imaging device and projection device, and application thereof, wherein a direct conduction layer can directly conduct the bonding pad circuit of the circuit board device and the heat dispersing unit, so as to effectively avoid high impedance or resistance issue caused by using conducting resin for the connection of the bonding pad.

An object of the present invention is to provide a light-deflection three-dimensional imaging device and projection device, and application thereof, wherein both complex machinery manufacturing process and device and significant changes to the original structure of circuit board are not necessary, which decreases relative production cost.

An object of the present invention is to provide a light-deflection three-dimensional imaging device and projection device, and application thereof, which achieves highly effective VCSEL array driving under low voltage/small electric current by means of the circuit.

An object of the present invention is to provide a light-deflection three-dimensional imaging device and projection device, and application thereof, which achieves highly effective VCSEL laser driving under low voltage/small electric current by means of the circuit.

An object of the present invention is to provide a light-deflection three-dimensional imaging device and projection device, and application thereof, which utilizes an energy storage unit to provide operating current for the VCSEL laser driving circuit.

An object of the present invention is to provide a light-deflection three-dimensional imaging device and projection device, and application thereof, which utilizes a switching circuit to control the make-and-break of the circuit between the energy storage unit and the power processing module and the VCSEL laser driving circuit.

An object of the present invention is to provide a light-deflection three-dimensional imaging device and projection device, and application thereof, which utilizes supercapacitor(s) to store electric power.

An object of the present invention is to provide a light-deflection three-dimensional imaging device and projection device, and application thereof, which utilizes supercapacitor to provide driving power for the VCSEL laser driving circuit.

An object of the present invention is to provide a light-deflection three-dimensional imaging device and projection device, and application thereof, wherein the switching circuit comprises a field effect tube that controls the make-and-break between the supercapacitor and the power processing module and VCSEL laser driving circuit.

An object of the present invention is to provide a light-deflection three-dimensional imaging device and projection device, and application thereof, which drive mode of the VCSEL array is altered from the original DC drive to pulse drive, which makes the heat production of VCSEL array is reduced, so that the function thereof become more stable and more reliable.

An object of the present invention is to provide a light-deflection three-dimensional imaging device and projection device, and application thereof, which outputs PWM pulse, so as to alter the drive mode from the original DC drive to pulse drive.

An object of the present invention is to provide a light-deflection three-dimensional imaging device and projection device, and application thereof, which outputs PWM pulse allows output voltage adjustments, to ensure the VCSEL laser function normally in constant current.

An object of the present invention is to provide a light-deflection three-dimensional imaging device and projection device, and application thereof, which utilizes dual PWM pulse output to control the streaking of the drive pulse at the falling edge.

An object of the present invention is to provide a light-deflection three-dimensional imaging device and projection device, and application thereof, which drive circuit has smaller size, so as to make the product lightweight.

An object of the present invention is to provide a light-deflection three-dimensional imaging device and projection device, and application thereof, wherein supercapacitor is quickly charged during pulse interval and during pulse time, the features of quick discharging and high energy density of supercapacitor is also utilized so as to resolves the issue of heavy constant current drive within millisecond pulse period.

An object of the present invention is to provide a light-deflection three-dimensional imaging device and projection device, and application thereof, which provides a calibration method of the projection device, which obtains projected image by cooperating with a calibrated camera module, so as to calibrate the projection device and greatly enhance the decoding rate of the projected image.

An object of the present invention is to provide a light-deflection three-dimensional imaging device and projection device, and application thereof, wherein it proceeds reverse compensation to the image by using the internal parameters of calibrated camera module to obtain distortionless image, so as to help on capturing the calibration data of the projection device to implement the quantitative calibration of the projection device.

An object of the present invention is to provide a light-deflection three-dimensional imaging device and projection device, and application thereof, wherein the projected image of projection device is taken with reverse compensated camera module, the internal and external parameters of the projection device is calculated, and the calibration of the projection device is achieved, so as to resolve the problem of projection device calibration that conventional technology cannot achieve.

An object of the present invention is to provide a light-deflection three-dimensional imaging device and projection device, and application thereof, in which the calibration method is simple, highly efficient, fast in calibration, and accurate in calibration data.

An object of the present invention is to provide a light-deflection three-dimensional imaging device and projection device, and application thereof, which automatically test the projected image of the projection device, so as to objectively identify the test results of the projection device, increase test accuracy, and enhance test efficiency.

An object of the present invention is to provide a light-deflection three-dimensional imaging device and projection device, and application thereof, wherein definition and clarity, defective pixel, ration calibration, and decoded data of projection device are automatically obtained respectively through different testing softwares. The operation is easy, which contributes to provide test data needed during the production processes.

An object of the present invention is to provide a light-deflection three-dimensional imaging device and projection device, and application thereof, wherein the projected image is captured with a receiving device and then analyzed with software(s) by processing device, which does not require naked eye to conduct the test, so as to reduce injure and hurt of human body and to greatly reduce the complexity of the test operation.

An object of the present invention is to provide a light-deflection three-dimensional imaging device and projection device, and application thereof, which objectively evaluates the performance of the projection device and calculates the data of the projected image of the projection device with software algorithm, so that the test results become more accurate, which effectively reduces the fatigue of the discrimination with naked eye and avoids the error rate caused by subjective judgement.

An object of the present invention is to provide a light-deflection three-dimensional imaging device and projection device, and application thereof, wherein it is suitable for evaluating projection device of different wave bands of light source, so as to break the limit of naked eye examination. The receiving device can identify the corresponding wavelength of the projection device, so as to distinguish the definition and clarity of the projected pattern of different wave bands.

An object of the present invention is to provide a light-deflection three-dimensional imaging device and projection device, and application thereof, which fast obtaining real time projection pattern rather than tests defective pixel of the projection device with microscope, so as to greatly reduce the complexity of testing defective pixel of the projection device.

An object of the present invention is to provide a light-deflection three-dimensional imaging device and projection device, and application thereof, wherein it implements automatic calibration of projection device, effectively increases the calibration efficiency of projection device, and expands the application scope of calibration data, so as to provide more uses in optical imaging domain.

An object of the present invention is to provide a light-deflection three-dimensional imaging device and projection device, and application thereof, wherein the actual projected image is positioned through software for comparing to the theoretical projection area, so the actual projecting angel and deviation of the projection device can be obtained, which objectively brings about the quantitative calibration of projection device, so as to provides future reference for the subsequent projection rectification.

An object of the present invention is to provide a light-deflection three-dimensional imaging device and projection device, and application thereof, wherein it implements projection decoding on static image and dynamic image through automatic decoding software(s), so as to be able to process projected images based on either static image or dynamic image, which has higher flexibility and applicability.

An object of the present invention is to provide a light-deflection three-dimensional imaging device and projection device, and application thereof, which pre-processes the projected image, so that the code points are extracted more easily and the decoding rate of the projected image are greatly enhanced.

An object of the present invention is to provide a light-deflection three-dimensional imaging device and projection device, and application thereof, wherein code point information is extracted from the image and converted into decoded data by means of decoding algorithm, so as to make the decoded data more accurate that is useful for future development of expanding the application scope of the decoding algorithmic.

In order to achieve the above objects, the present invention provides a light deflection projection device, to provide projective light in the three-dimensional imaging device, which comprises:

a light source, adapted for emitting the projective light;

a grating, adapted for modulating the phase and/or amplitude of the projective light;

a condensing lens group, adapted for refracting and aggregating the projective light;

an emission lens, adapted for emitting the projective light outward; and a light deflection element, adapted for deflecting the projective light, wherein after the deflection of the light deflection element, the projective light emitted by the light source will penetrate the emission lens and be projected to the outside of the light deflection projection device from a side of the light deflection projection device.

According to an embodiment of the present invention, in the light deflection projection device, the light deflection element is arranged between the light paths of the condensing lens group and the emission lens, so that when the projective light emitted by the light source passes through the grating, it is then refracted and aggregated by the condensing lens group, before reaching the light deflection element, wherein the projective light is then deflected by the light deflection element and eventually emitted out of the light deflection projection device from the emission lens.

According to an embodiment of the present invention, in the light deflection projection device, the light deflection element has a reflecting surface, wherein at least part of the projective light that arrived the light deflection element will be emitted from the emission lens to the light deflection projection device after reflect.

According to an embodiment of the present invention, in the light deflection projection device, the light deflection element comprises a dioptric lens, wherein at least part of the projective light that arrived the light deflection element will be emitted from the emission lens to the light deflection projection device after refraction.

According to an embodiment of the present invention, in the light deflection projection device, the light deflection element comprises a dioptric lens, wherein at least part of the projective light that arrived the light deflection element will be emitted from the emission lens to the light deflection projection device after refraction.

According to an embodiment of the present invention, for the light deflection projection device, the dioptric lens is prism.

According to an embodiment of the present invention, for the light deflection projection device, the reflecting surface of the light deflection element is arranged aslope relatively with the projection direction of the light source.

According to an embodiment of the present invention, for the light deflection projection device, the dioptric lens of the light deflection element is arranged aslope relatively with the projection direction of the light source.

According to an embodiment of the present invention, in the light deflection projection device, the condensing lens group comprises one or more lenses that are selected from one or more of glass lenses and plastic lenses.

According to an embodiment of the present invention, for the light deflection projection device, the thickness thereof is not greater than 6 mm.

According to an embodiment of the present invention, for the light deflection projection device, the light source also has at least a heat dissipation element arranged thereon.

The present invention also provides a light-deflection three-dimensional imaging device that comprises:

at least a projection device, comprising a light source, a grating, a condensing lens group, and a light deflection element, wherein the light emitted from the light source penetrates the emission lens and is emitted from a side of the projection device after the modulation of the grating, the aggregation of the condensing lens group, and the deflection of the light deflection element;

at least a receiving device; and a processor, wherein said projective light emitted from said projection device will be reflected after reaching a surface of a target object, wherein said receiving device receives said projective light that was reflected by the surface of the target object and transmits the information of said projective light to said processor, wherein said processor processes the information to obtain a 3D image information.

According to an embodiment of the present invention, in the light-deflection three-dimensional imaging device, at least part of the projective light that arrived the light deflection element will be emitted from the emission lens of the projection device after reflection and/or refraction.

According to an embodiment of the present invention, for the light-deflection three-dimensional imaging device, the light deflection element is arranged aslope relatively with the projection direction of the light source.

According to an embodiment of the present invention, the light-deflection three-dimensional imaging device comprises two or more spacingly arranged projection devices.

According to an embodiment of the present invention, the light-deflection three-dimensional imaging device is installed in an electronic mobile device that has a display screen, wherein the projection device and the receiving device are on the front side or back side of the electronic mobile device, wherein the display screen is adapted for displaying the 3D image information.

The present invention also provides a light deflection projection device, installed in an electronic mobile device for providing projective light in three-dimensional imaging operations, comprising:

An end of the light deflection projection device along the longitudinal direction has a light source arranged thereon, while the other end of the opposite side of the light deflection projection device has a light deflection element and an emission lens arranged thereon, wherein the light source provides projective light projected along the longitudinal direction, wherein by the deflection of the light deflection element, at least part of the projective light is emitted from the emission lens along the lateral direction.

According to an embodiment of the present invention, for the light deflection projection device, the light deflection element is to reflect and/or refract the projective light.

According to an embodiment of the present invention, the light deflection projection device further comprises a grating and a condensing lens group, wherein the projective light emitted from the light source is, along longitudinal direction, modulated by the grating, aggregated by the condensing lens group, deflected by the light deflection element, and eventually emitted along lateral direction out of the projection device from the emission lens.

According to an embodiment of the present invention, the electronic mobile device is selected from the group consisting of mobile phone, laptop, and tablet.

The present invention also provides a method for installing at least a light deflection projection device, which is for delivering projective light in a three-dimensional imaging operation, into an electronic mobile device, comprising the following steps:

(i) arranging an emission lens and a light deflection element along the thickness direction of the electronic mobile device; and (ii) arranging a light source, a grating, a condensing lens group, and the light deflection element along the direction of the plane that is vertical to the thickness direction, so that the thickness of the light deflection projection device is determined by the thicknesses of the light deflection element and the emission lens, wherein after the projective light emitted by the light source is modulated by the grating, aggregated by the condensing lens group, and deflected by the light deflection element, it penetrates the emission lens along the thickness direction to be emitted from the projection device.

According to an embodiment of the present invention, the step (b) of the above method also comprises the following step: arranging the light source, the grating, the condensing lens group, and the light deflection element along the length direction of the electronic mobile device.

According to an embodiment of the present invention, the step (b) of the above method also comprises the following step: arranging the light source, the grating, the condensing lens group, and the light deflection element along the width direction of the electronic mobile device.

According to an embodiment of the present invention, in the above method, the light deflection element is to reflect and/or refract at least part of the projective light that arrived the light deflection element.

According to an embodiment of the present invention, the electronic mobile device in the above method is selected from the group consisting of mobile phone, laptop, and tablet.

The present invention also provides a method for producing projective light with a projection device of a three-dimensional imaging device, which comprises the following steps:

(a) delivering light with a light source;

(b) having the light delivered by the light source to penetrate a grating, so as to modulate the phase and/or amplitude of the light;

(c) allowing the light that is modulated through the grating and penetrates a condensing lens group to aggregate;

(d) deflecting the light that was refracted by the condensing lens group when the light reaches a light deflection element;

(e) letting the deflected light penetrate the emission lens and be emitted from a side of the projection device to generate the projective light.

According to an embodiment of the present invention, in the above method, the step (d) comprises the following step: using the light deflection element to reflect at least part of the light that is refracted from the condensing lens group.

According to an embodiment of the present invention, in the above method, the step (d) comprises the following step: using the light deflection element to refract at least part of the light that is refracted from the condensing lens group.

The present invention also provides an imaging method for three-dimensional imaging device, comprising the following steps:

(A) delivering light with a light source;

(B) having the light delivered by the light source to penetrate a grating, so as to modulate the phase and/or amplitude of the light;

(C) allowing the light that is modulated through the grating and penetrates a condensing lens group to aggregate;

(D) deflecting the light that was refracted by the condensing lens group when the light reaches a light deflection element;

(E) letting the deflected light penetrate the emission lens and be emitted from a side of the projection device to generate the projective light;

(F) reflecting the projective light when it reaches the surface of the target object;

(G) the receiving device receives the projective light that was reflected by the surface of the target object and obtains the parameter information; and (H) obtaining a 3D image by having the processor process the parameter information.

According to an embodiment of the present invention, in the above method, the light that arrived the light deflection element will be emitted from the emission lens of the projection device after reflection and/or refraction.

According to an embodiment of the present invention, in the above method, the light source delivers light towards the front side, wherein the light is emitted from the left side or right side of the projection device after being deflected by the light deflection element.

According to an embodiment of the present invention, in the above method, the light source delivers light towards the front side, wherein the light is emitted from the upper side or lower side of the projection device after being deflected by the light deflection element.

According to another perspective of the present invention, the present invention also provides a light deflection projection device, in order to provide projective light in the three-dimensional imaging device, which comprises:

a light generator, adapted for emitting the projective light;

an optical encoder, adapted for encode the projective light;

a condensing lens group, adapted for refracting and aggregating the projective light;

an emission lens, adapted for emitting the projective light outward; and a light deflection element, adapted for deflecting the projective light, wherein after the deflection of the light deflection element, the projective light emitted by the light generator will penetrate the emission lens and be projected to the outside of the light deflection projection device from a side of the light deflection projection device.

According to an embodiment of the present invention, in the above light deflection projection device, the light deflection element is arranged between the light paths of the condensing lens group and the emission lens, so that when the projective light emitted by the light generator passes through the optical encoder and becomes encoded light, it is then refracted and aggregated by the condensing lens group, before reaching the light deflection element, wherein the projective light is then deflected by the light deflection element and eventually emitted out of the light deflection projection device from the emission lens.

According to an embodiment of the present invention, in the light deflection projection device, at least part of the projective light that arrived the light deflection element will be emitted from the emission lens of the projection device after reflection and/or refraction.

According to an embodiment of the present invention, for the light deflection projection device, the light deflection element is arranged aslope relatively with the projection direction of the light generator.

According to an embodiment of the present invention, for the above light deflection projection device, the light deflection element is prism.

According to an embodiment of the present invention, for the above light deflection projection device, the thickness thereof is not greater than 6 mm.

According to another perspective of the present invention, the present invention also provides a projection device, which comprises:

a camera lens, comprising a shell, wherein the shell has an installation chamber; and a lens holder, comprising a lens holder shell that has an installation end, wherein the installation end is allowed to extend to the installation chamber, so as to form a focusing gap between the shell and the lens holder shell for the subsequent focusing.

According to an embodiment of the present invention, the shell also comprises at least a media bay thereon to accommodate an interconnecting media, wherein each media bay is respectively located between the shell and the lens holder shell.

According to an embodiment of the present invention, each of the media bay respectively has at least three side walls.

According to an embodiment of the present invention, each of the media bay is at a corner of the shell.

According to an embodiment of the present invention, the plane where the end of each of the media bay is at is on a coplane with the plane where the end of the shell is at.

According to an embodiment of the present invention, the installation chamber is a cylindrical cavity, the installation end is a cylindrical structure, and the dimension of the inner diameter of the installation chamber is greater than the dimension of the outer diameter of the installation end.

According to an embodiment of the present invention, the lens holder shell also comprises a symmetrical positioning element thereon.

According to another perspective of the present invention, the present invention also provides a screwless module testing device, which comprises:

a camera lens fixing component, adapted for fixing a camera lens;

a lens holder fixing component, adapted for fixing a lens holder, wherein the lens holder fixing component is allowed to move relatively to the camera lens fixing component; and a pointolite, adapted for exposing the assembly side of the lens holder and the camera lens that has been focused, so as to solidify an interconnecting media that is arranged on the assembly side of the lens holder and the camera lens.

According to an embodiment of the present invention, the testing device further comprises a pedestal, wherein the camera lens fixing component, the lens holder fixing component, and the pointolite are respectively arranged on the pedestal, wherein the pointolite is located between the camera lens fixing component and the lens holder fixing component.

According to an embodiment of the present invention, the camera lens fixing component comprises:

a base, arranged on the pedestal;

a first adjustment platform, arranged on the base; and a camera lens fixed block, arranged on the first adjustment platform, wherein the movements of the camera lens fixed block and the first adjustment platform are synchronized, wherein the camera lens fixed block is adapted for fixing the camera lens.

The lens holder securing component comprises:

a track, arranged on the pedestal;

a second adjustment platform, movably arranged on the track; and a lens holder fixed block, arranged on the second adjustment platform, wherein the movements of the lens holder fixing block and the second adjustment platform are synchronized, wherein the lens holder fixing block is adapted for fixing the lens holder;

According to an embodiment of the present invention, the second adjustment platform linearly movably arranged on the track.

According to an embodiment of the present invention, the camera lens fixing component also comprises an adjustment element arranged between the first adjustment platform and the camera lens fixed block.

According to an embodiment of the present invention, the testing device of also comprises at least a clamping element respectively arranged on the pedestal in order to clamp the camera lens and/or the lens holder.

According to an embodiment of the present invention, the clamping element comprises a first clamping arm and a second clamping arm, wherein the first clamping arm and the second clamping arm has a clamping cavity formed therebetween, wherein the first clamping arm has a slot thereon facing towards the clamping cavity.

According to an embodiment of the present invention, the lens holder fixing component also comprises at least a probe thereon.

According to another perspective of the present invention, the present invention also provides a focusing method of projection device, wherein the method comprises the following steps:

(i) forming a focusing gap between a packaged camera lens and a lens holder;

(ii) calculating the data of the positions of the lens holder and the camera lens by having the center of an optical encoder of the lens holder as the focus center; and (iii) conducting adjustment according to the position of the lens holder relative to the camera lens in the data, so as to focus.

According to an embodiment of the present invention, in the above method, an installation chamber is formed in a shell of the camera lens, an installation end is formed in a lens holder shell of the lens holder, and the installation end is allowed to extend to the installation chamber, so as to form the focusing gap between the shell and the lens holder shell.

According to an embodiment of the present invention, the installation chamber is a cylindrical cavity, the installation end is a cylindrical structure, and the dimension of the inner diameter of the installation chamber is greater than the dimension of the outer diameter of the installation end.

According to another perspective of the present invention, the present invention also provides a packaging method of screwless module, wherein the method comprises the following steps:

(I) providing an interconnecting media on the assembly side of a camera lens and/or a lens holder;

(II) solidifying the interconnecting media to pre-fix the focused camera lens and the lens holder; and (III) glue filling the assembly side of the camera lens and the lens holder.

According to an embodiment of the present invention, after the step (III), the method further comprises step (IV): heating the screwless module to enhance the assembly strength of one the lens holder and the camera lens.

According to an embodiment of the present invention, in the above method, an installation chamber is formed in a shell of the camera lens, an installation end is formed in a lens holder shell of the lens holder, and the installation end is allowed to extend to the installation chamber, so as to form a focusing gap between the shell and the lens holder shell for focusing.

According to an embodiment of the present invention, in the above method, at least a media bay is formed on the assembly side of the shell for accommodating the interconnecting media, wherein each media bay is respectively located between the shell and the lens holder shell.

According to an embodiment of the present invention, the installation chamber is a cylindrical cavity, the installation end is a cylindrical structure, and the dimension of the inner diameter of the installation chamber is greater than the dimension of the outer diameter of the installation end.

According to an embodiment of the present invention, each of the media bay respectively has at least three side walls.

According to an embodiment of the present invention, the plane where the end of each of the media bay is at is on a coplane with the plane where the end of the shell is at.

According to an embodiment of the present invention, each of the media bay is at a corner of the shell.

According to an embodiment of the present invention, the interconnecting media is UV glue.

According to another perspective of the present invention, the present invention also provides a design method of screwless module, wherein the screwless module comprises a camera lens and a lens holder, wherein the camera lens comprises a shell and the lens holder comprises a lens holder shell, wherein the method comprises forming a focusing gap between the packaged shell and lens holder shell, wherein after packaging, the gradient between the shell and the lens holder shell is adjustable.

According to an embodiment of the present invention, in the above method, the end of the shell forms at least a media bay adapted for accommodating an interconnecting media, wherein after the interconnecting media is solidified, the camera lens and the lens holder are pre-fixed.

According to an embodiment of the present invention, in the above method, an installation chamber is formed in the shell, and an installation end is formed in the lens holder shell, wherein the installation end is allowed to extend to the installation chamber, wherein the installation chamber is a cylindrical cavity, the installation end is a cylindrical structure, and the dimension of the inner diameter of the installation chamber is greater than the dimension of the outer diameter of the installation end.

According to an embodiment of the present invention, each of the media bay respectively has at least three side walls.

According to another perspective of the present invention, the present invention also provides a heat-removable circuit board device, which comprises:

a main circuit board, having a heat dispersing cavity;

a chip component, electrically connected with the main circuit board; and a heat dispersing unit, extending an end thereof into the heat dispersing cavity to be connected with the chip component, so as to conduct the heat from the chip component to the outside.

According to an embodiment of the present invention, the heat dispersing unit comprises a guiding part and an extending part, wherein the guiding part integrally extend from the extending part to the chip component, so as to butt couple with the chip component, wherein the extending part attaches to the main circuit board.

According to an embodiment of the present invention, the heat-removable circuit board device further comprises at least an attaching layer respectively arranged among said chip component, said heat dispersing unit, and said main circuit board, for attaching said chip component, said heat dispersing unit, and said main circuit board.

According to an embodiment of the present invention, the diameter of the guiding part of the heat dispersing unit matches the inner diameter of the heat dispersing cavity of the main circuit board, so as for the guiding part to butt couple with the chip component with the heat dispersing cavity.

According to an embodiment of the present invention, the extending part of the heat dispersing unit overlaps on a pedestal of the main circuit board, so as to enlarge the heat dispersing area of the heat dispersing unit and reinforce the pedestal of the main circuit board, wherein the heat dispersing cavity is formed on the pedestal.

According to an embodiment of the present invention, the attaching layer comprises a first attaching layer and a second attaching layer, wherein the first attaching layer is arranged between the chip component and the guiding part of the heat dispersing unit, so as to heat conductibly butt couple the chip component and the heat dispersing unit, wherein the second attaching layer is arranged between the extending part of the heat dispersing unit and the pedestal of the main circuit board, so as to attach the heat dispersing unit to the main circuit board.

According to an embodiment of the present invention, the first attaching layer is a tin solder layer that heat conductibly butt couples the chip component to the heat dispersing unit by welding and soldering.

According to an embodiment of the present invention, the heat dispersing unit further comprises at least a protruding and, correspondingly, the pedestal of the main circuit board comprises at least a through hole, wherein the protruding extends from the extending part of the heat dispersing unit toward the through hole of the pedestal, so as to join the heat dispersing unit and the pedestal of the main circuit board, which attaches the extending part of the heat dispersing unit to the main circuit board.

According to an embodiment of the present invention, in the first attaching layer, the chip component is symmetrically butt coupled with the pedestal of the main circuit board and the heat dispersing unit, so as to decrease the soldering deviation of the chip component.

According to an embodiment of the present invention, in the first attaching layer, the chip component is symmetrically butt coupled with the pedestal of the main circuit board and the heat dispersing unit, so as to decrease the soldering deviation of the chip component.

According to an embodiment of the present invention, the heat dispersing unit comprises a recess formed on the guiding part of the heat dispersing unit with a symmetrically shape, so as for the chip component to be symmetrically welded and soldered on the guiding part of the heat dispersing unit.

According to an embodiment of the present invention, the heat dispersing unit is heat dissipating sheet steel(s).

According to an embodiment of the present invention, the heat-removable circuit board device is a circuit board device of the projection device.

According to another perspective of the present invention, the present invention also provides a heat dissipation method of heat-removable circuit board device, wherein the heat dissipation method comprises the following step: conducting the heat of the chip component that is connected with the main circuit board of the circuit board device to the outside by means of a heat dispersing unit arranged in the heat dispersing cavity of the pedestal.

According to an embodiment of the present invention, the heat dissipation method further comprises the following step: conducting the heat of the chip component to the guiding part of the heat dispersing unit through a first attaching layer, wherein the first attaching layer is a heat conductible tin solder layer.

According to an embodiment of the present invention, the heat dissipation method also comprises the following steps:

transmitting the heat outward from the guiding part of the heat dispersing unit to the extending part of the heat dispersing unit; and radially conducting the heat outward from the extending part to the outside, so as to expand the area for radiating heat.

According to an embodiment of the present invention, the heat dissipation method further comprises the following step: conducting the heat of the chip component to the main circuit board through the first attaching layer, wherein the main circuit board is a heat conductible flexible printed circuit.

According to an embodiment of the present invention, the heat dissipation method further comprises the following step: joining the heat dispersing unit with the pedestal of the main circuit board by means of the protruding arranged on the bonding pad and the through hole of the main circuit board, so as to attach the extending part of the heat dispersing unit to the main circuit board.

According to another perspective of the present invention, the present invention also provides a manufacturing method of heat-removable circuit board device, which manufacturing method comprises the following steps:

(o) providing a main circuit board, having a heat dispersing cavity; and (p) butt coupling a chip component and a heat dispersing unit with the heat dispersing cavity, for radiating heat for the chip component.

According to an embodiment of the present invention, the manufacturing method further comprises step (q): attaching the main circuit board, the chip component, and the heat dispersing unit with at least an attaching layer.

According to an embodiment of the present invention, the manufacturing method further comprises step (r): electrically conducting the chip component and the heat dispersing unit and/or the main circuit board.

According to an embodiment of the present invention, the step (q) comprises the following steps:

(q.1) welding and soldering the chip component and the heat dispersing unit by means of a first attaching layer, so as to heat conductibly connect the chip component with a guiding part of the heat dispersing unit; and (q.2) attaching the heat dispersing unit to the main circuit board by means of a second attaching layer, so as to attach the extending part of the heat dispersing unit with the main circuit board, which is adapted for expanding the heat dispersing area of the heat dispersing unit and reinforcing the main circuit board.

According to an embodiment of the present invention, the step (p) comprises step (p.1): symmetrically butt coupling the chip component with the heat dispersing unit, so as to decrease the deviation generated when butt coupling the chip component.

According to an embodiment of the present invention, the step (p.1) comprises the following steps:

(p.1.1) welding and soldering the chip component on the heat dispersing unit; and (p.1.2) symmetrically butt coupling the chip component and the main circuit board by welding and soldering, so as to reduce the deviation of the soldering of the chip component.

According to an embodiment of the present invention, the step (p.1) further comprises the following steps:

(p.1.3) recessing on the guiding part of the heat dispersing unit for forming a symmetrical bonding pad on the heat dispersing unit; and (p.1.4) symmetrically butt coupling the chip component and the guiding part of the heat dispersing unit by welding and soldering, so as to reduce the deviation of the soldering of the chip component.

According to an embodiment of the present invention, the step (q.2) comprises the following steps:

(q.2.1) correspondingly joining the protruding of the heat dispersing unit with the through hole of the main circuit board; and (q.2.2) directly conducting the protruding of the heat dispersing unit to the bonding pad circuit of the main circuit board by means of electroplating and solder fillet.

According to another perspective of the present invention, the present invention also provides a pulse VCSEL laser driving circuit based on USB power supply, which comprises:

a VCSEL laser driving circuit, adapted for driving a VCSEL laser;

a stored energy protection circuit, adapted for storing electrical energy and providing driving power for the VCSEL laser driving circuit, wherein the stored energy protection circuit is electrically connected with the VCSEL laser driving circuit;

a microprocessor unit, adapted for controlling the stored energy protection circuit and the VCSEL laser driving circuit; and a power supply module, adapted for providing electrical energy for the stored energy protection circuit and the microprocessor unit, wherein the power supply module comprises a USB interface and a power processing module electrically connected with the USB interface.

According to an embodiment of the present invention, the stored energy protection circuit comprises an energy storage unit, wherein when the output pulse of the VCSEL laser driving circuit is at low level, the power processing module will charge the energy storage unit.

According to an embodiment of the present invention, the power processing module is electrically connected with the energy storage unit.

According to an embodiment of the present invention, the power processing module is electrically connected with the microprocessor unit.

According to an embodiment of the present invention, when the VCSEL laser driving circuit is at high level, the energy storage unit will provide electric power for the VCSEL laser driving circuit.

According to an embodiment of the present invention, the stored energy protection circuit comprises a switching circuit that controls the make-and-break of the circuits between the energy storage unit and the power processing module and the VCSEL laser driving circuit.

According to an embodiment of the present invention, the energy storage unit comprises at least one supercapacitor.

According to an embodiment of the present invention, the switching circuit comprises a field effect tube.

According to an embodiment of the present invention, the field effect tube controls the make-and-break between the supercapacitor and the VCSEL laser driving circuit and the power supply module.

According to an embodiment of the present invention, the VCSEL laser driving circuit comprises a DC/DC converting module and a sampling feedback module, wherein the DC/DC converting module is adapted for converting the input power of the energy storage unit, wherein the sampling feedback module is adapted for feedback information towards the microprocessor unit.

According to an embodiment of the present invention, the VCSEL laser driving circuit applies PWM pulse to drive the VCSEL laser.

According to an embodiment of the present invention, the VCSEL laser driving circuit applies dual PWM pulse to drive the VCSEL laser.

According to an embodiment of the present invention, the pulse VCSEL laser driving circuit based on USB power supply further comprises an UART programming interface connected with the microprocessor unit.

According to another perspective of the present invention, the present invention also provides a VCSEL laser driving method, which comprises the following steps:

(α) providing a power supply module and a stored energy protection circuit, wherein the power supply module charges the stored energy protection circuit;

(β) providing a VCSEL laser driving circuit, wherein the stored energy protection circuit supply power to the VCSEL laser driving circuit; and (γ) the VCSEL laser driving circuit pulse drives the VCSEL laser.

According to an embodiment of the present invention, the method is adapted for USB power supply.

According to an embodiment of the present invention, in the step (α), the power supply module comprises a USB interface and a power processing module electrically connected with the USB interface.

According to an embodiment of the present invention, in the step (α), the stored energy protection circuit comprises an energy storage unit and a switching circuit that controls the make-and-break between the energy storage unit and the power processing module.

According to an embodiment of the present invention, the VCSEL laser driving circuit applies pulse to drive the VCSEL laser.

According to an embodiment of the present invention, when the output pulse of the VCSEL laser driving circuit is at low level, the power processing module will charge the energy storage unit, while when the output of the VCSEL laser driving circuit is at high level, the energy storage unit will provide electric power to the VCSEL laser driving circuit.

According to an embodiment of the present invention, the energy storage unit comprises at least one supercapacitor.

According to an embodiment of the present invention, the switching circuit comprises a field effect tube.

According to an embodiment of the present invention, the field effect tube controls the make-and-break between the supercapacitor and the VCSEL laser driving circuit and the power supply module.

According to an embodiment of the present invention, the VCSEL laser driving circuit applies PWM pulse to drive the VCSEL array.

According to an embodiment of the present invention, the VCSEL laser driving circuit applies dual PWM pulse to drive the VCSEL array.

According to an embodiment of the present invention, the VCSEL laser driving method further comprises a step: modifying the duty ratio of the pulse width of the PWM pulse through the UART programming interface.

According to another perspective of the present invention, the present invention also provides a calibration method of the projection device, wherein the calibration method comprises the following steps:

(x) calibrating a camera module to capture distortionless images;

(y) using the calibrated camera module to capture the projected image;

(z) calculating the internal parameter and the external parameter of the projection device according to the captured projected image, so as to finish the calibration of the projection device.

According to an embodiment of the present invention, in the step (x), the internal parameter and the external parameter are obtained to reverse compensate the camera module for obtaining distortionless images.

According to an embodiment of the present invention, traditional calibration method, automatic vision calibration method, or self-calibration method is utilized to calibrate the camera module.

According to an embodiment of the present invention, is the step (z), the internal parameter and the external parameter of the projection device are calculated according to the calibration method of the camera module.

According to an embodiment of the present invention, is the step (z), the internal parameter and the external parameter of the projection device are calculated according to the calibration method of the camera module.

According to an embodiment of the present invention, is the step (z), the internal parameter and the external parameter of the projection device are calculated according to the calibration method of the camera module.

According to another perspective of the present invention, the present invention also provides a testing method of structured light projection system, adapted for test a projection device, wherein the test method comprises the following steps:

(S100) forming a projected image on a projection target through the projecting of the projection device;

(S200) receiving the projected image with a receiving device; and (S300) introducing the projected image to a processing device and automatically identifying the projected image with a testing software in the processing device, so as to objectively obtain the parameter information and performance of the projection device.

According to an embodiment of the present invention, the testing method further comprises step (S400): preserving the data of the projection device, so as to provide objective reference of the projection device.

According to an embodiment of the present invention, the testing method further comprises step (S500): establishing standard relative position model for the receiving device and the projection device, so as to obtain the projected image.

According to an embodiment of the present invention, the step (S100) comprises step (S101): projecting a projection mask of the projection device to the projection target to form the projected image.

According to an embodiment of the present invention, the step (S300) comprises step (S310): calculating the resolution of the projected image with the testing software, so as to automatically obtain the pattern definition of the projection mask of the projection device.

According to an embodiment of the present invention, the step (S200) comprises step (S210): having the receiving device to receive the projected image on the projection target through diffused reflection.

According to an embodiment of the present invention, in the step (S200) the receiving device is a photosensitive camera for correspondingly identify the wavelength of the light projected by the projection device.

According to an embodiment of the present invention, the step (S500) comprises step (S510): establishing standard relative position model for the photosensitive camera and the projection device through modeling, so that the field of view coverage of the receiving device is larger than the projecting plane of the projection device.

According to an embodiment of the present invention, the step (S300) comprises step (S320): testing the projected image with the testing software, so as to automatically obtain the test result for the defective pixel of the projection device.

According to an embodiment of the present invention, the step (S320) comprises the following steps:

(S321) converting the projected image into a grayscale, so as to extract the luminance difference of the projected image;

(S322) obtaining a survey area in the projected image that is greater than the setting value; and (S323) contrasting the projection masks between the survey area and the projection device, so as to objectively identify the defective pixel(s) in the projection mask.

According to an embodiment of the present invention, in the step (S320), the survey area is a block area with the size of m*n. When the block area differs from the code point of the projection mask, the block area will be automatically determined as a defective pixel.

According to an embodiment of the present invention, in the step (S200), the projected image is obtained through the receiving device for conducting fast and real time defective pixel test for the projected image.

According to an embodiment of the present invention, the step (S300) comprises step (S330): testing the projected image with the testing software, so as to automatically obtain the quantitative calibration data of the projection device.

According to an embodiment of the present invention, the step (S330) comprises the following steps:

(S331) obtaining a theoretical projection area of the projection device through modeling and calculation;

(S332) calculating the deviance between the theoretical value and the actual value by combining the calculation method of the projected image to obtain the deviation of the projection of the projection device; and (S333) obtaining the actual projecting angel and calibration data of the projection device through inverse calculation.

According to an embodiment of the present invention, the step (S331) comprises step (S3311): obtaining theoretical projection scope with the distance and structure of the projection device.

According to an embodiment of the present invention, the step (S332) comprises the following steps:

(S3321) finding an anchor point in the theoretical projection scope, wherein the anchor point is selected at a preset coordinate in the projection mask (S3322) calculating the projecting angel of the anchor point as $\alpha=u/U*y1$ (1C). According to an embodiment of the present invention, u is the lateral coordinate of the anchor point on the projection mask, U is the lateral length of the projection mask, and y1 is a theoretical projecting angel of the projection device; and (S3323) calculating the actual coordinate of the anchor point on the projected image as $(x'=W/2+L-D*\tan\alpha, y'=H/2)$, whereas W is the length of the projected image, H is the width of the projected image, L is the optic axis distance between the receiving device and the projection device, and D is a projection plane distance between the projection target and the receiving device.

According to an embodiment of the present invention, the step (S333) comprises the following steps:

(S3331) extracting the coordinate (x', y') for the actual anchor point from the projected image of the receiving device by circle center location.

(S3332) substituting the coordinate of the actual anchor point into (1C) to obtain the actual projecting angel y1' of the projection device; and (S3333) applying the actual projecting angel y1' of the projection device as a calibration data, for utilizing the reverse deviance value to adjust the projection angle of the projection device, so as to rectify the projected image to the theoretical projection area.

According to an embodiment of the present invention, the step (S400) comprises step (S430): transmitting the calibration data to the compensation software of the finished module, so as to objectively provide reference for the software compensation data of the later stage of the finished module.

According to an embodiment of the present invention, the step (S300) comprises step (S340): testing the projected image with the testing software, so as to automatically obtain the decoded data of the projected image.

According to an embodiment of the present invention, the step (S340) comprises the following steps:

(S341) preprocessing the imported projected image, so as to extract the code point of the projection of the projection device;

(S342) obtaining the center of each code point for obtaining the code point data; and (S343) converting the code point data into decoded data with a decoding algorithm.

According to an embodiment of the present invention, the step (S341) comprises the following steps:

(S3411) averaging the data of the projected image;
(S3412) correlating the data of the projected image; and
(S3413) marking local maximum gray value, for identifying the code element(s) of the projected image.

According to an embodiment of the present invention, the decoding algorithm of the step (S343) comprises the following steps:

(S3431) organizing a decoding window on the projection mask to achieve an unique determination of the code point coordinate;

(S3412) seeking for the code element(s) of the decoding window, so as for the projected image to obtain the pairing data of the decoding window; and (S3413) extracting the number of columns of the projection mask from the pairing data of the decoding window and the coordinate data of the pairing data in the projected image.

According to an embodiment of the present invention, the decoding window of the step (S343) applies a window with the extent of 2*3.

According to an embodiment of the present invention, the decoding applies the code element constructed with pseudorandom m-sequence, so that the position of the decoded data corresponding to each 2*3 decoding window in the projection mask pattern sequence is uniquely determined, which is adapted for dynamic decoding and static decoding, wherein the pseudorandom m-sequence applies 6-stage pseudorandom sequence.

According to an embodiment of the present invention, the decoding algorithm of the step (S343) further comprises step (S3434): defining the types of code element as 0+, 0−, 1+, 1−, classifying 0+ and 1+ as c, and classifying 0− and 1− as b, so as to convert the projected image model into decoding sequence(s).

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

The following is disclosed in order that those skilled in the art can implement the present invention. Preferred embodiments in the following descriptions are to give examples only. Those skilled in the art can think of other obvious modifications. The basic notions of the present invention defined in the following descriptions can apply to other implementations, modifications, improvements, equivalences, and other technical solutions that do not deviate the scope or spirit of the present invention.

FIGS. 3A-7 are perspective views of the structure of the light-deflection three-dimensional imaging device and the projection device thereof according to a preferred embodiment of the present invention. The light-deflection three-dimensional imaging device, adapted for being installed in an electronic mobile device 40, wherein the light-deflection three-dimensional imaging device comprises at least a projection device 10, at least a receiving device 20, and a processor 30. The receiving device 20 and the processor 30 are coupled together. The projection device 10 delivers projective light to the surface of a target object to then be reflected and be received and captured by the receiving device 20. The receiving device 20 then transmits the captured information to the processor 30 to be processed, so as to obtain information of the target object, to achieve 3D stereoscopic imaging and further achieve deep developed functions, comprising measuring and mapping.

Figure 3A:
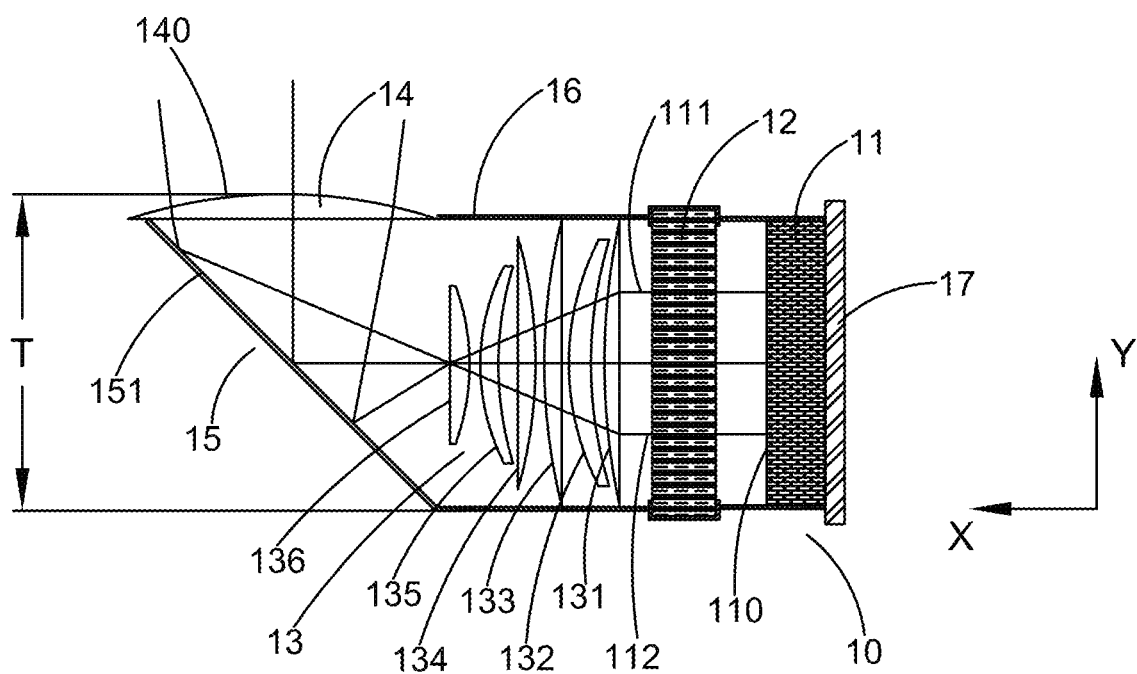
FIG. 3A is a perspective view of the sectional structure of the projection device of the three-dimensional imaging device according to a preferred embodiment of the present invention.

Referring to FIG. 3A, the projection device 10 of the light-deflection three-dimensional imaging device comprises a light generator, which can be embodied as a light source 11, an optical encoder 12, a condensing lens group 13, and an emission lens 14. The light source 11 produce light. The optical encoder 12 encodes the light produced by the light source 11. In this embodiment, the optical encoder can be embodied as a grating 12. After the light produced by the light source 11 penetrates the grating 12, the light will be modulated in amplitude and/or phase, so as to come out with encoded light that facilitates identification. Then the light will be aggregated by the condensing lens group 13 and emitted from the emission lens 14 to be projected to the outside. In the present invention, the projection device 10 also comprises a light deflection element 15. The light deflection element 15 makes the light that arrives the light deflection element 15 deflect to penetrate the emission lens 14 to be emitted from a side of the projection device 10. In other words, the light source 11, the grating 12, and the condensing lens group 13 are arranged along an end of the projection device 10 to the direction of the other end thereof. Eventually, by the deflection of the light deflection element 15, the light generated by the light source 11 will not be emitted from the other end of the projection device 10, but emitted from a side of the projection device 10.

In the embodiment illustrated in FIG. 3A, the light source 11 can be a vertical cavity surface emitting laser, a laser diode, a light emitting diode, etc., and the light generated can be visible light, infrared light, ultraviolet light, etc. The grating 12 has predetermined style grating pattern and splits the light generated by the light source 11 into light beams. The condensing lens group 13 comprises one or more lenses. Each of the lenses can be various convex lens or concave lens, as the lenses 131, 132, 133, 134, 135, and 136 illustrated in FIG. 3A. The light penetrated the lenses 131, 132, 133, 134, 135, and 136 will be refracted and aggregated. Therefore, the condensing lens group 13 can utilize different lens combinations to achieve aggregation of light. The light generated by the projection device 10 will eventually be projected from the emission lens 14 to the surface of a target object, be reflected, and be received by the receiving device 20.

Figure 1:
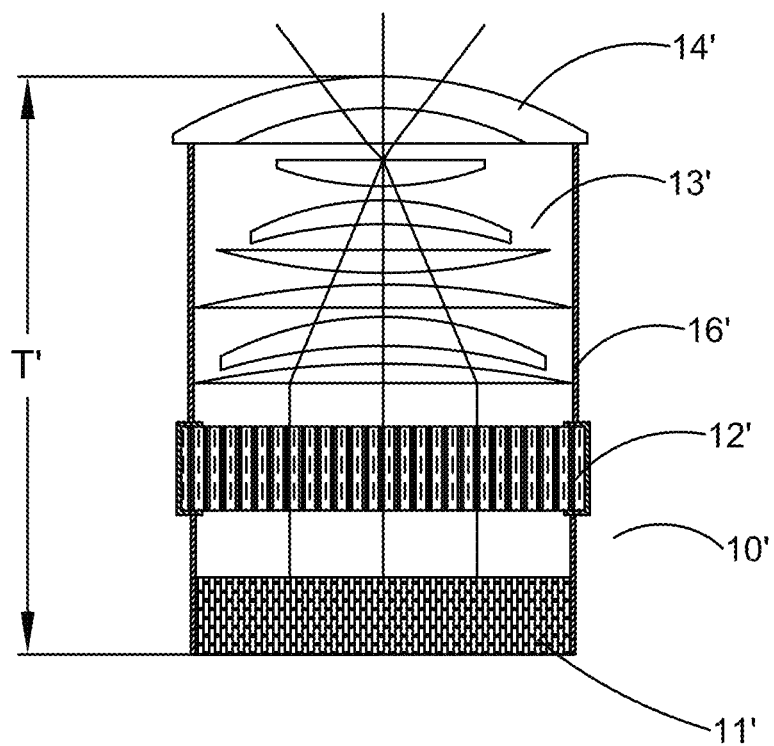
FIG. 1 is a perspective view of the sectional structure of the projection device of the three-dimensional imaging device according to the prior art.
Figure 2:
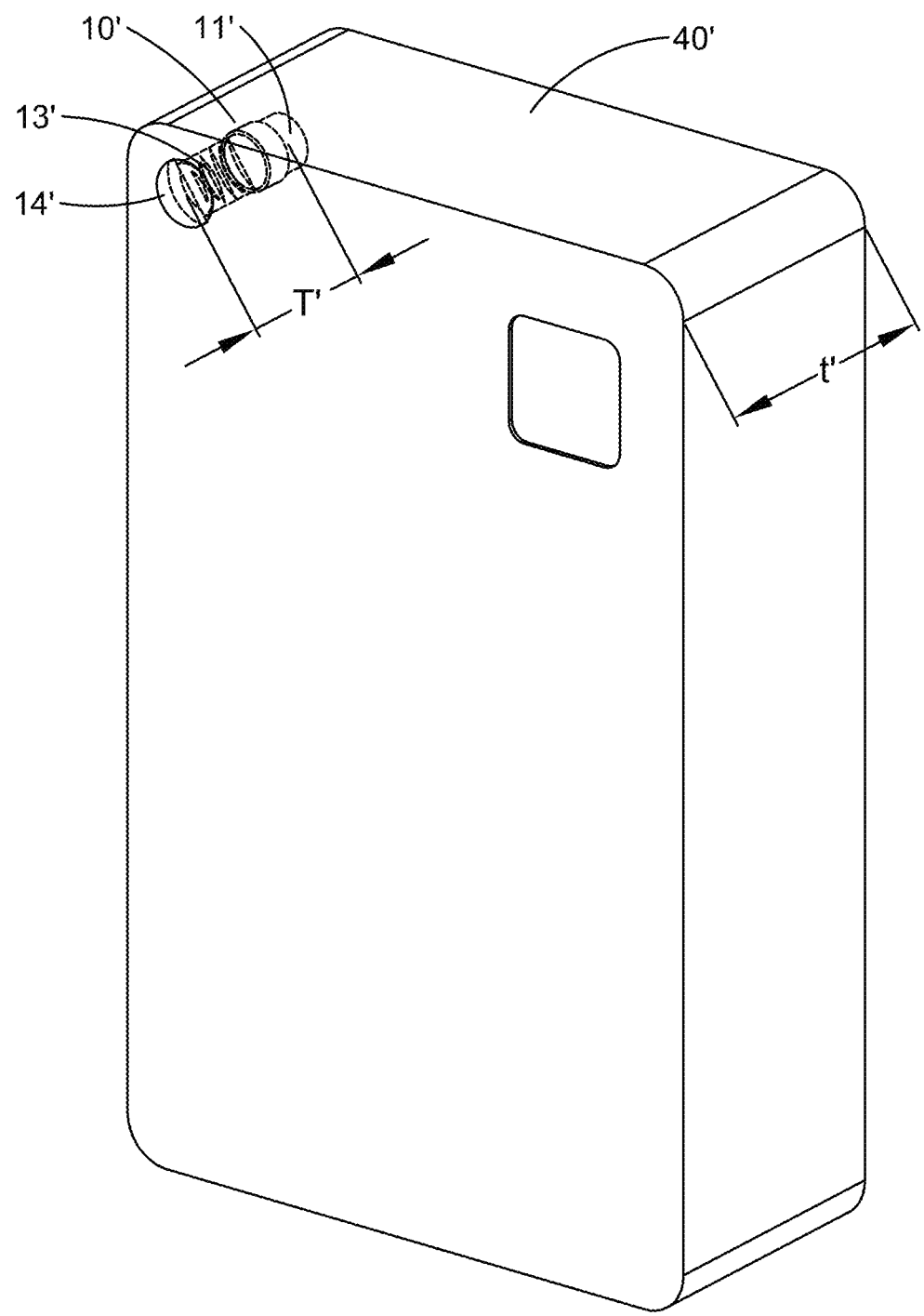
FIG. 2 is a structural perspective view illustrating the projection device of the three-dimensional imaging device according to above prior art installed on a mobile phone.

What differ from the prior art illustrated in FIGS. 1 and 2 are in that the projection device 10 of the present invention also comprises a light deflection element 15, so as to deflect and turn the projection path of the light in the projection device 10 and to eventually have the light be emitted from a side of the projection device 10. Therefore, the entire projection device can be unlike what was demonstrated in FIG. 2 that the arrangement is along the thickness direction of the electronic mobile device. Rather, it can be like what were illustrated in FIGS. 6 and 7 that the device is arranged along the width direction or length direction (height direction) of the electronic mobile device 40, which helps the three-dimensional imaging device of the present invention to be installed in the inside of a compact electronic mobile device 40. The electronic mobile device 40 can be mobile phone, laptop, or tablet device, such as tablet computer.

The light deflection element 15 is arranged along the light path of the projection device 10 and can be selectively located on the light path between the grating 12 and the light source 11, the light path between the grating 12 and the condensing lens group 13, or the light path between the condensing lens group 13 and the emission lens 14. In the embodiment illustrated in FIG. 3A, the light deflection element 15 deflects the light that passed through the condensing lens group 13. Then the light is projected from the emission lens 14 to the outside of the projection device 10. In other words, in the embodiment illustrated in FIG. 3A, the light deflection element 15 is arranged on the light path between the condensing lens group 13 and the emission lens 14 to alter the projection direction of the light emitted from the condensing lens group 13.

In the embodiment illustrated in FIG. 3A, the thickness T of the projection device 10 is mainly determined by the total thickness of the light deflection element 15 and the emission lens 14. In this way, contrasting to prior art that the thickness T' of a conventional projection device is determined by the stacked light source 11', grating 12', a set of lens', and emission lens 14' layers, the thickness T of the projection device 10 of the present invention can be significantly reduced.

In this preferred embodiment of the present invention, the light deflection element 15 has a reflecting surface 151. The light generated by the light source 11 successively penetrates the grating 12 and the condensing lens group 13 and reaches the reflecting surface 151 of the light deflection element 15 to be reflected and penetrate the emission lens 14, so as to be projected to the outside of the projection device 10. The emission lens 14 can serve the function of distributing the emitting light of the projection device 10, so as to distribute the emitting light of the projection device 10 into each required direction.

The reflecting surface 151 can be a reflective mirror, which is arranged aslope to the projection direction of the light of the light source 11, so that the light that penetrated the lenses 131, 132, 133, 134, 135, and 136 of the condensing lens group 13 and reached the light deflection element 15 can be reflected by the reflecting surface 151 to change the direction of the light path thereof and then to be emitted from the emission lens 14.

It is worth mentioning that the lenses 131-136 of the projection device 10 can be glass lenses or glass-plastic hybrid lens that combines plastic lens and glass lens, so as to, on the basis of no damage on the effect of light, ensure the maximization of the cost benefit. In addition, the lenses 131-136 can apply minimized glass aspherical lens, to further reduce the volume of the projection device 10.

Figure 6:
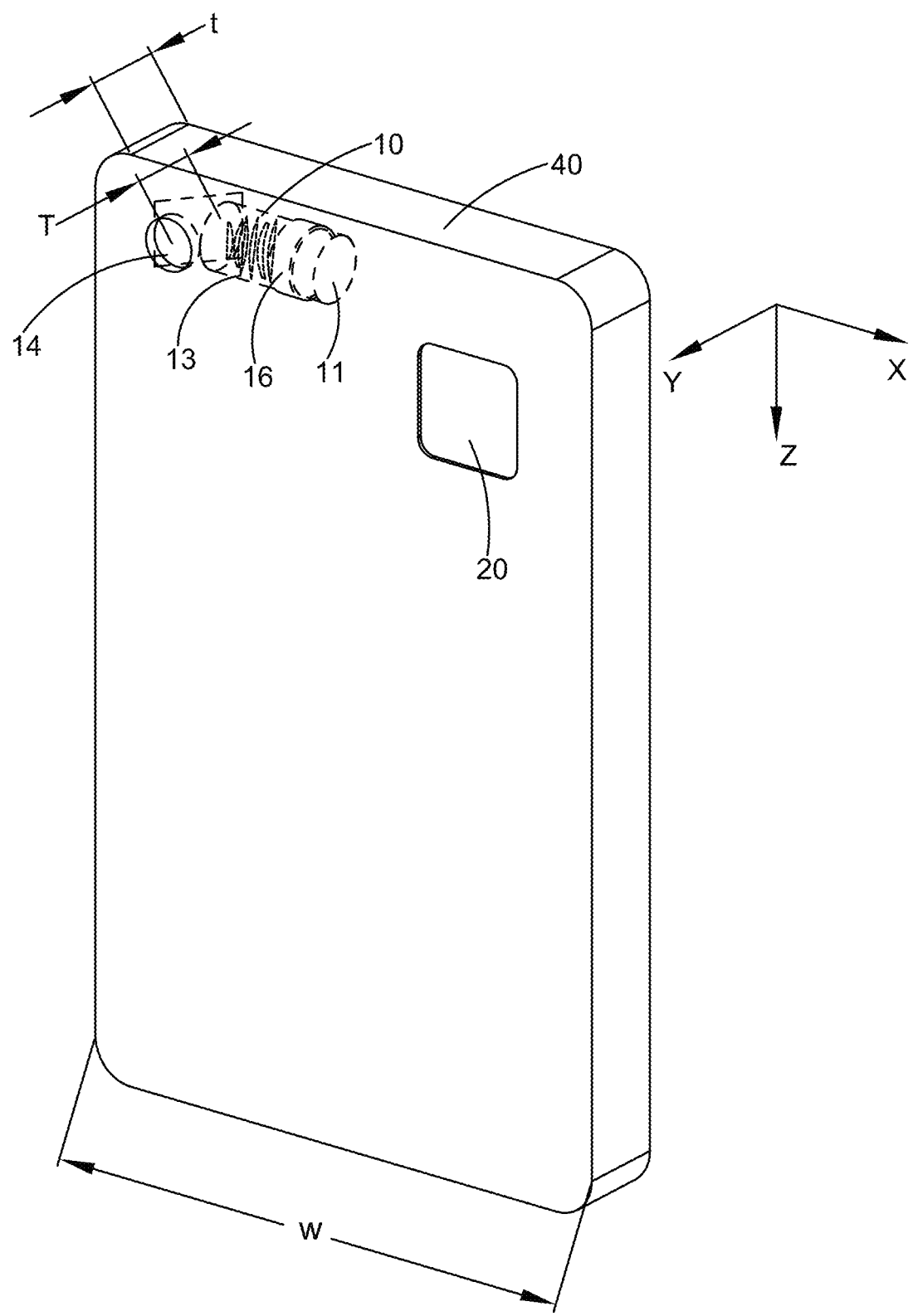
FIG. 6 is a perspective view of an installation manner for mounting the projection device of the three-dimensional imaging device according to the above preferred embodiment of the present invention on an electronic device.
Figure 7:
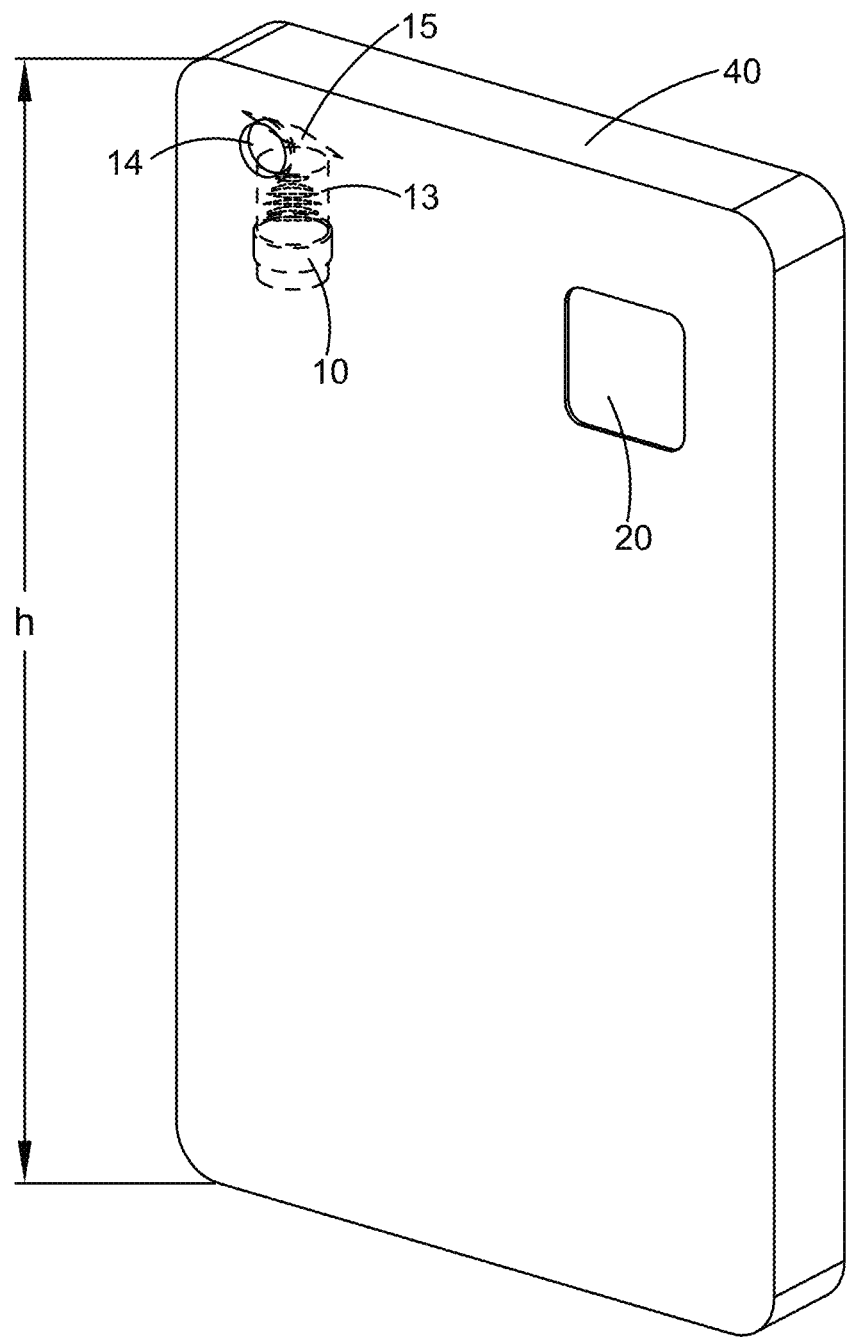
FIG. 7 is a perspective view of another installation manner for mounting the projection device of the three-dimensional imaging device according to the above preferred embodiment of the present invention on an electronic device.
Figure 8:
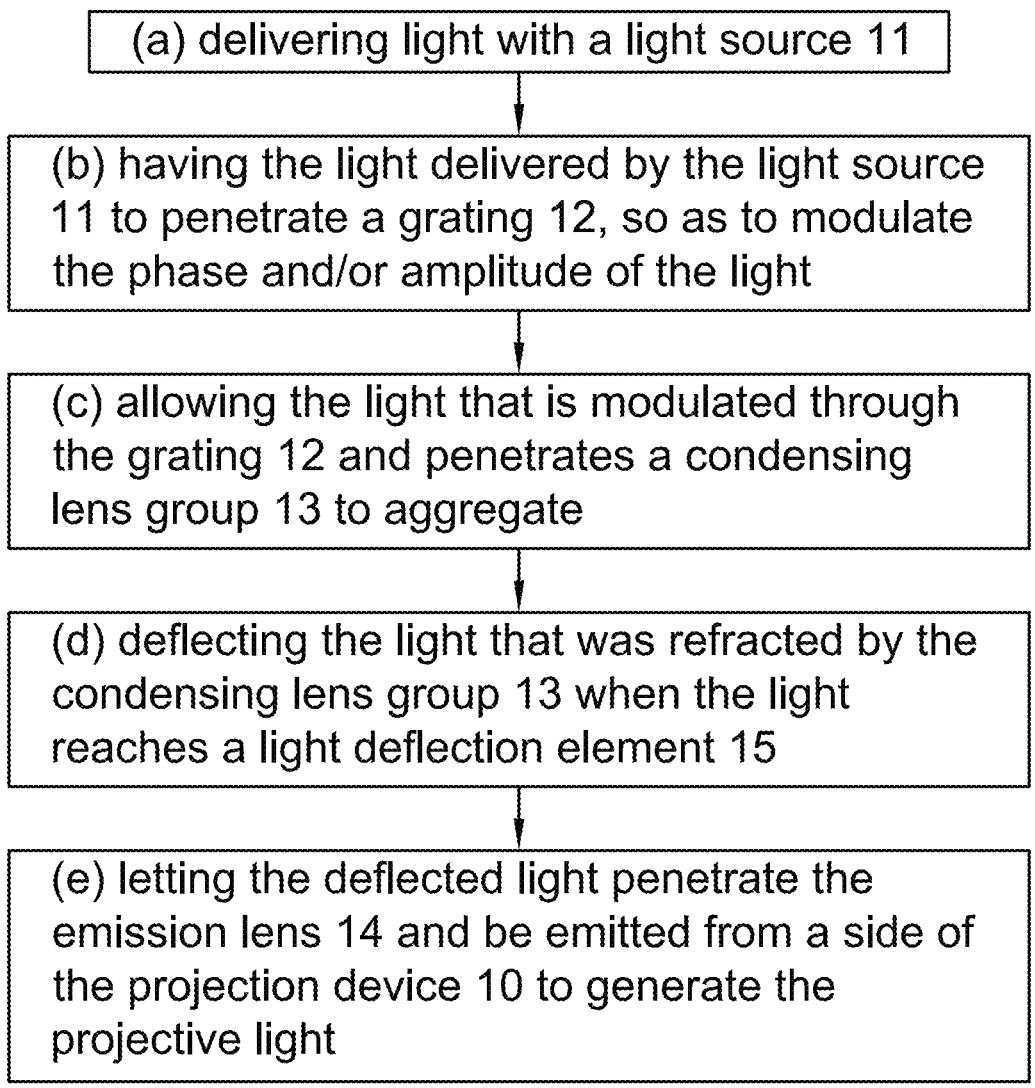
FIG. 8 is a flow diagram of the method of utilizing the projection device of the three-dimensional imaging device according to the above preferred embodiment of the present invention to provide projective light.
Figure 9:
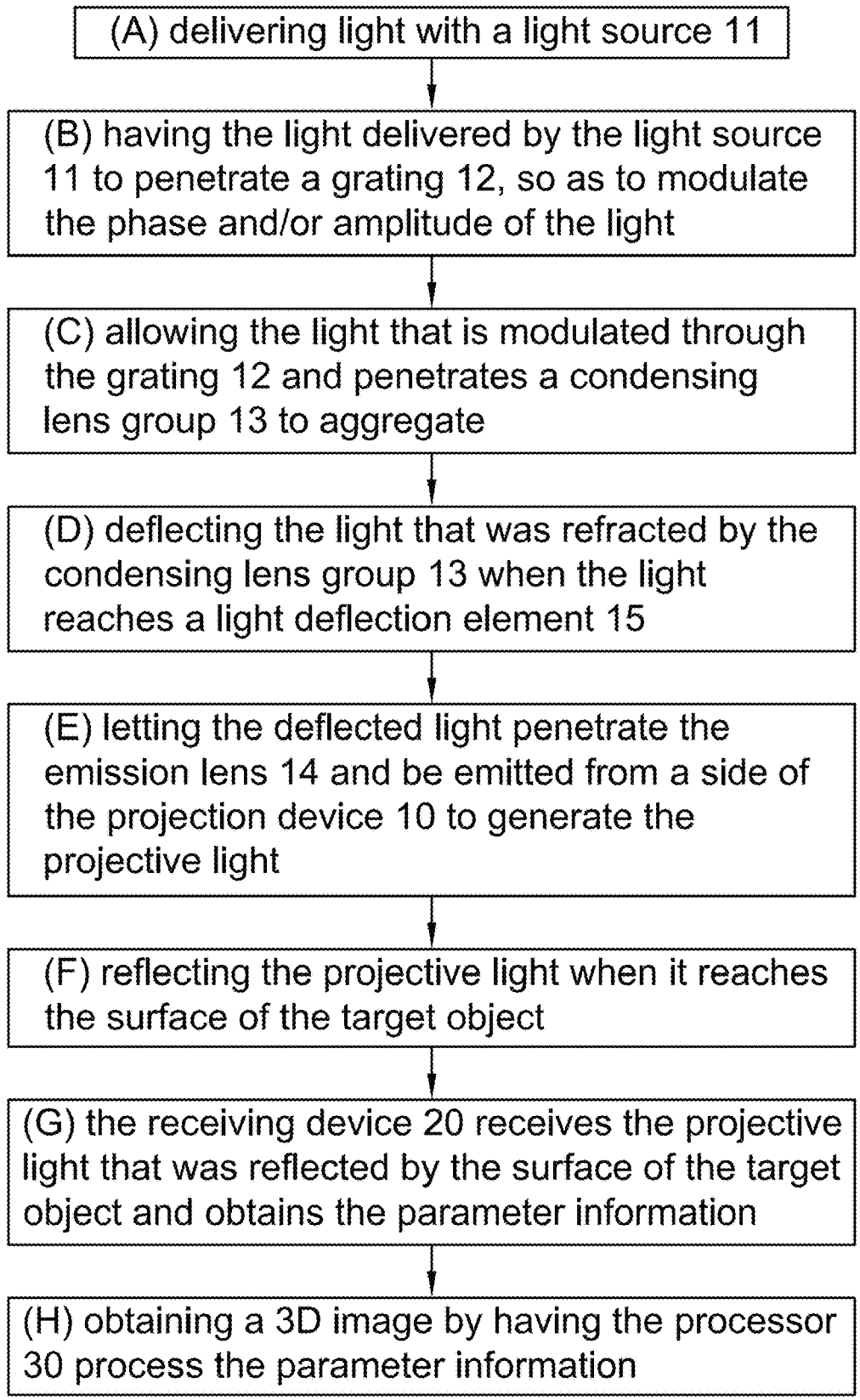
FIG. 9 is a flow diagram of the method of the three-dimensional imaging of the three-dimensional imaging device according to the above preferred embodiment of the present invention to provide.

The projection device 10 can also comprise a shell 16 for the accommodation and installation of the light source 11, the grating 12, the condensing lens group 13, the emission lens 14, and the light deflection element 15. Referring to FIGS. 6 and 7, it can be seen that the thickness T of the projection device 10 is about equal to the diameter of the shell 16 of the projection device 10 through the structure arrangement of the present invention. On the other hand, in prior art, the thickness T' generated by installing a conventional projection device 10' in an electronic mobile device 40' is about equal to the length of the projection device 10'. Hence, this kind of structure of the present invention significantly reduces the thickness T of the projection device 10. In the three-dimensional imaging device of the present invention, the thickness that is the hardest to be reduced is the thickness of the projection device. The solution provided by the present invention can effectively decrease the thickness T of the projection device 10, so that the three-dimensional imaging device and the projection device 10 thereof of the present invention can be wholly installed in the inside of the electronic mobile device without increasing the thickness t of the electronic mobile device 40.

Figure 3B:
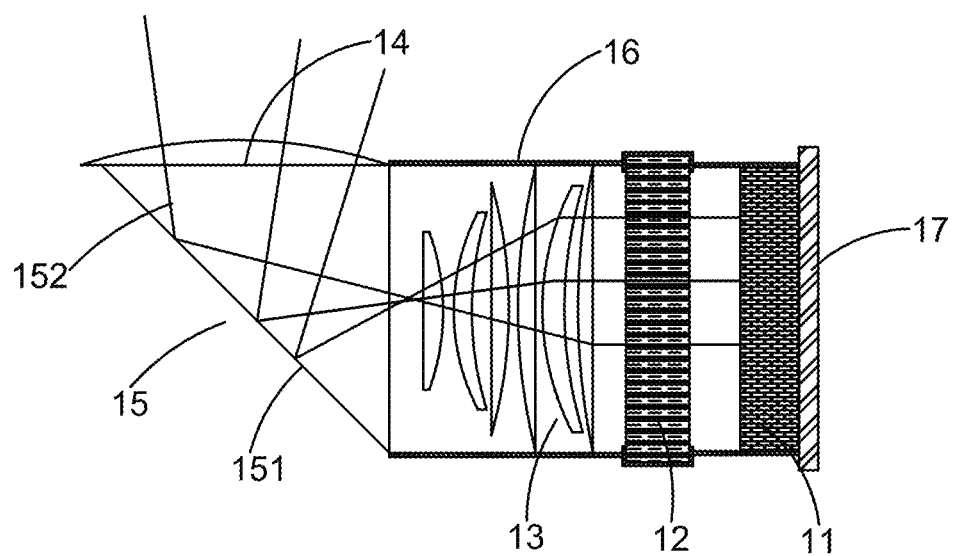
FIG. 3B is a perspective view of the sectional structure of the projection device of the three-dimensional imaging device according to an alternative of the above preferred embodiment of the present invention.

Referring to FIG. 3B, as in another alternative, the light deflection element 15 can comprise a dioptric lens 152. After the light penetrates the condensing lens group 13 and reaches the dioptric lens 152, the light will penetrate the dioptric lens 152, and be refracted, projected to the emission lens 14, and emitted out of the projection device 10 from the emission lens 14. It is worth mentioning that when the light of the projection 11 shifts a certain distance along the upward/downward direction vertical to the optic axis, the final projection direction can be shifted towards the left/right direction, such that by cooperating the placing position of the camera module, it allows the maximum use of the scope of the field of view of the projection. In other words, it allows most light of the light source 11 of the projection to be captured by the camera module.

That is to say, the light deflection element 15 can not only utilize reflection to change the projection direction of the light of the projection device 10, but also utilize refraction to alter the projection direction of the light of the projection device 10. It is understandable that the light deflection element 15 can also comprise light reflection component and light refraction component, so as to not only reflect, but also refract the light emitted from the condensing lens group 13.

The embodiment illustrated in FIG. 3B provides a specific demonstration that the dioptric lens 152 can be embodied as prism, comprising triple prism, in order to refract light. It is worth mentioning that the prism can also comprise a reflecting surface 151 arranged aslope relatively to the projection direction of the light of the light source 11, so as to deflect and turn the light that was penetrated the condensing lens group 13 by reflection and refraction.

It has to be pointed out that the light deflection element 15 of the present embodiment may not be limited in the above structure for specific application. Rather, it can be any device that can reflect and/or refract. In the subsequent step, after the receiving device 20 receives light signal and sends it to the processor 30, the shift and deviation of the light path can be calibrated with software.

It is worth mentioning that thanks to the structure arrangement of the projection device 10 of the present invention, the inside of the electronic mobile device 40 is able to provide enough space for the projection device 10. Therefore, referring to FIGS. 3A and 3B, both the projection devices 10 have a heat dissipation structure. Specifically, the light source 11 of the projection device 10 comprises a heat dissipation element 17. The heat dissipation element 17 can be a metal frame, so as to effectively conduct and disperse the heat generated by the light source 11 to the outside of the electronic mobile device, such that the present invention also solves the heat dissipation problem of the projection device 10 of the three-dimensional imaging device.

In the present invention, the processor 30 can calibrate the deviation of light caused by arranging the light deflection element 15, so as to ensure the accuracy and authenticity of the final data. Besides, the processor 30 can also assist optical correction to the deviations comprising wavelength drift caused by the heating of the light source 11.

It is worth mentioning that for the projection device 10 of the present invention, referring to FIGS. 3A and 6, a first end of the projection device 10 comprises the light source 11 arranged thereon along the longitudinal direction (that is the X-axis direction in the figure). Oppositely, a second end thereof comprises the light deflection element 15 and the emission lens 14 arranged thereon along the lateral direction (that is the Y-axis direction in the figure), so as to make the light of the projection device 10 to be emitted from a lateral side, instead of like the prior art that the light is always projected along the longitudinal direction and eventually emitted from the projection device 10 along the longitudinal direction.

In other words, the projection direction of the light generated by the light source 11 and the final emitting direction from the emission lens 14 are not the same in the longitudinal direction, but two approximately perpendicular directions, the longitudinal direction and the lateral direction. That is to say, referring to FIG. 3A, when the light is generated, it is projected along the length direction of the projection device from the first end to the second end of the light deflection element 15. Then after the deflection through the light deflection element 15, the light will be emitted from a side of the projection device 10.

Referring to FIG. 3A, on or more luminous elements of the light source 11 can be defined as a emitting surface 110, while the emission lens 14 defines a projecting surface 140 In the present invention, the emitting surface 110 and the projecting surface 140 can be arranged in approximately mutually perpendicular directions. In the projection device according to prior art, the emitting surface of light source 11' can be coaxial with the projecting surface of emission lens 14' and arranged approximately parallelly to each other.

Besides, it is worth mentioning that the accumulation of each components of the projection device 10' according to prior art makes the thickness of the projection device 10' very difficult to become lower than 15 mm. However, the thickness of the projection device 10 of the present invention can be lower than 6 mm. Referring to FIG. 6, when the light source 11, the grating 12, the condensing lens group 13, and the light deflection element 15 of the projection device 10 are arranged along the width direction of the electronic mobile device 40, the total length of the grating 12, the condensing lens group 13, and the light deflection element 15 is obviously smaller than the width w of the electronic mobile device 40, but the inside of the electronic mobile device 40 does not have enough space to accommodate the projection device 10. Similarly, referring to FIG. 7, when the light source 11, the grating 12, the condensing lens group 13, and the light deflection element 15 of the projection device 10 are arranged along the length direction (or height direction) of the electronic mobile device 40, the total length of the grating 12, the condensing lens group 13, and the light deflection element 15 is obviously smaller than the length h of the electronic mobile device 40, but the inside of the electronic mobile device 40 also does not have enough space to accommodate the projection device 10.

It is worth mentioning that the projection device 10 and the receiving device 20 of the light-deflection three-dimensional imaging device of the present invention can be located in the front side of back side of the electronic mobile device 40 to face the same or the opposite direction of the display device, such as display screen, of the electronic mobile device 40, so as to greatly enhance the application scope of the three-dimensional imaging device and to be convenient for to use of the user. The receiving device 20 can comprise various image sensing devices to capture image information. In specific embodiments, the receiving device 20 can comprise visible light, infrared light, or ultraviolet light camera lenses. The processor 30 is coupled with the receiving device 20 to process the image information collected by the receiving device 20, so as to provide the three-dimensional imaging function.

Figure 4:
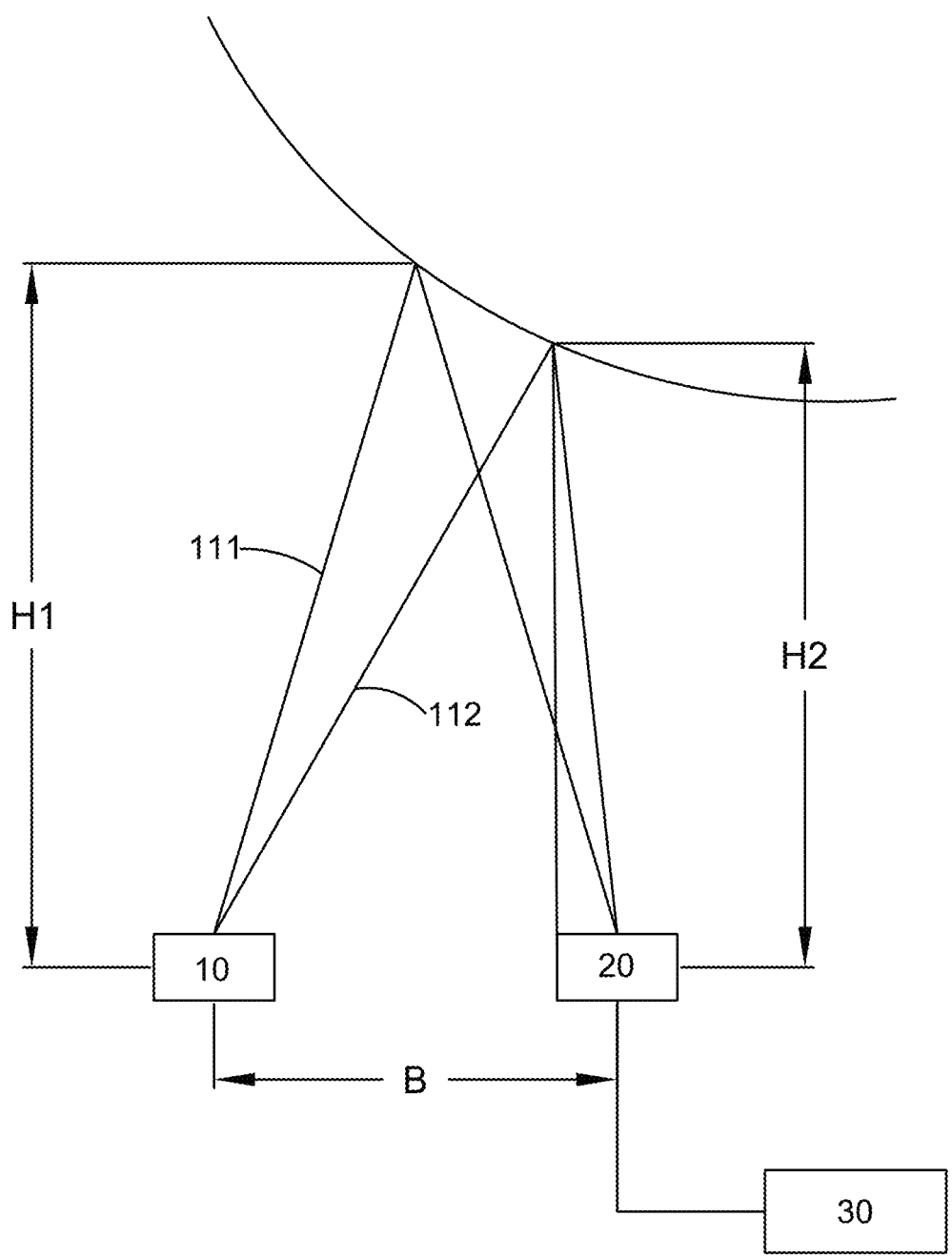
FIG. 4 is a perspective view of the principle of work of the three-dimensional imaging device according to the above preferred embodiment of the present invention.
Figure 5:
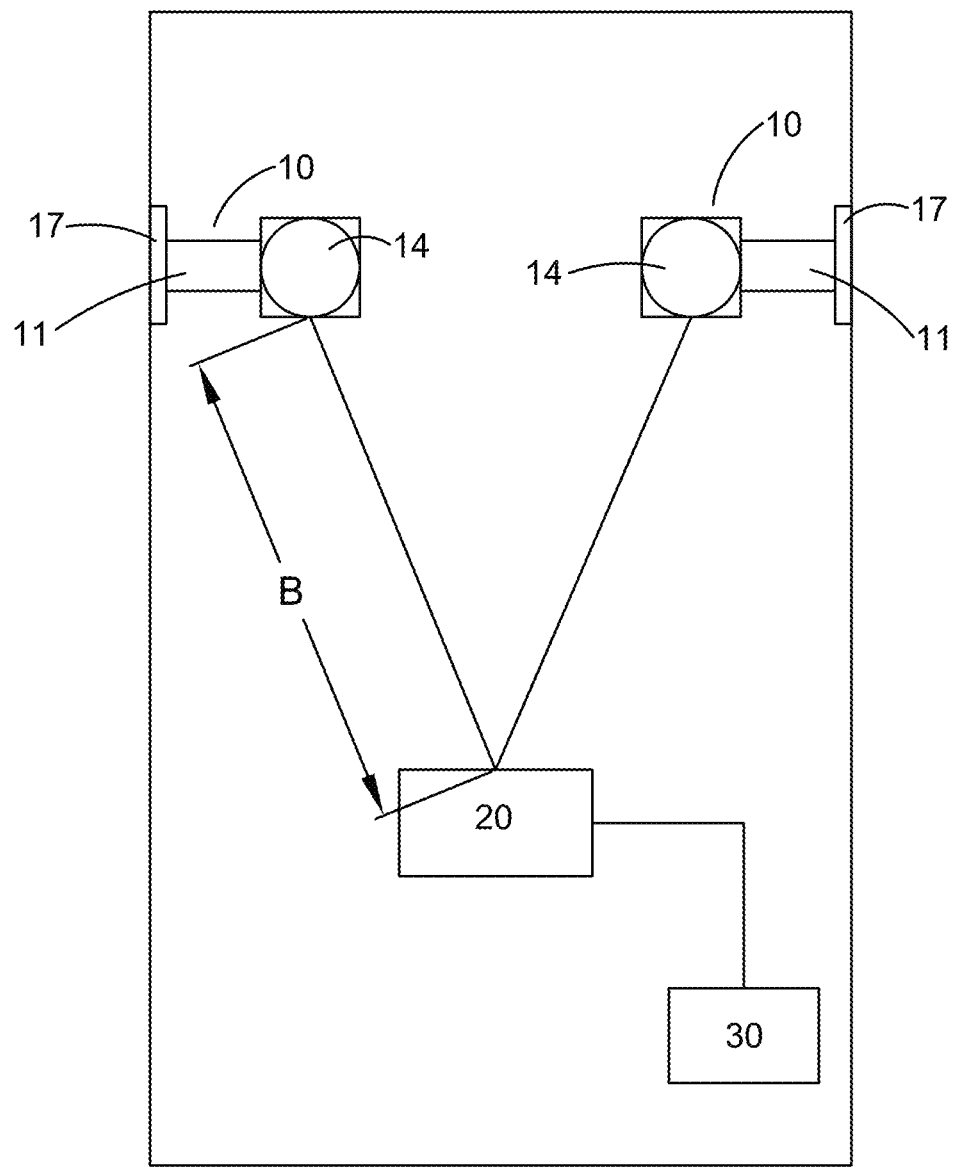
FIG. 5 is a perspective view of the principle of work of a plurality of projection devices of the three-dimensional imaging device according to the above preferred embodiment of the present invention.

FIGS. 3A and 4 jointly illustrate the principle of work of the three-dimensional imaging device of this preferred embodiment of the present invention to suggest that the three-dimensional imaging device can be used to measure the information of depth H1 and H2 of the target object. Specifically, the light 111 and 112 generated by the light source 11 of the projection device 10 penetrate the grating 12 to become beam structurally independent light beams that are encoded, which become a type of structured light. Then the encoded light 111 and 112 emitted by the light source 11 penetrate the lenses 131-136 of the condensing lens group 13 to be refracted and aggregated before reaching the light deflection element 15. The light deflection element 15 reflects and/or refracts the light 111 and 112, so as to deflect and turn the beam structured light 111 and 112 to the emission lens 14 for being evenly projected to the outside of the projection device 10.

The encoded light 111 and 112 emitted from the projection device 10 will reflect after reaching the surface of the target object. The reflected encoded light 111 and 112 are received by the receiving device 20. Also, the information of the phase and amplitude changes generated by the refraction and reflection of the encoded light 111 and 112 will be captured by the receiving device. The data carried by the encoded light 111 will be transmitted to the processor 30 for further analysis.

Then, based on specific measuring method, such as triangulation method, etc., according to the fixed distance exists between the receiving device 20 and the projection device 10 of the three-dimensional imaging device, if the distance is baseline B, when the parameter variation of the encoded light 111 and the encoded light 112 is comprehensively considered, it can calculate a specific image information like the information of depth H1 and H2 in the present embodiment of the present invention.

Referring to FIG. 7, in order to further enhance the imaging effect of the three-dimensional imaging device of the present invention, it can also arrange more projection device 10 to cooperate with the receiving device 20, so as to further enhance the extent and effect of the 3D stereoscopic imaging. Referring to FIG. 7, two projection device 10 are installed in the electronic mobile device 40, wherein the heat dissipation element 17 connected with the light source of each projection device 10 extends to the outside of the electronic mobile device 40, wherein the light emitted by each light source 11 will be split into light beams through the grating 12. After the beam formed light penetrate the condensing lens group 13, it will be refracted and projected to the light deflection element 15 of the projection device 10 to be refracted and/or reflected. Then it will be projected to the outside of the projection device 10 through the emission lens 14. The light beams delivered by two projection devices 10 of the electronic mobile device 40 are projected to the target object to be reflected. Then the reflection will be received by the receiving device 20 of the electronic mobile device 40 and transmitted to the processor 30. The two projection devices 10 of the electronic mobile device 40 will respectively form two baselines B with the receiving device 20, so as to further respectively apply corresponding measuring principle(s) to calculate the information of depth of the target object.

Correspondingly, the present invention provides a method for producing projective light with a projection device 10 of a three-dimensional imaging device, which comprises the following steps:

(a) delivering light with a light source 11;

(b) having the light delivered by the light source 11 to penetrate a grating 12, so as to modulate the phase and/or amplitude of the light;

(c) allowing the light that is modulated through the grating 12 and penetrates a condensing lens group 13 to aggregate;

(d) deflecting the light that was refracted by the condensing lens group 13 when the light reaches a light deflection element 15;

(e) letting the deflected light penetrate the emission lens 14 and be emitted from a side of the projection device 10 to generate the projective light.

In the above method, the step (d) also comprises the following step: using the light deflection element 15 to reflect at least part of the light that is refracted from the condensing lens group 13.

In the above method, the step (d) can also comprises the following step: using the light deflection element 15 to refract at least part of the light that is refracted from the condensing lens group 13.

In other words, the light that reached the light deflection element 15 is reflected and/or refracted and then projected to the emission lens, so that the projection direction of the light in the projection device 10 can be turned and eventually projected from a side of the projection device 10.

For example, in an embodiment, the light generated by the light source 11 of the projection device 10 is projected to the front, which after it was deflected by the light deflection element 15, the front projected light is eventually turned to the left side or right side to be emitted from the projection device 10.

Correspondingly, the present invention also provides an imaging method for three-dimensional imaging device, comprising the following steps:

(A) delivering light with a light source 11;

(B) having the light delivered by the light source 11 to penetrate a grating 12, so as to modulate the phase and/or amplitude of the light;

(C) allowing the light that is modulated through the grating 12 and penetrates a condensing lens group 13 to aggregate;

(D) deflecting the light that was refracted by the condensing lens group 13 when the light reaches a light deflection element 15;

(E) letting the deflected light penetrate the emission lens 14 and be emitted from a side of the projection device 10 to generate the projective light;

(F) reflecting the projective light when it reaches the surface of the target object (G) the receiving device 20 receives the projective light that was reflected by the surface of the target object and obtains the parameter information; and (H) obtaining a 3D image by having the processor 30 process the parameter information Similarly, in the above imaging method, the light deflection element 15 can reflect and/or refract the light that reached the light deflection element 15 so as to achieve the function or deflection or turning.

In traditional imaging methods for three-dimensional imaging device, a conventional three-dimensional imaging device is usually divided into three parts. The first part is a projection device 10' formed with a light source 11', a grating 12', and lenses 13'. The second part is commonly various sensing and imaging devices set for specific characteristics of the light source, such as an IR camera, UV camera, etc., to construct a receiving device. The third part is a processor portion that is coupled with the receiving device. These three parts can be separately or integrally installed. The thickness issue of three-dimensional imaging device is mainly from the thickness of its projection device because there must be certain interval between the light source 11' and the grating 12', and the assembling of the lenses 13' also needs and carries some interval, so the overall thickness of the entire device is increased. Namely, for the prior art, the thickest part of the three separable parts of the three-dimensional imaging device is the projection device 10'. Therefore, the solution of the thickness issue of the projection device 10' has to do with the thickness of the three-dimensional imaging device. Nonetheless, for the prior art, the minimum thickness of such conventional form of projection device 10' of three-dimensional imaging device can hardly be under 15 mm.

On the other hand, the three-dimensional imaging method of the solution provided by the present invention turns and deflects the light generated by the projection device 10. Especially, the light is emitted to different direction through refraction and/or reflection. Advantages of such practice comprises that the mirror surface arranged aslope to the projection direction of the light source 11 changes the entire projectile path of the light without influencing the authenticity of the image, so the parameters of the light that are obtained will be relatively authentic as well. Even there are parameter changes due to the change of the light path, it can also be rectified with the software in the backstage processor. A preferred light deflection element 15 of the present solution comprises prism because it is relatively easy to be installed, it is able to be effectively well combined with the separated camera lens, and the refractive index of the light passed through the prism is relatively easy to be calculate. It is understandable that other types of mirror surfaces can certainly be installed thereon as well, which can also achieve the objects of the present invention. Contrasting with the technical solution of the projection device 10' of the prior art with linear arrangement, the width of the entire projection device 10 of the present invention is effectively decreased, so that the thickness of the entire three-dimensional imaging device of the present invention is significantly decreased.

The above three-dimensional imaging method of the present invention applies structured light technology. The technology utilizes the light projected on the scene with designated pixilated image that when such pattern reaches one or more objects in the scene and becomes distorted, the processor 30 can use the receiving device 20 to receive the information of the light, so as to calculate the surface information and depth information of the target object. Such technology majorly relies on the projection device 10, the receiving device 20, and the calculation of the processor 30 of the backstage, which uses measuring principles such as triangulation method, to figure out the light path changes of the light projected on the surface of the target object for providing the 3D information of the target object.

In the above three-dimensional imaging method, a stereoscopic baseline B is defined for the distance between the projection device 10 and the receiving device 20. The value of the stereoscopic baseline B is relatively fixed and it is also a basic standard arithmetic value of the triangulation method. The value of the stereoscopic baseline B is usually set at 10%-50% of the distance of the target scenario. Therefore, if the device is installed in a smaller sized equipment, it is not necessarily good to pursue the smallest value of the stereoscopic baseline. Generally speaking, shorter stereoscopic baseline will lead to lower accuracy of the three-dimensional imaging device, while longer baseline will result in difficulty of capture the surface(s) that does not face the three-dimensional imaging device. The installation manner of the projection device 10 of the present invention can also control the distance between the projection device 10 and the receiving device 20 in a reasonable range, so as to help the final data calculation.

It is worth mentioning that in prior art, the projection device of a conventional three-dimensional imaging device can also be simply installed on a side of a regular electronic mobile device, but such side shooting camera will definitely hinder the user to see the display screen, which greatly decreases the convenience of the use for the users. In the three-dimensional imaging method of the present invention, the projection device 10 and the receiving device 20 can be set on the same or opposite direction to the display screen of the electronic mobile device 40, so as to facilitate the user to grasp the electronic mobile device 40 to use the three-dimensional imaging function and see the display screen easily at the same time.

It is worth mentioning that the electronic mobile device 40 nowadays are developed to become thinner. Therefore, only to make the three-dimensional imaging device thinner can better have it fit in these electronic mobile devices 40. According to previous production experience, if the thickness of the largest device of the devices in the three-dimensional imaging device can be decreased to 6 mm or less, then it will be able to be wholly installed in the inside of the electronic mobile device 40. The installation manner of the projection device 10 of the present invention absolutely can have the thickness of the entire projection device 10 not greater than 6 mm, such that the entire three-dimensional imaging device can relatively more easily to be installed in a compact electronic mobile device 40.

FIGS. 10A-15 illustrated perspective views of the projection device 10 provided by a preferred embodiment according to the present invention, wherein at least a projection device can coordinate with at least a receiving device 20 to form the light-deflection three-dimensional imaging device. Here, the type of the receiving device 20 is not limited in the present invention. It can be, but not limited to, any device that is able to receive information of light, comprising image sensing device, camera, etc. Preferably, the receiving device 20 can be an infrared (IR) sensor, wherein the projection device 10 can project infrared light to the surface of the target (the target can be an object, animal, person, etc.) and the light can then be reflected by the surface that the reflected light can partially be received by the receiving device. Consequently, the processor 30 coupled with the receiving device can process the received information to form three-dimensional stereoscopic image(s).

Those skilled in the art can understand that the lights, after they were projected to different positions of the surface of the target and reflected, will carry different features and coordinates of the positions. Based on this principle, the light-deflection three-dimensional imaging device can describe the target's three-dimensional features, so as to form the three-dimensional stereoscopic image thereof.

Specifically, the projection device 10 comprises a camera lens 18, a lens holder 19, and other necessary components, wherein the projection device 10 can be used on a electronic mobile device 40, so as for combining with modules, such as processor, etc., of the electronic mobile device 40 to form the three-dimensional imaging device. It is worth mentioning that the type of the electronic mobile device 40 is not limited, which can be mobile phone, tablet computer, laptop, PC, e-reader, PDA, MP3/4/5, video camera, camera, etc. It should be noted that embodying types of the electronic mobile device 40 on the above list are just exemplar description, which shall not be considered as limit of the scope and content of the present invention. In other words, the electronic mobile device 40 can also have other implementations. Nonetheless, contrasting to prior art, the use of the projection device 10 provided by the present invention can greatly decrease the volume of the light-deflection three-dimensional imaging device, so as to significantly decrease the volume of the electronic mobile device 40.

Figure 14:
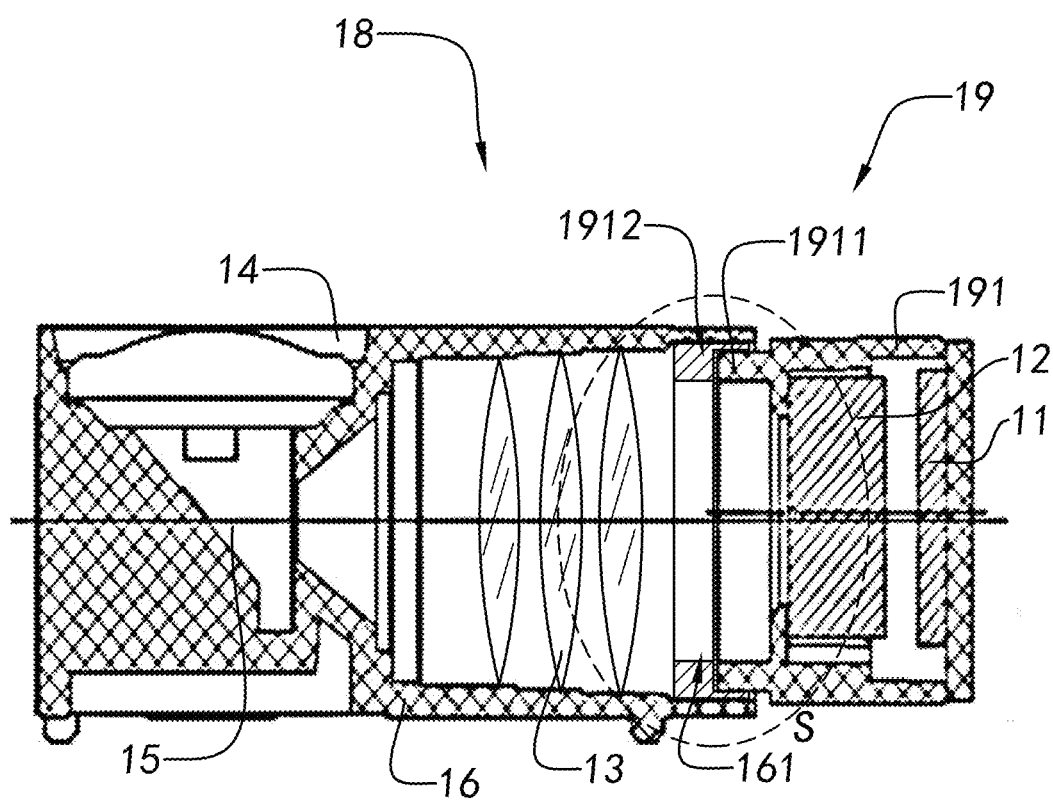
FIG. 14 is a sectional view of FIG. 12 along the line B-B.

More specifically, as the embodiment illustrated in FIG. 14, the camera lens 18 comprises a shell 16, a condensing lens group 13, a light deflection element 15, and an emission lens 14, wherein the shell 16 is for accommodating the condensing lens group 13, the light deflection element 15, and the emission lens 14. Correspondingly, the lens holder 19 comprises a lens holder shell 191, an optical encoder 12, and a light source 11. The lens holder shell 191 is for accommodating and installing the optical encoder 12 and the light source 11. The optical encoder 12 is arranged on the light path of the light source 11, so as to encode the light generated by the light source 11.

It is worth mentioning that the optical encoder 12 can be embodied as a grating 12, such that after the light generated by the light source 11 penetrates the grating 12, it will be modulated in the amplitude and/or phase thereof, so as to generate easily identified encoded light(s). Those skilled in the art should understand that the optical encoder 12 may have other embodiments to allow the three-dimensional imaging device formed with the projection device 10 to implement various functions.

Referring to FIG. 14, after the light generated by the light source 11 is encoded with the optical encoder 12, it will pass through the camera lens 18 to be projected to the external environment of the projection device. In various embodiments, the condensing lens group 13 of the camera lens 18, the light deflection element 15, and the emission lens 14 can have different arrangements thereamong. For example, in some specific embodiment, the light deflection element 15 can be arranged between the condensing lens group 13 and the emission lens 14, so that the light generated by the light source 11 will successively be encoded by the optical encoder 12, processed by the condensing lens group 13, deflected by the light deflection element 15 to change the light path, and emitted from the emission lens 14 to the external environment of the projection device 10. It is worth mentioning that the condensing lens group can be embodied as a condensing lens group so as to conduct aggregation to the light that was encoded by the optical encoder 12.

In some other specific embodiments, the condensing lens group 13 can also be arranged between the light deflection element 15 and the emission lens 14. Therefore, the light generated by the light source 11 will successively be encoded by the optical encoder 12, deflected by the light deflection element 15, processed by the condensing lens group 13, and emitted from the emission lens 14 to the external environment of the projection device 10.

Figure 10A:
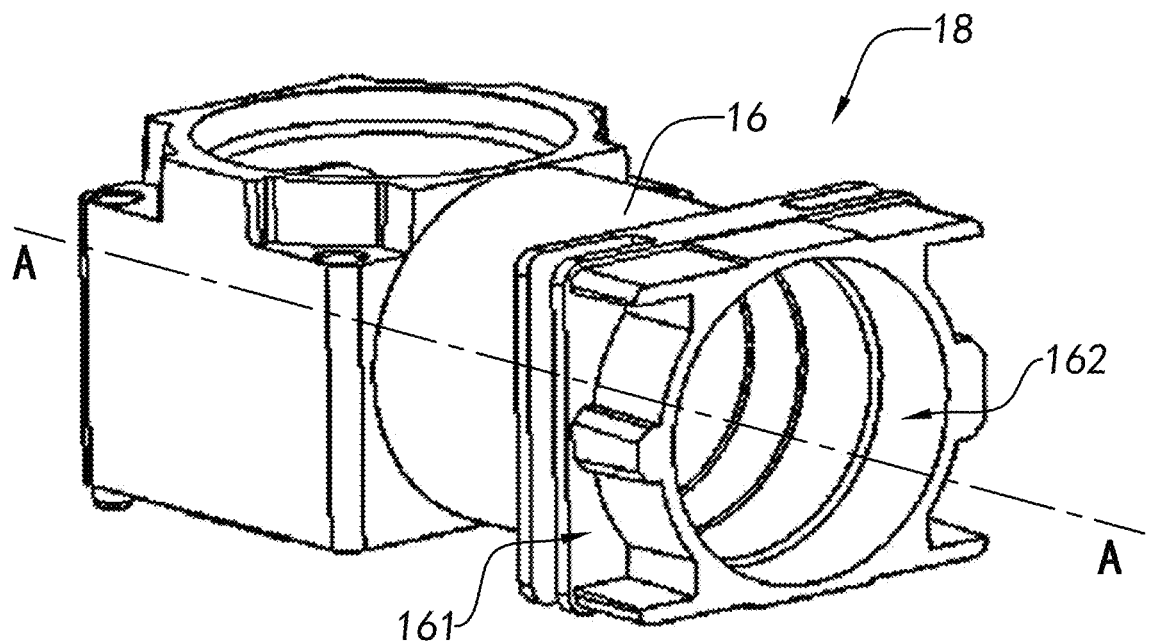
FIG. 10A and FIG. 10B are respectively a three-dimensional perspective view of the camera lens of the projection device according to a preferred embodiment of the present invention.
Figure 10B:
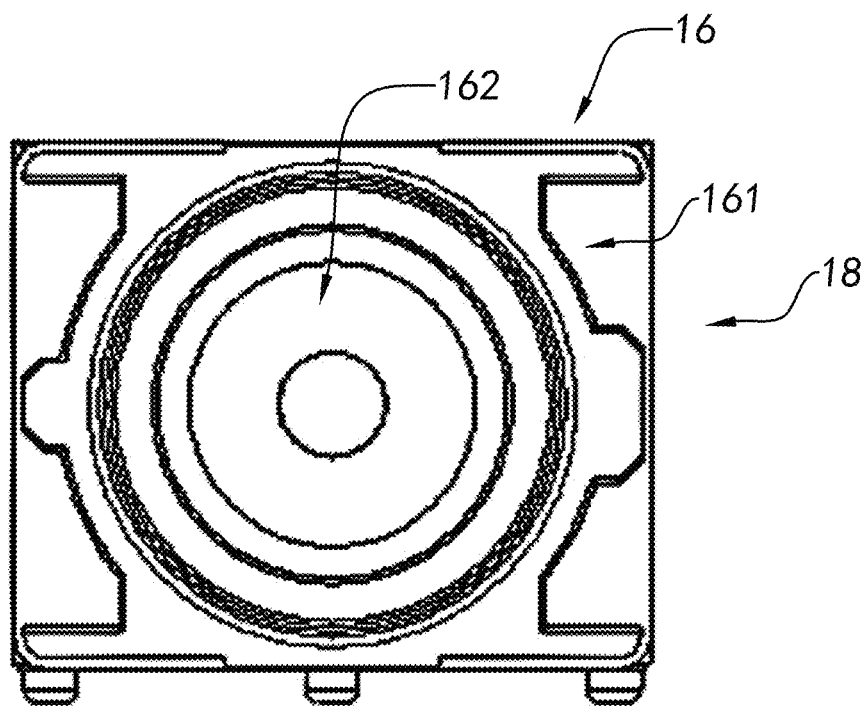
Figure 11A:
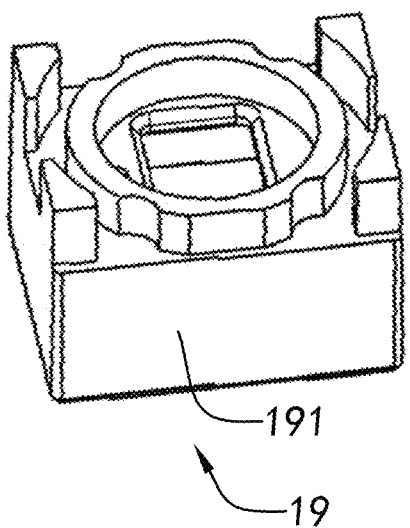
FIG. 11A and FIG. 11B are respectively a three-dimensional perspective view of the lens holder of the projection device according to a preferred embodiment of the present invention.
Figure 11B:
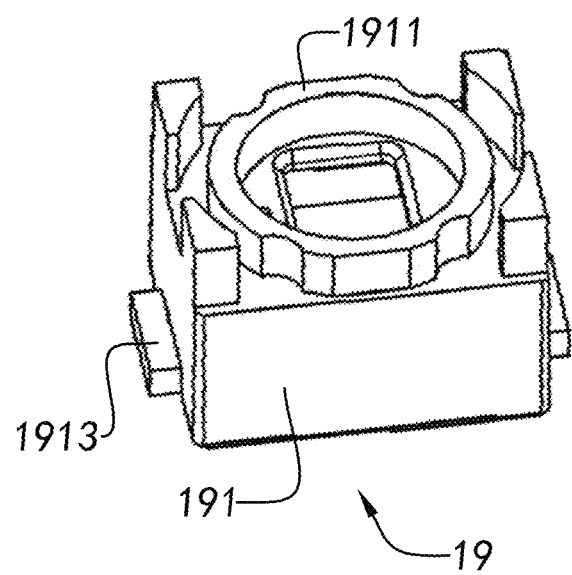
Figure 12:
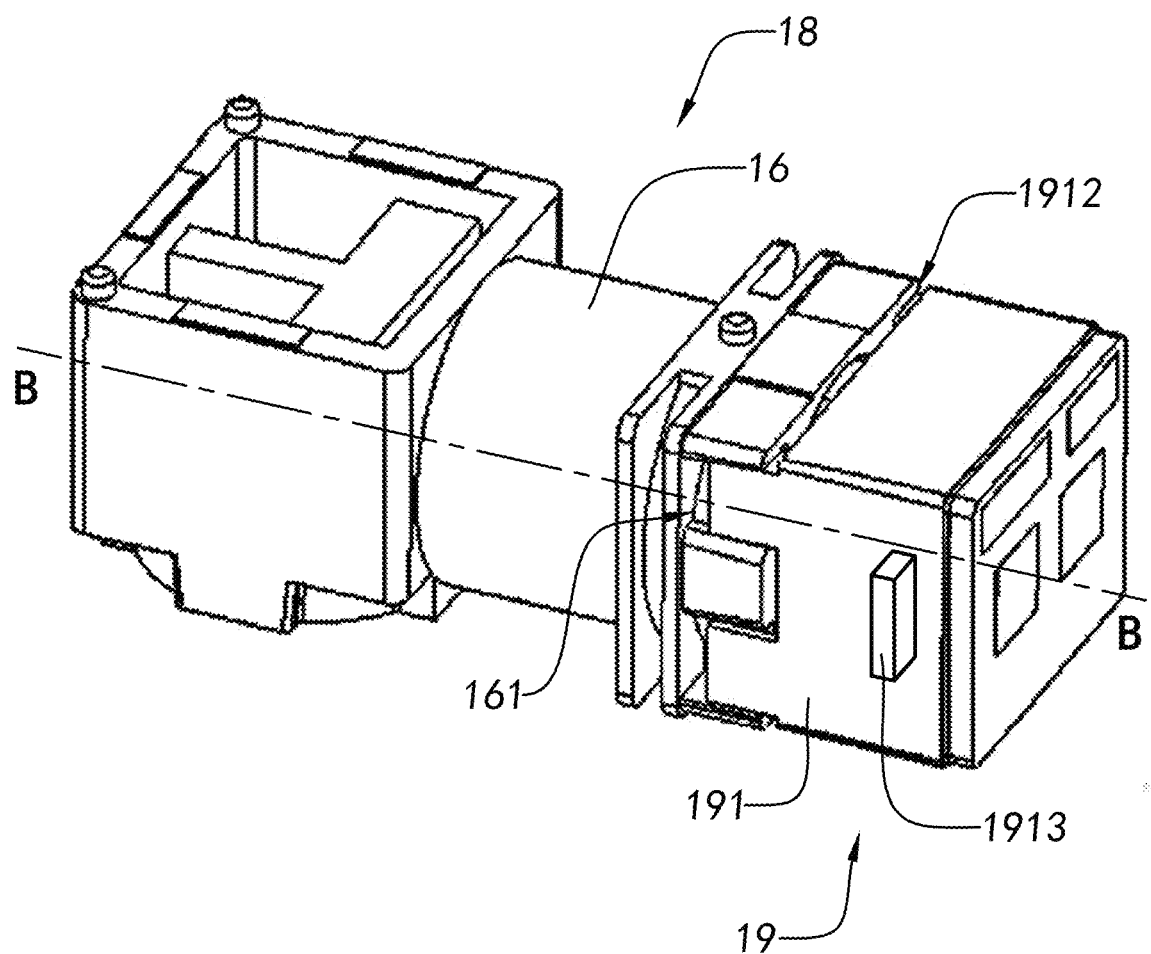
FIG. 12 is a three-dimensional perspective view of the projection device according to the above preferred embodiment of the present invention.

Further, referring to FIGS. 10A and 10B, contrasting to the prior art that provides dispensing groove with two sides on the assembly side of the camera lens, the shell 16 has at least a media bay 161, wherein each media bay 161 is arranged on the assembly side of the shell 16, and each media bay 161 is for accommodating an interconnecting media for assembling the camera lens 18 and the lens holder 19.

Each media bay 161 can have at least three side walls. The liquid interconnecting media can be stored in each media bay 161. Also, contrasting to prior art, each media bay 161 can accommodate more interconnecting media, so as to guarantee the sufficiency of it. Each media bay 161 can be located between the shell 16 and the lens holder shell 191 in order to make sure that the interconnecting media in each media bay 161 will contact the shell 16 and the lens holder shell 191 and to ensure the reliability of the assembly relation of the camera lens 18 and the lens holder 19 after the assembling is finished.

Furthermore, the quantity of the media bay 161 can be four and each media bay 161 is respectively arranged at a corner of the shell 16, wherein the plane where the end of the side wall that forms the media bay 161 is on and the plane where the end of the shell 16 is on are on a coplane, so as to ensure the evenness of the assembly side of the shell 16. Therefore, during the operation process of assembling the lens holder 19 on the camera lens 18, the lens holder 19 will not press the liquid interconnecting media in each media bay 161 of the camera lens 18 to overflow. Consequently, it does not require additional manpower for removing the overflowed and solidified interconnecting media on the assembling position of the camera lens 18 and the lens holder 19. As a result, it not only reduces manpower costs, but decreases assembling processes of the projection device 10, so that the manufacturing cost of the projection device 10 can be significantly reduced.

In addition, because each media bay 161 has three side walls, after the lens holder 19 is assembled on the camera lens 18, it will form an accommodating trough that has a mouth for each media bay 161. Hence, the interconnecting media can then be filled into the accommodating trough through the mouth, which decreases the difficulty of glue filling, so as to make the glue filling operation at the assembling position of the camera lens 18 and the lens holder 19 easier.

It is worth mentioning that because the interconnecting media will not overflow from every media bay 161, therefore, on the one hand, it can ensure the pleasing appearance of the projection device 10, while on the other hand, it can keep the assembling position of the camera lens 18 and the lens holder 19 level and smooth, such that it is easier for the projection device 10 to be installed in the electronic mobile device 40 subsequently.

It is also worth mentioning that the interconnecting media can be embodied as glue, such as UV glue. When assembling the projection device 10, the UV glue can be arranged in each media bay 161 by dispensing. Then the lens holder 19 is assembled on the camera lens 18. after the focusing operation of the camera lens 18 and the lens holder 19 is accomplished, a pointolite 1000 is utilized to expose the UV glue. After the exposure, the UV glue will be solidified, so as to achieve the pre-fixing of the camera lens 18 and the lens holder 19. Next, the assembling of the camera lens 18 and the lens holder 19 can be accomplished through the glue filling operation at the position of each media bay, so as to make a functional projection device 10.

It is also worth mentioning that in other embodiments of the present invention, the position of each media bay 161 is not limited hereby. Rather, it can also respectively form an assembly side of the lens holder shell 191. Nevertheless, due to the consideration of the size of the projection device 10, it has to apply the sleeving or packaging way to assemble the camera lens 18 and the lens holder 19 for the projection device 10. Besides, the application process of the present invention is embodied with the way that the camera lens 18 packages or sleeves on the lens holder 19. Hence, Preferably, each media bay 161 is respectively arranged on the assembly side of the shell each. Later, the present invention will further describe and disclose the assembly relation between the camera lens 18 and the lens holder 19.

In the present invention, in order to reduce the volume of the projection device 10, contrasting to prior art, the camera lens 18 and the lens holder 19 are assembled with non-thread way and when assembling the camera lens 18 and the lens holder 19, before the interconnecting media was exposed and solidified, the camera lens 18 and the lens holder 19 have to go through the focusing process. This embodiment that is provided according to the spirit of the present invention illustrates that the principle of the focusing operation of the camera lens 18 and the lens holder 19 can be fixing one of the components and completing the focusing process by operations, such as moving, revolving, tilting, etc., of another component.

Specifically, the end (assembly side) of the shell 16 has an installation chamber 162, while the end (assembly side) of the lens holder shell 191 has an installation end 1911. When assembling the lens holder 19 and the camera lens 18, the installation end 1911 can extend into the installation chamber 162, so as to form a focusing gap 1912 between the shell 16 and the lens holder shell 191, as FIG. 14 illustrated. For the existence of the focusing gap 1912, preferably, the focusing gap 1912 is the distance between the lens holder shell 191 and the shell 16, wherein the dimension parameter of the focusing gap 1912 can be set as D mm. Later, the present specification will further describe the dimensions of the focusing gap 1912, so as to explain that after the camera lens 18 is fixed, the lens holder 19 can more, revolve, tilt, etc. relatively to the camera lens 18.

In other words, in the present invention, when conducting focusing operation to the camera lens 18 and the lens holder 19, the camera lens 18 is a fixing component and the lens holder 19 is a movable component. This process can be implemented with a testing device mentioned later in the present specification.

It is worth mentioning that as a preferred structure of the 3D lens module, the installation chamber 162 is a cylindrical cavity, the installation end 1911 is cylindrical structure. If tolerance is neglected, the diameter of the section at any position of the installation end 1911 is the same, and the inner diameter of the installation chamber 162 is larger than the outer diameter of the installation end 1911. Therefore, it allows the lens holder 19 to tilt to any direction relatively to the camera lens 18, so as to facilitate the subsequent focusing.

Figure 13:
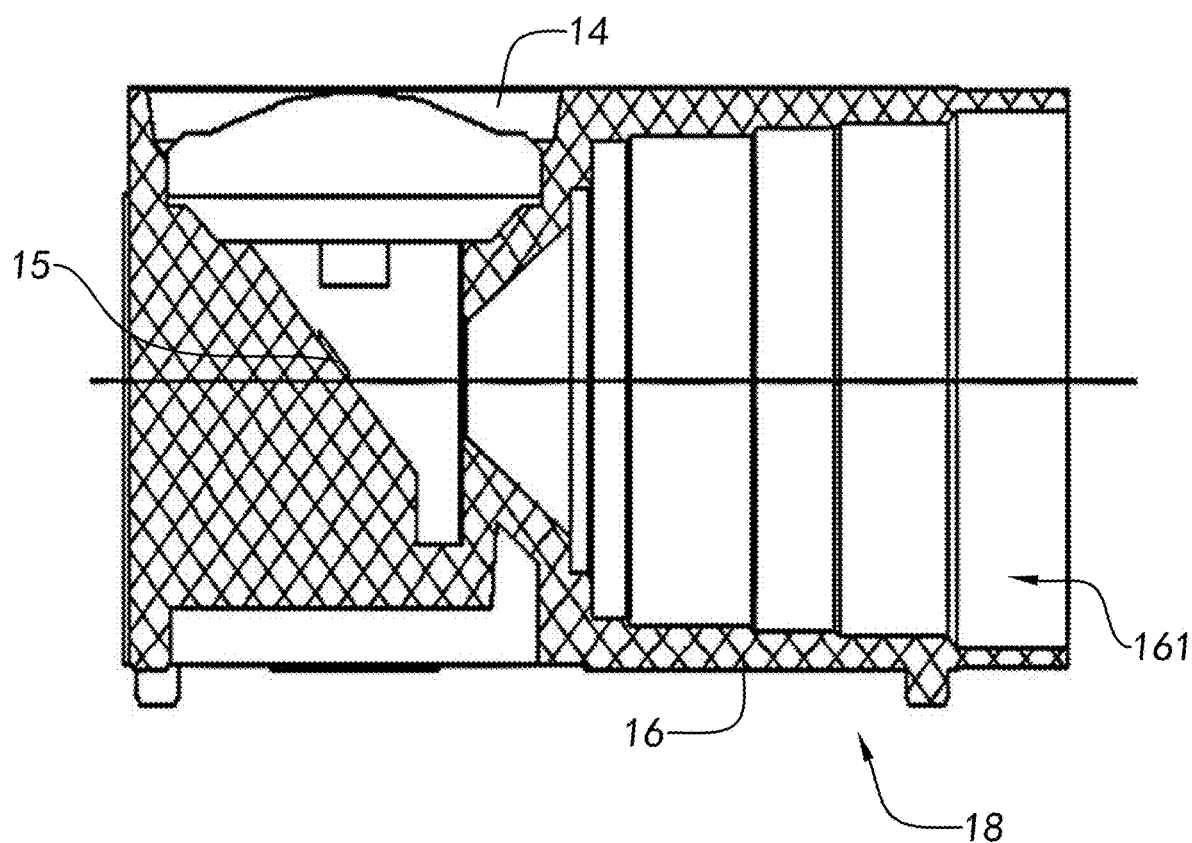
FIG. 13 is a sectional view of FIG. 10A along the line A-A.
Figure 15:
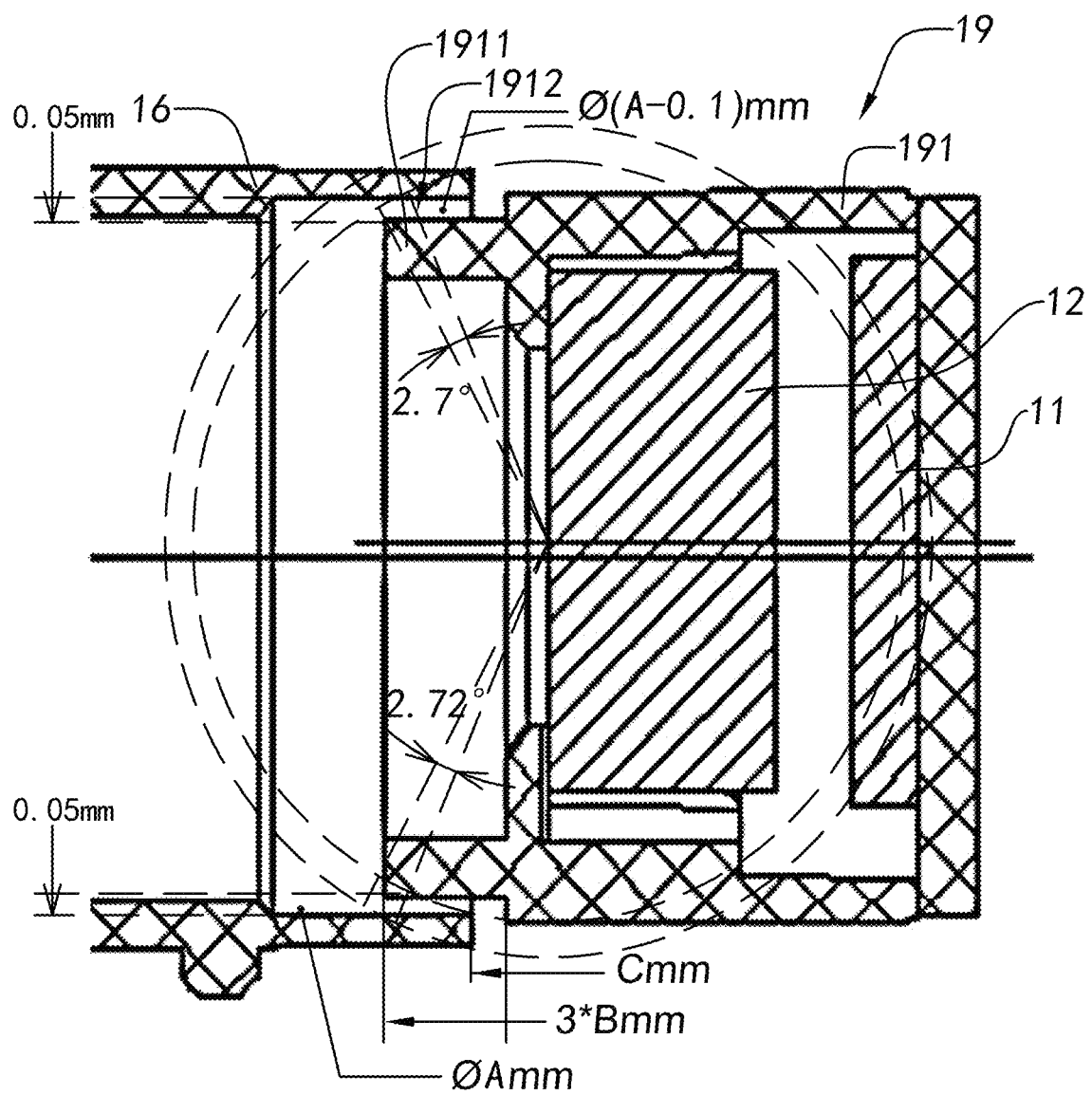
FIG. 15 is a partially enlarged view of S position of FIG. 14.

Referring to FIGS. 13-15, another aspect of the present invention also provides a design method for the structure of the projection device 10, so as to facilitate the focusing of the projection device 10 and improve the imaging quality of the three-dimensional imaging device formed with the projection device 10.

Specifically, referring to FIG. 15, before the projection device 10 is designed, the inner diameter of the installation chamber 162 and the length of the installation end 1911 should be determined. More specifically, the parameter of the inner diameter of the installation chamber 162 is set as A mm according to the molding requirements of the module of the shell 16 and the assembling requirements of the last lens set of the condensing lens group 13. Correspondingly, referring to the assembly structure of Camera Compact Module (CCM), the coordination distance of the motor groove and lens holder boss is B mm. With the consideration of the overall reliability of the module, the coordination distance of the two columns of the shell 16 and the lens holder shell 191 should at least be 3*B mm. Besides, the tolerance of the Through The Lens (TTL) of the camera lens 18 is C mm. Therefore, the length parameter of the installation end 1911 is (3*B+C) mm, as FIG. 15 illustrated.

Figure 16:
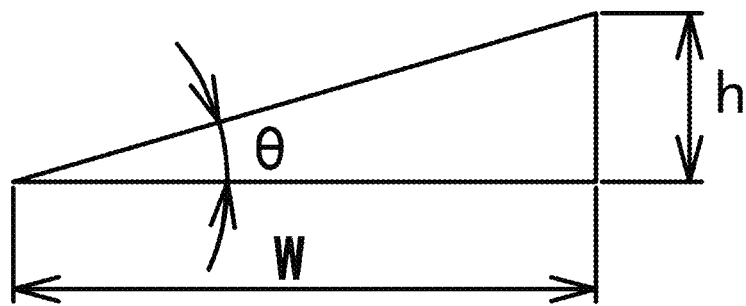
FIG. 16 is a perspective view of the calculation method for the relations of the installation end and the installation chamber according to the above preferred embodiment of the present invention.

After the length of the installation end 1911 of the lens holder 19 and the inner diameter of the installation chamber 162 of the camera lens 18 is determined, it has to calculate the outer diameter of the installation end 1911. Referring to FIGS. 15 and 16, according to the accuracy of the projection device 10, the maximum tilt angle of the light source 11 is 0.655°, the maximum tilt angle of the lens holder shell 191 is 0.61°, and the maximum tilt angle of the optical encoder 12 is 0.684°. Preferably, the light source 11 can be embodied as a Vertical Cavity Surface Emitting Laser (VCSEL) light source. The maximum tilt angle of the lens holder 19 is calculated according to the maximum tilt of each component of the projection device 10. Here, the parameter of the maximum tilt angle of the lens holder 19 is set as Ø, and the maximum tilt angle Ø equals to arctan(h/w), wherein h is the parameter of the distance between the outer wall of the installation end 1911 and the cavity wall that forms the installation chamber 162 and w is the parameter of the distance of the installation end 1911 extending into the installation chamber 162. Here, the maximum tilt angle is the sum of the maximum tilt angles of the light source 11, the lens holder shell 191, and the optical encoder 12. That is, Ø=0.655°±0.61°±0.684°=1.949°. In other words, the maximum tilt angle of the lens holder 19 is allowed to be within the range of 1.949°.

After the camera lens 18 and the lens holder 19 are assembled, as an embodiment, if the dimension parameter D of focusing gap 1912 is 0.05 mm, the unilateral distance between the cavity wall of the installation chamber 162 and the installation end 1911 will be 0.05 mm. Without doubt, those skilled in the art should understand that 0.05 mm of the parameter D described in the present invention is just an example, which shall not be considered as a limit of the present invention. Here, the outer diameter of the installation end 1911 is (A−0.1) mm, as FIG. 14 illustrated. Nevertheless, in other embodiment, the outer diameter of the installation end 1911 is (A−2D) mm. In the present invention, the center of the optical encoder 12 is utilized as the focus center, which can calculate and find out that when the unilateral distance of the cavity wall of the installation chamber 162 and the installation end 1911 is 0.05 mm, the maximum swing angle of the lens holder 19 is 2.7°. Those skilled in the art should understand that when the unilateral distance of the cavity wall of the installation chamber 162 and the installation end 1911 is set to be 0.05 mm, the allowing maximum swing angle of the lens holder 19 is 2.7°. Therefore, the maximum tilt angle of the lens holder 19 is 1.35°, which is behind the range of 1.949°. Hence, it means that the setting, (A−0.1) mm, for the outer diameter of the installation end 1911 is feasible.

Figure 24:
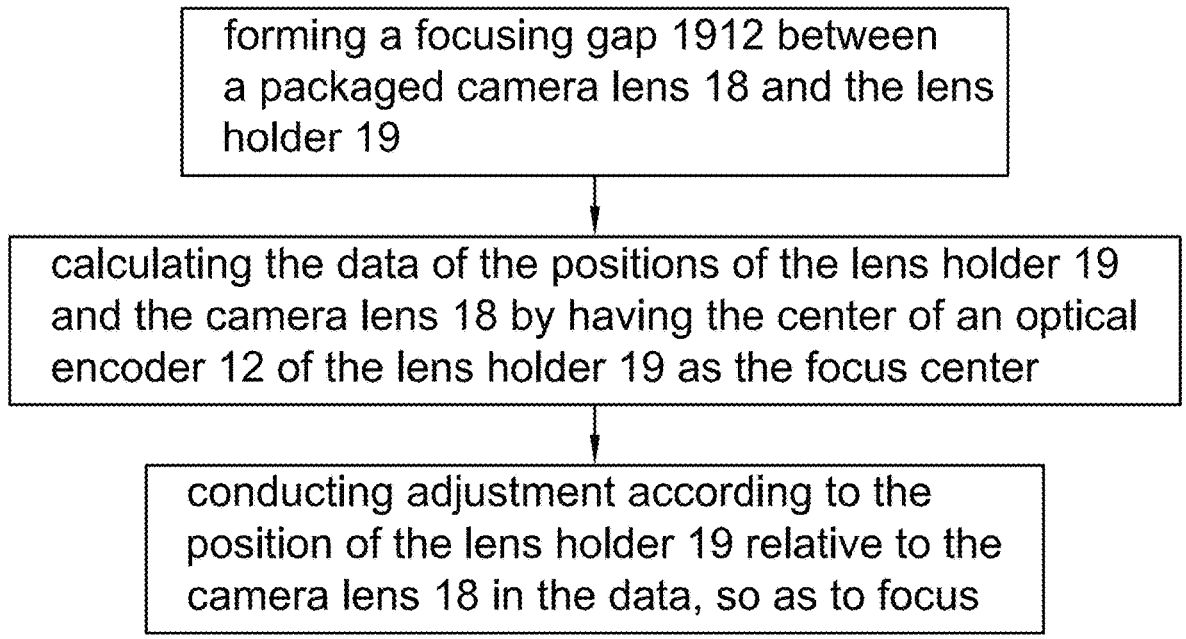
FIG. 24 is a flow diagram of the focusing according to the present invention.

Correspondingly, referring to FIG. 24, the present invention also provides an focusing method of a projection device 10, which comprises the steps of:

(i) forming a focusing gap 1912 between a packaged camera lens 18 and the lens holder 19;

(ii) calculating the data of the positions of the lens holder 19 and the camera lens 18 by having the center of an optical encoder 12 of the lens holder 19 as the focus center; and (iii) conducting adjustment according to the position of the lens holder 19 relative to the camera lens 18 in the data, so as to focus.

Specifically, in order to reduce the size of the projection device 10, when designing the structure of the projection device 10, it has to make the camera lens 18 and the lens holder 19 a package. For example, in certain embodiments, the designs have the lens holder 19 package or overlap with the camera lens 18. Specifically, the camera lens 18 comprises the shell 16, wherein the shell 16 has the installation chamber 162. The lens holder 19 comprises the lens holder shell 191. The lens holder shell 191 has the installation end 1911. The installation end 1911 can extend to the inside of the installation chamber 162. Also, the dimension of the inner diameter of the installation chamber 162 is greater than the dimension of the outer diameter of the installation end 1911, such that when assembling the camera lens 18 and the lens holder 19, the lens holder 19 is allowed to move, such as tilt, relatively to the camera lens 18.

Nonetheless, those skilled in the art should understand that, when implementing the present invention, the structure (s) between the camera lens 18 and the lens holder 19 may not be limited in the above structure, but anything that is able to package or overlappingly connect the camera lens 18 and the lens holder 19 together.

In the above method, the installation chamber 162 is a cylindrical cavity and the installation end 1911 is a cylindrical structure, so that when the 3D projection device is conducting focusing, the lens holder 19 is allowed to tilt in any direction relatively to the camera lens 18.

That is to say, in the step (i), the installation chamber 162 is formed in the shell 16 of the camera lens 18, the installation end 1911 is formed in the lens holder shell 191 of the lens holder 19, and the installation end 1911 is allowed to extend into the installation chamber 162, so as to form the focusing gap 1912 between the shell 16 and the lens holder shell 191.

Those skilled in the art should understand that because of the existence of the focusing gap 1912, it allows the lens holder 19 to move along the longitudinal direction of the camera lens 18. Correspondingly, because the dimensions of the outer diameter of the installation end 1911 is smaller than the dimensions of the inner diameter of the installation chamber 162, it allows the lens holder 19 to tilt relatively to the camera lens 18. According to the accuracy requirement of the projection device 10, the maximum tilt angle of the lens holder 19 is within 1.949°.

According to another perspective of the present invention, it also provides a testing device for finishing the core aligning, assembling, and testing of the camera lens 18 and the lens holder 19 of the projection device 10. In other words, it can accomplish the operation of several processes at once with the testing device, so as to reduce the transferring costs of the projection device 10 and prevent the components of the projection device 10 from being polluted by the external pollutants, such as dust, during the transferring processes. As a result, the imaging quality of the three-dimensional imaging device formed with the projection device 10 can be ensured Specifically, FIGS. 17-20 illustrated the testing device according to a preferred embodiment of the present invention, which comprises a camera lens fixing component 50, a lens holder fixing component 60, and a pointolite 1000.

More specifically, when applying the testing device to implement the core aligning, assembling, and testing of the projection device 10, the camera lens fixing component 50 is to secure the camera lens 18 and the lens holder fixing component 60 is to secure the lens holder 19. The camera lens 18 and the lens holder 19 can be adjusted to matchable positions by the movement of the lens holder fixing component 60 relatively to the camera lens fixing component 50. Then the pointolite 1000 is utilized to expose the assembly side of the focused camera lens 18 and lens holder 19, so as to solidify the interconnecting media arranged between the camera lens 18 and the lens holder 19, to achieve the pre-fixing of the camera lens 18 and the lens holder 19. Next, the assembling of the projection device 10 is finished with the glue filling operation at the assembling position of the camera lens 18 and the lens holder 19.

Further, the testing device also comprises a pedestal 70. The camera lens fixing component 50, the lens holder fixing component 60, and the pointolite 1000 are respectively arranged at corresponding positions on the same side of the pedestal 70. The pointolite 1000 is located between the camera lens fixing component 50 and the lens holder fixing component 60.

Figure 17:
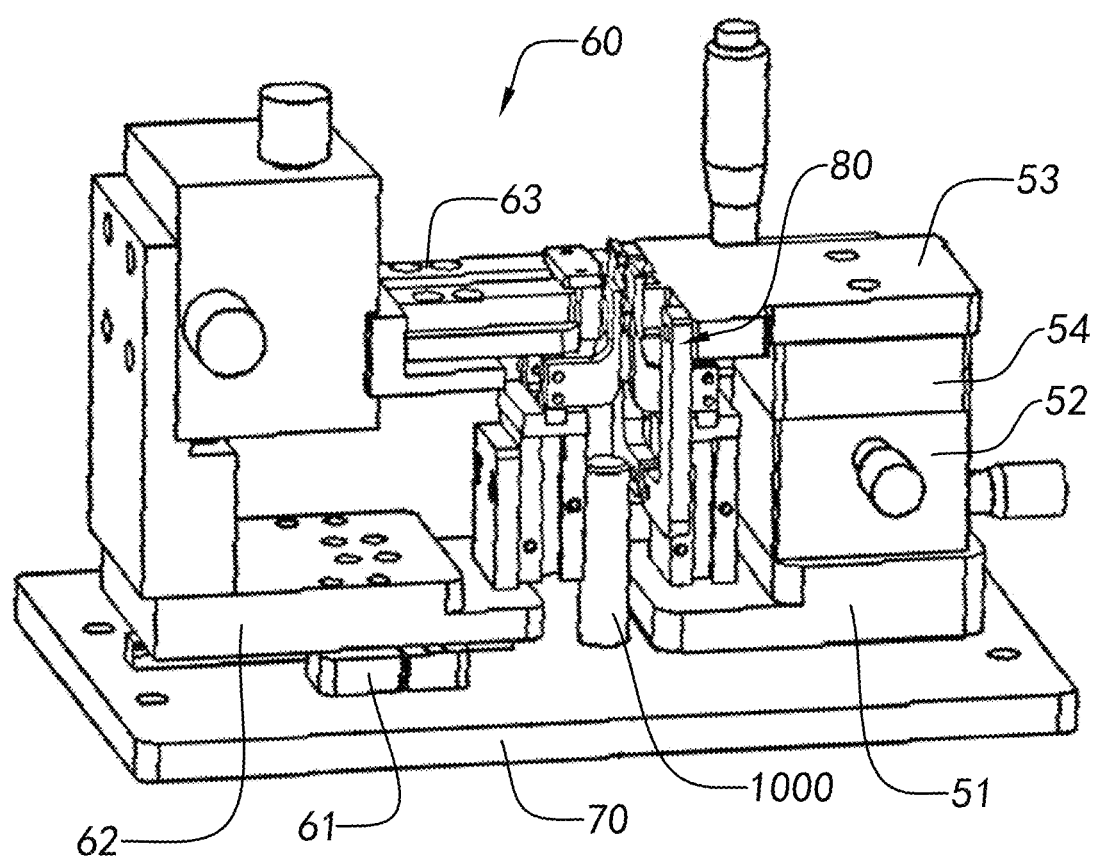
FIG. 17 is a three-dimensional perspective view of the testing device according to a preferred embodiment of the present invention.
Figure 18:
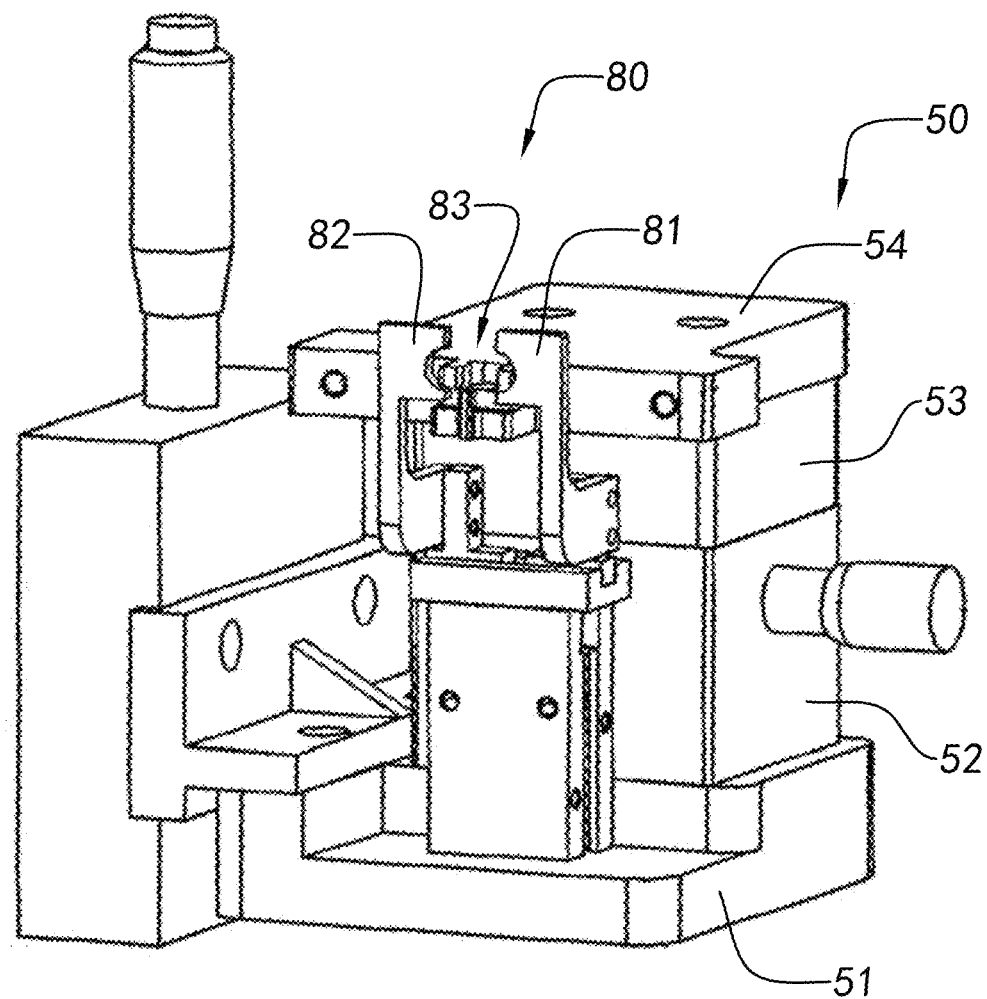
FIG. 18 is a partial perspective view of the camera lens fixing component according to the above preferred embodiment of the present invention.

In some embodiment of the present invention, referring to FIGS. 17 and 18, the camera lens fixing component 50 further comprises a base 51 fixed on the pedestal 70, a first adjustment platform 52 arranged on the base 51, wherein the first adjustment platform 52 can be embodied as a triaxial adjustment platform, so as to adjust in the directions of X, Y, and Z relatively to the pedestal, and a camera lens fixed block 53 for fixing the camera lens 18, wherein the movements of the camera lens fixed block 53 and the first adjustment platform 52 are synchronous and consistent with each other.

Figure 19:
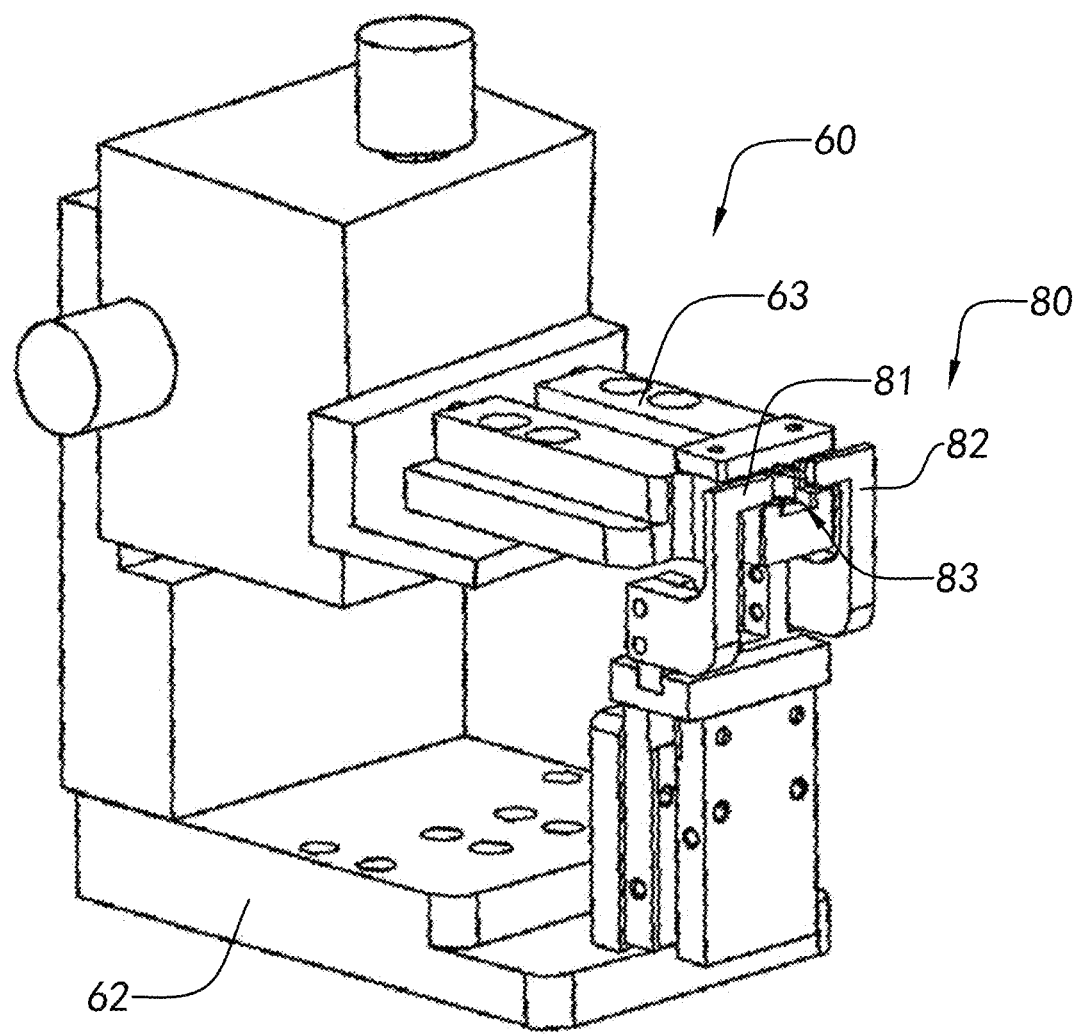
FIG. 19 is a partial perspective view of the lens holder fixing component according to the above preferred embodiment of the present invention.

Correspondingly, referring to FIGS. 17 and 19, the lens holder fixing component 60 comprises a track 61 fixed on the pedestal 70, a second adjustment platform 62 movably arranged on the track 61, and a lens holder fixing block 63 for fixing the lens holder 19, wherein the movements of the lens holder fixing block 63 and the second adjustment platform 62 are synchronous and consistent with each other. Preferably, the second adjustment platform 62 linearly move along the rail formed by the track 61, so as to control the consistency of the assembling of the lens holder 19 and the camera lens 18. As a result, the imaging quality of the three-dimensional imaging device formed with the projection device 10 can be ensured.

In the operation process of assembling the projection device 10, the core aligning of the camera lens 18 and the lens holder 19 can be implemented through the second adjustment platform 62 and the first adjustment platform 52, wherein the controllable range of the second adjustment platform 62 is 0.05° and the focusing accuracy thereof is able to reach 0.005 mm, such that the focusing accuracy of the projection device 10 can be controlled thereby.

In some specific embodiments of the present invention, referring to FIG. 18, the camera lens fixing component 50 also can comprises an adjustment element 54 arranged between the first adjustment platform 52 and the camera lens fixed block 53, to ensure that the camera lens fixed block 53 and the lens holder fixing block 63 are at a matchable horizontal height. In other words, the adjustment element 54 is for increasing the height of the camera lens fixed block 53 relative to the lens holder fixing block 63. Therefore, the adjustment element 54 is just preferred in this actual application of the present invention, and not every embodiment of the present invention has the adjustment element 54. Besides, person skilled in the art should also understand that the dimensions of the adjustment element 54 can also be selected based on various uses and needs, which shall not be considered as limit of the scope and content of the present invention.

Figure 20:
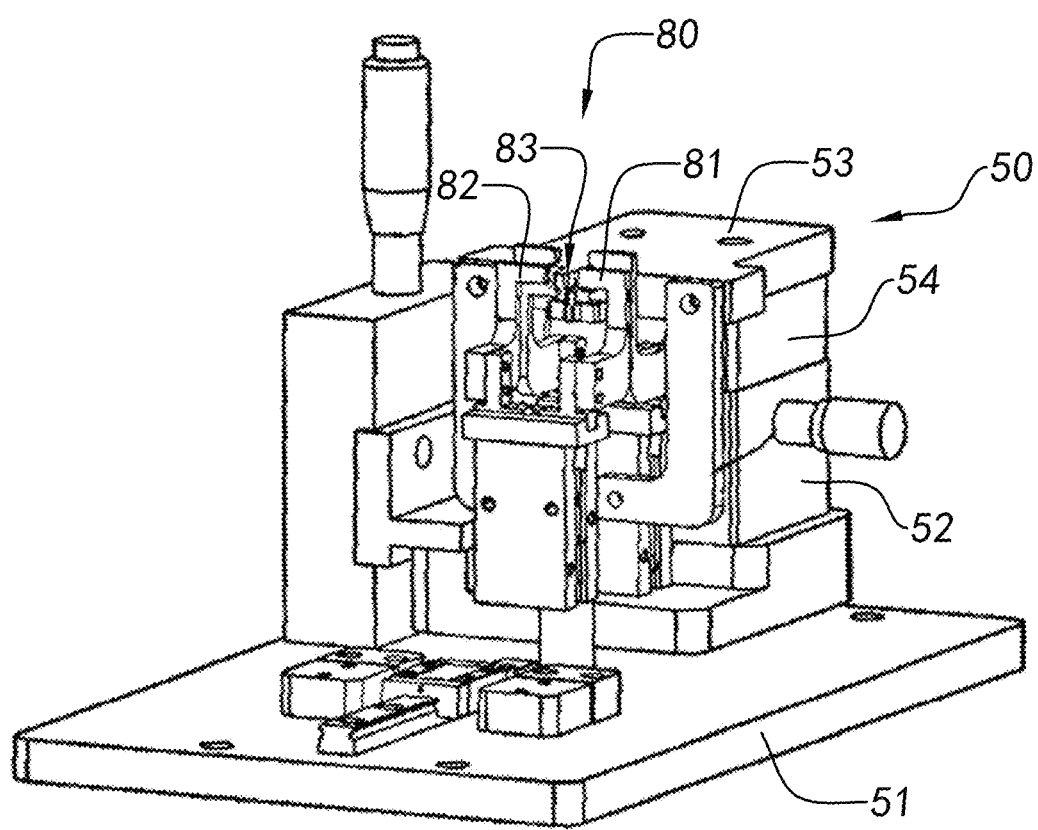
FIG. 20 is a partial perspective view of the testing device according to the above preferred embodiment of the present invention.

Further, referring to FIG. 20, the testing device also comprises at least a clamping element 80. Each clamping element 80 is respectively arranged on the pedestal 70. When core aligning the camera lens 18 and the lens holder 19, the outer surfaces of the camera lens 18 and the lens holder 19 are respectively clamped and held by each clamping element 80. Preferably, each clamping element 80 can be embodied as an air gripper, which allows high accuracy movement, so as to ensure the consistency of the assembling of the camera lens 18 and the lens holder 19.

The lens holder fixing component 60 also provides at least a probe 64. When assembling the camera lens 18 and the lens holder 19, each probe 64 is to withstand the PCB of the end of the lens holder 19 or other position, so as to assist each clamping element 80 to finish the assembling of the projection device 10.

Figure 21:
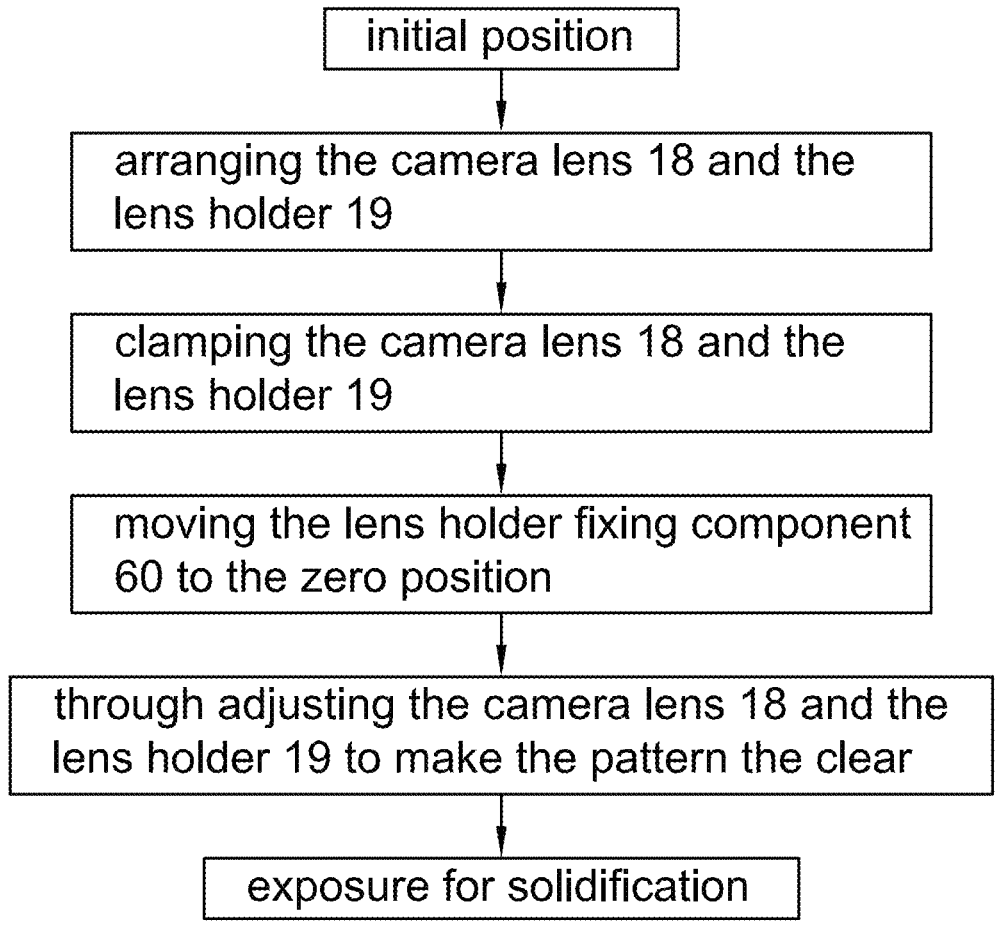
FIG. 21 is a flow diagram of the operation of the testing device according to the above preferred embodiment of the present invention.

It is worth mentioning that, referring to FIG. 21, the operation processes of using the testing device to conduct the core aligning, assembling, focusing, and testing of the projection device comprises:

(1) putting the testing device on the testing platform and setting the first adjustment platform 52 and the second adjustment platform 62 to the initial position to finish the zero calibration of the testing device.

(2) arranging the interconnecting media into each media bay 161 of the camera lens 18 and/or the lens holder 19, wherein the interconnecting media for the present embodiment of the present invention can be embodied as UV glue, which is arranging in each media bay 161 by dispensing; then fixing the camera lens 18 on the camera lens fixed block 53, fixing the lens holder 19 on the lens holder fixing block 63, and respectively clamping the outer surface of the camera lens 18 and the lens holder 19 with the clamping element 80. Subsequently, the lens holder 19 is moved to approximate assembling position of the camera lens 18 and the lens holder 19 with the linearly movement between the second adjustment platform 62 and the track 61.

It is worth mentioning that at the approximate assembling position of the camera lens 18 and the lens holder 19, the coordination of the camera lens 18 and the lens holder 19 can provide a preliminary function for the following focusing. Also, in the present invention, the center of the optical encoder 12 of the lens holder 19 is applied as a focus center to assist the focusing of the testing device towards the projection device 10.

(3) connecting the testing device to the electronic tool of module test, wherein the testing device and the electronic tool of module test can be connected with connection lines, and enabling corresponding control software to light up the camera lens 18 and the lens holder 19 when the connection is correct.

(4) changing the position of the lens holder 19 relatively to the camera lens 18 through adjusting the second adjustment platform 62, so as to even the projection pattern; correspondingly, changing the relative position of the camera lens 18 through adjusting the first adjustment platform 52, so as to make the projection pattern the clearest, wherein the core aligning of the camera lens 18 and the lens holder 19 is then completed. It is worth mentioning that when the light emitted from the light source 11 is encoded by the optical encoder, it will project a pattern on the projecting object. The pattern can help on the core aligning of the camera lens 18 and the lens holder 19. In other words, in this embodiment of the present invention, the center of the optical encoder 12 can be applied as a focus center to assist the focusing of the camera lens 18 and the lens holder 19.

(5) after the camera lens 18 and the lens holder 19 are adjusted to the matching positions, utilizing the pointolite 1000 to expose the interconnecting media in each of the media bays 161 to solidify them, so as to achieve the pre-fixing for the positions of the camera lens 18 and the lens holder 19. For example, the pointolite 1000 can generate UV, so as to expose the interconnecting media that was embodied as UV glue and make it solidified. Then the pre-fixed projection device 10 is allowed to be transferred within its bearable range. Furthermore, after the interconnecting media is solidified, the camera lens 18 and the lens holder 19 have to be lighted up again and a controlling software is used to test if the projection device 10 is qualified. For different projection device 10, there has to be an additional glue filling process. That is to say, after the controlling software determined the projection device 10 to be qualified, there has to be a glue filling process conducted for the assembling position of the camera lens 18 and the lens holder 19, so as to completely fix the camera lens 18 and the lens holder 19, in order to form the projection device 10 that has a reliable structure.

Figure 22A:
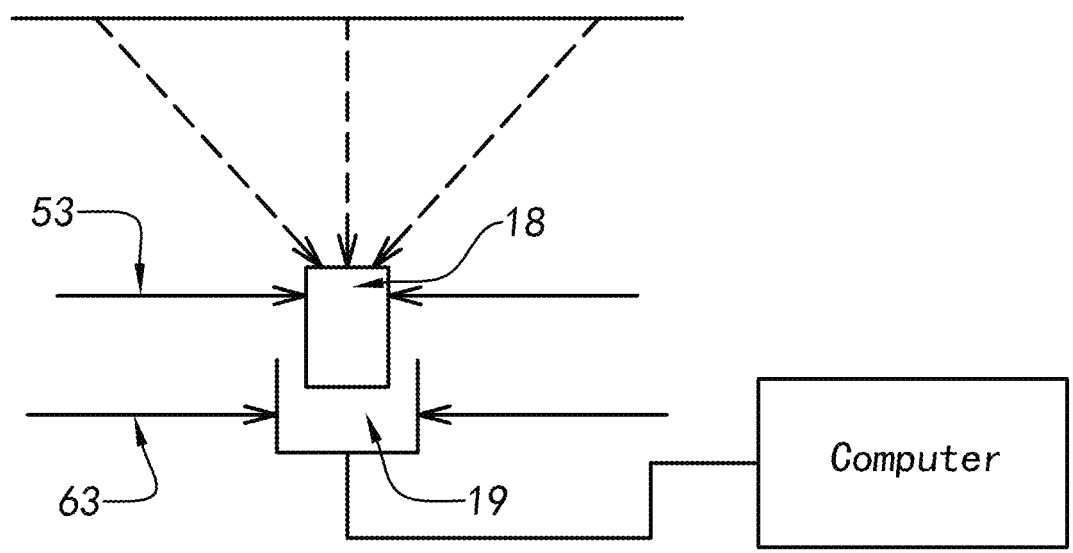
FIG. 22A and FIG. 22B are respectively a perspective view of the focusing process according to the above preferred embodiment of the present invention.

In this embodiment, the focusing process of projection device 10 is as FIG. 22A illustrated, the camera lens 18 can be fixed by the camera lens fixed block 53, and it is to ensured that the position of the camera lens fixed block 53 will not be changed due to unintentional factor, so as to ensure that the camera lens 18 can remain parallel to the test chart that is arranged at the relative position to the camera lens fixed block 53.

Figure 22B:
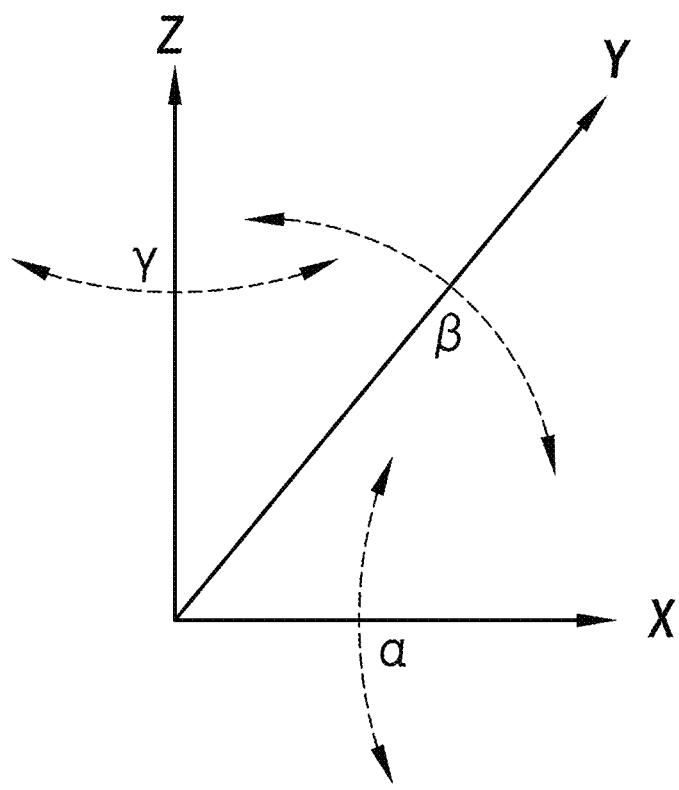

Correspondingly, the lens holder 19 can be fixed by the lens holder fixing block 63, wherein the lens holder fixing block 63 can assist the lens holder 19 to achieve the even movements in the three axial directions of X, Y, and Z and to achieve the adjustments of tilt angle in the three directions of X, Y, and Z, as FIG. 22B illustrated. That is to say, the lens holder 19 can achieve adjustment of any position in three-dimensional space under the assistance of the lens holder fixing block 63.

The pattern information of the test chart is obtained through the coordination of the camera lens 18 and the lens holder 19. The pattern information will further be transmitted to a computer for software algorithm analysis to adjust the position of the lens holder 19 according to the outcome of the image information, so as to gain better effect of the image information. Then, after the focusing of the camera lens 18 and the lens holder 19 is finished, the pointolite 1000 is utilized to expose the interconnecting media in each media bay 161 at the assembling position of the camera lens 18 and the lens holder 19 to solidify it, so as to complete the pre-fixing for the camera lens 18 and the lens holder 19.

It is worth mentioning that in the subsequent working procedure, a glue filling operation is also required to be conducted at the assembling position of the camera lens 18 and the lens holder 19, so as to provide functions of sealing and reinforcing, wherein the glue can be a thermosetting adhesive. It is also worth mentioning that according to the uses and needs of various types of the projection device 10, after glue filling, it requires heat treatment for the projection device 10 to ensure the assembly strength of the camera lens 18 and the lens holder 19.

Figure 23A:
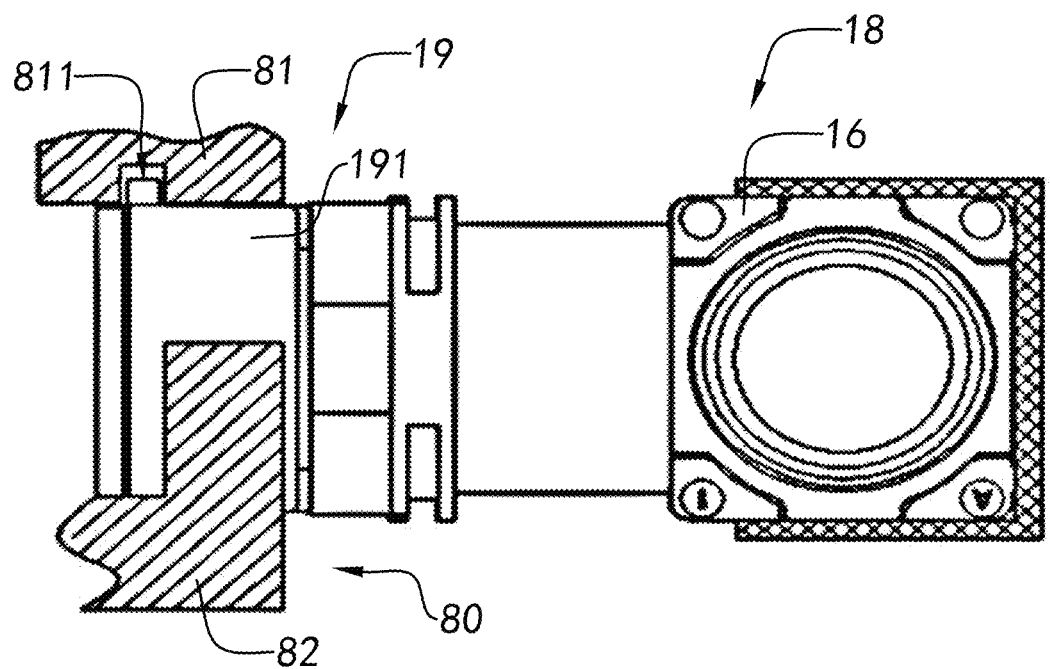
FIG. 23A and FIG. 23B are respectively a perspective view of the assembly processes of the camera lens and the lens holder according to the above preferred embodiment of the present invention.
Figure 23B:
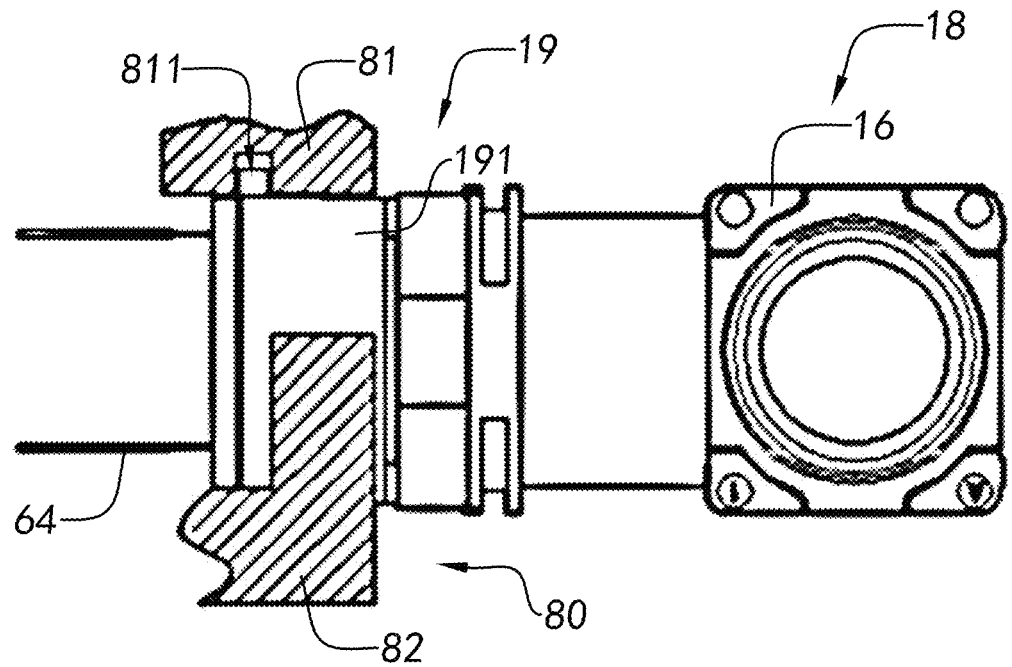

It is worth mentioning that in the step (4), referring to FIGS. 23A and 23B, each probe 64 can be utilized to assist the adjustment of the position of the lens holder 19. Specifically, referring to FIG. 11B, contrasting to the lens holder 19 of the prior art illustrated in FIG. 11A, the lens holder shell 191 can also have at least a positioning element 1913, wherein each positioning element 1913 is at a lateral portion of the lens holder shell 191 and protrudes from the outer surface of the lens holder shell 191, so as to subsequently coordinate with each clamping element 80 to accomplish the assembling of the projection device 10.

Specifically, the quantity of the positioning element 1913 can be two, and each positioning element 1913 is symmetrically arranged on the lateral portion of the lens holder shell. The clamping element 80 comprises a first clamping arm 81 and a second clamping arm 82. The first clamping arm 81 and the second clamping arm 82 form a clamping cavity 83 therebetween for clamping the camera lens 18 and the lens holder 19. In this embodiment, the first clamping arm 81 of the clamping element 80 has a slot 811. When the clamping element 80 is assisting the assembling of the projection device 10, one positioning element 1913 is positioned in the slot 811, so that the second clamping arm 82 can buckle another positioning element 1913. This way is able to ensure that the clamping force provided by the clamping element 80 is evenly applied on the lens holder 19 and that, in the process of assembling the lens holder 19 on the camera lens 18, the lens holder 19 will not be shifted thereby, such that the accuracy of the assembled projection device 10 can be ensured.

More specifically, in the process of assembling the lens holder 19 on the camera lens 18, contrasting to the prior art, the above mentioned way of applying the clamping element 80 with the coordination of the lens holder 19 to buckle the lens holder 19 can ensure the fixing in the front, back, up, and down directions of the lens holder 19. Subsequently, the probe 64 can be utilized to tight withstand the PCB of the lens holder 19 to complete the assembling of the projection device 10. It is worth mentioning that, in the present invention, the slot 811 formed by the positioning element 1913 and the first clamping arm 81 and what is between the positioning element 1913 and the second clamping arm 82 are both surface-to-surface contacts, so as to guarantee the evenness of the stress on the lens holder 19 and to ensure the lens holder 19 is more stably and reliably fixed.

Figure 25:
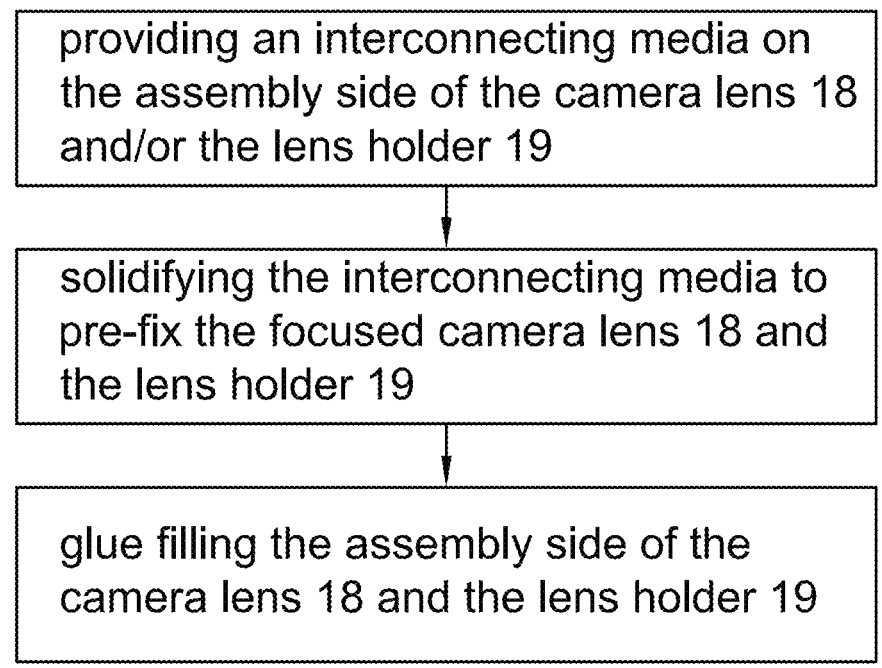
FIG. 25 is a flow diagram of the packaging of the screwless module of the three-dimensional imaging device according to the present invention.

It is worth mentioning that, referring to FIG. 25, the present invention also provides a packaging method of screwless module, wherein the method comprises the following steps:

(I) providing an interconnecting media on the assembly side of the camera lens 18 and/or the lens holder 19;

(II) solidifying the interconnecting media to pre-fix the focused camera lens 18 and the lens holder 19; and (III) glue filling the assembly side of the camera lens 18 and the lens holder 19.

Preferably, in the above method, at least a media bay 161 is formed on the end of the shell 16 of the camera lens 18 and the interconnecting media is arranged in each media bay 161. In this preferred embodiment of the present invention, each media bay 161 has at least three side walls, so as to, first, guarantee that the liquid interconnecting media in each media bay is sufficient to ensure the reliability of the assembled camera lens 18 and lens holder 19, and second, prevent the arranged liquid interconnecting media from being pressed to overflow when assembling the camera lens 18 on the lens holder 19. Third, after the camera lens 18 and the lens holder 19 is assembled, each media bay 161 will form an accommodating trough, so as for the glue filling operation to be conducted on the assembly side of the camera lens 18 and the lens holder 19 in the step (III).

More preferably, after the step (III), the above method further comprises step (IV): heating the screwless module to enhance the assembly strength of the lens holder 19 and the camera lens 18.

It is worth mentioning that the screwless module disclosed in the present invention can be the projection device 10 or other types of camera module, wherein after the screwless is focused, the pre-fixing of the camera lens 18 and the lens holder 19 is a necessary and required process, otherwise the subsequent glue filling on the assembly side of the camera lens 18 and the lens holder 19 will cause the lens holder 19 shift and, as a result, influence the subsequent imaging quality of the screwless module.

Correspondingly, the present invention also provides a design method of screwless module, wherein the screwless module comprises a camera lens 18 and a lens holder 19, wherein the camera lens 18 comprises a shell 16 and the lens holder 19 comprises a lens holder shell 191, wherein the method comprises forming a focusing gap 1912 between the packaged shell 16 and lens holder shell 191, wherein after packaging, the gradient between the shell 16 and the lens holder shell 191 is adjustable.

Preferably, in the above method, the end of the shell 16 forms at least a media bay 161 to accommodate the interconnecting media. For example, the interconnecting media can be embodied as UV glue. Because the interconnecting media is in liquid state, each media bay 161 can have at least three side walls to ensure that the interconnecting media will not overflow during the assembling process of the screwless module and will be able to pre-fix the camera lens 18 and the lens holder 19 after the interconnecting media is solidified.

Further Preferably, in the above method, an installation chamber 162 is formed in the shell 16, and an installation end 1911 is formed in the lens holder shell 191, wherein the installation end 1911 is allowed to extend to the installation chamber 162, wherein the installation chamber 162 is a cylindrical cavity, the installation end 1911 is a cylindrical structure, and the dimension of the inner diameter of the installation chamber 162 is greater than the dimension of the outer diameter of the installation end 1911. Therefore, the gradient of the packaged camera lens 18 and the lens holder 19 can be freely adjusted.

Figure 26:
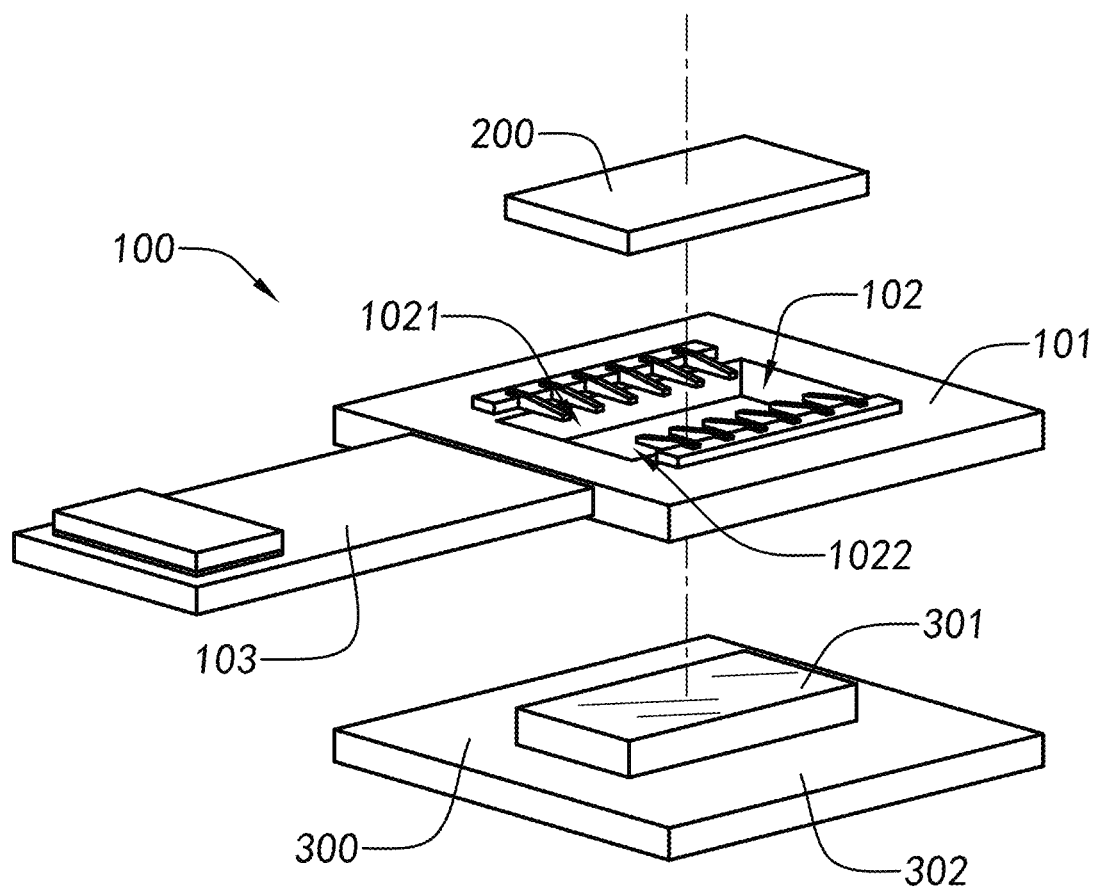
FIG. 26 is a structural exploded view of a preferred embodiment according to the present invention.
Figure 27:
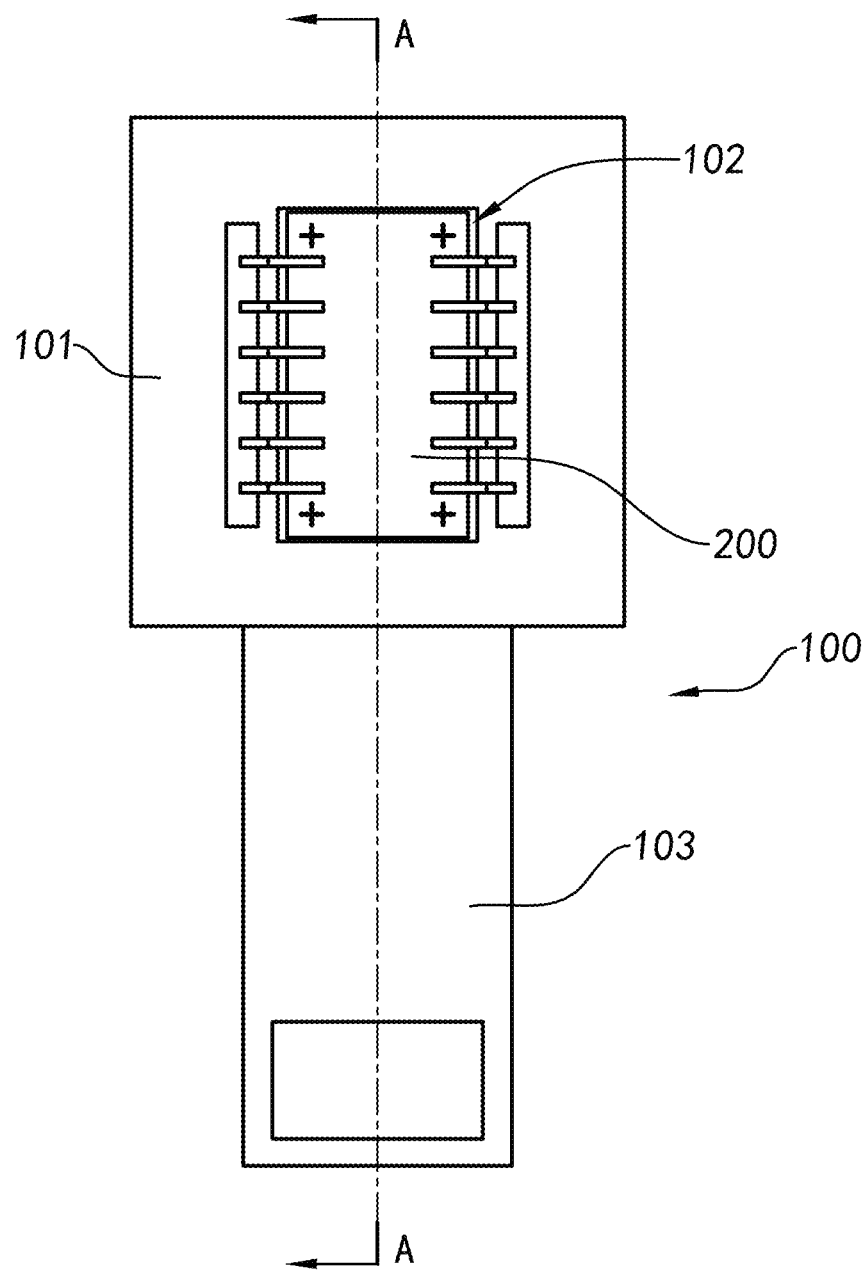
FIG. 27 is a structural perspective view of the above preferred embodiment according to the present invention.

FIGS. 26-27 illustrated a heat-removable circuit board device for manufacture the projection device 10. The heat-removable circuit board device comprises a main circuit board 100 having a heat dispersing cavity 102, a chip component 200 electrically connected with the main circuit board 100, and a heat dispersing unit 300 extending an end thereof into the heat dispersing cavity 102 for coupling with the chip component 200 so as to conduct and transfer the heat of the chip component 200 to the outside. In other words, the chip component 200 is arranged at an aperture of the heat dispersing cavity 102. The heat dispersing unit 300 extends from another aperture of the heat dispersing cavity 102 to the chip component 200 to contact and connect with or butt couple with the chip component 200 across the heat dispersing cavity 102 of the main circuit board 100, so as to conduct the heat of the chip component 200 to the outside of the main circuit board 100. Therefore, the use of the heat dispersing unit 300 can effectively transfer the internal heat of the circuit board device to the outside thereof, so as to reduce the operating temperature of the chip component 200 and the circuit board device. This technology is suitable for the technical field of installing the circuit board device on a projection light source having structured light. Especially, when it was installed on a projection device, it helps to reduce the operating temperature of the projection light source of the projection device.

The main circuit board 100 comprises a pedestal 101 and a connecting portion 103 outwards extended from an end of the pedestal 101. The pedestal 101 is for arranging wires, so as to allow the chip component 200 to be electrically connected with the main circuit board 100 in order to transmit the signals between the chip component 200 and the main circuit board 100. The connecting portion 103 has a connector to control the operation of the chip component 200 and other components and parts. The heat dispersing cavity 102 is formed on the pedestal 101. During the wire arranging process of the pedestal 101, it is not allowed to arrange wire within the cutting size of the heat dispersing cavity 102, so as to provide a butt coupling space for the chip component 200 and the heat dispersing unit 300, which is the heat dispersing cavity 102. The heat dispersing cavity 102 communicates with the inside and outside of the circuit board device, so as to allow the heat of the circuit board device be conducted from the chip component 200 in the inside of the circuit board device to the outside of the circuit board device through the conduction of the heat dispersing cavity 102. In other words, the heat dispersing cavity 102 has an inner aperture 1021 and an outer aperture 1022. The inner aperture 1021 communicates with the chip component 200 and the heat dispersing cavity 102. The outer aperture 1022 communicates with the heat dispersing cavity 102 and the outside. The heat generated by the chip component 200 can be transferred to the outside by means of a medium in the heat dispersing cavity 102. Here, the medium is a good heat conductor and the heat dispersing unit 300 can be the heat conducting medium.

The chip component 200 comprises a laser emitter thereon as a projection light source. The output power of the chip component 200 is high. The chip component 200 works by electrically conducting heavy current. When the chip component 200 is working, the heavy current working state will make the projection device seriously heat, resulting in internal temperature increment of the circuit board device, which means the temperature at the inner aperture 1021 of the heat dispersing cavity 102 will increase. The heat can be transferred from the inner aperture 1021 to the outside of the main circuit board 100 by using the medium in the heat dispersing cavity 102 for heat conduction.

The heat dispersing unit 300 extends from the outer aperture 1022 of the heat dispersing cavity 102 of the main circuit board 100 to the inner aperture 1021 thereof, to be butt coupled with the chip component 200. The heat dispersing unit 300, with the high efficiency heat conduction feature thereof, can conduct the heat generated by the chip component 200 to the outside. The heat dispersing unit 300 comprises a guiding part 301 and an extending part 302, wherein the guiding part 301 integrally extends from the extending part 302 to the chip component 200, so as to butt couple with the chip component 200 with the heat dispersing cavity 102 of the main circuit board 100, wherein the extending part 302 attaches to the main circuit board 100. The guiding part 301 is for conducting the heat of the chip component 200 from the inner aperture 1021 of the main circuit board 100 to the extending part 302. The extending part 302 is for conducting the heat conducted from the guiding part 301 to the outside, so as to disperse the internal heat of the main circuit board 100 outwards.

The heat dispersing cavity 102 applies a hollow manner to form a designated size of region in the pedestal 101 for transferring the heat generated by the chip component 200. Here, the area of the inner aperture 1021 of the heat dispersing cavity 102 is corresponding to the area of the chip component 200, so that the chip component 200 can be stacked on the inner aperture 1021 of the heat dispersing cavity 102. The preset volume of the heat dispersing cavity 102 corresponds to the guiding part 301 of the heat dispersing unit 300, which is adapted for the guiding part 301 to be arranged inside of the heat dispersing cavity 102. In other words, the diameter of the guiding part 301 of the heat dispersing unit 300 matches the inner diameter of the heat dispersing cavity 102 of the main circuit board 100, so as for the guiding part 301 to butt couple with the chip component 200 with the heat dispersing cavity. The diameter of the guiding part 301 of the heat dispersing unit 300 is shorter than or equal to the diameter of the heat dispersing cavity 102, so as to allow the guiding part 301 of the heat dispersing unit 300 to butt couple with or contact the chip component 200 through the heat dispersing cavity 102.

The extending part 302 of the heat dispersing unit 300 overlaps on the pedestal 101 of the main circuit board 100, so as to enlarge the heat dispersing area of the heat dispersing unit 300 and reinforce the pedestal 101 of the main circuit board 100, wherein the heat dispersing cavity 102 is formed on the pedestal 101. The extending part 302 of the heat dispersing unit 300 is corresponding to the pedestal 101 of the main circuit board 100, so the extending part 302 of the heat dispersing unit 300 can be stacked on the bottom layer of the pedestal 101 so as to reinforce the pedestal 101 of the main circuit board 100 and to enhance the overall strength of the circuit board device, which effectively solves the problem of distortion of the circuit board due to high temperature and improves the evenness of the circuit board device. Hence, the extending part 302 of the heat dispersing unit 300 helps to not only conduct the heat outwards, but also keep the evenness of the pedestal 101 of the circuit board.

In other words, the dimensions of the heat dispersing unit 300 matches the dimensions of the pedestal 101. The guiding part 301 of the heat dispersing unit 300 matches the heat dispersing cavity 102, so as for the guiding part 301 to butt couple with the chip component 200. The extending part 302 of the heat dispersing unit 300 matches the pedestal 101, so as to reinforce the pedestal 101. The matching mentioned above may not refer to completely matching. There may or may not be a designated gap between the heat dispersing cavity 102 and the guiding part 301 of the heat dispersing unit 300. When the guiding part 301 and the inner wall of the heat dispersing cavity 102 have the designated gap, the diameter of the guiding part 301 will be less than the inner diameter of the heat dispersing cavity 102. Nonetheless, when the guiding part 301 and the inner wall of the heat dispersing cavity 102 do not have the designated gap, the diameter of the guiding part 301 will be equal to the inner diameter of the heat dispersing cavity 102. For the extending part 302 of the heat dispersing unit 300, based on the center of the guiding part 301 supposedly, the extending part 302 extends from the guiding part 301 toward the edge of the pedestal 101, so as to have the heat dispersing unit 300 adhere on the outer layer of the pedestal 101 and to reinforce the outer layer of the pedestal 101. Here, the area of the extending part 302 can be consistent or inconsistent with the area of the pedestal 101. The matching degree of the heat dispersing unit 300 and the pedestal 101 is suitable for transferring heat and reinforcing the main circuit board 100. Preferably, for the balance and convenience of the installation of the circuit board device, the area of the extending part 302 of the heat dispersing unit 300 is the same with the area of the pedestal 101 of the circuit board.

There is a designated height difference between the heat dispersing unit 300 and the heat dispersing cavity 102. The designated height difference is suitable for the heat dispersing unit 300 to butt couple with the chip component 200, so as for the guiding part 301 to butt couple with the chip component 200 arranged above the heat dispersing cavity 102. Preferably, the height of the guiding part 301 of the heat dispersing unit 300 is not less than the height of the heat dispersing cavity 102 of the main circuit board 100. This is helpful for attaching the chip component 200 on the guiding part 301 of the heat dispersing unit 300, which makes the attaching process between the chip component 200 and the heat dispersing unit 300 easier and facilitates the fast heat conduction between the chip component 200 and the heat dispersing unit 300.

It is worth mentioning that because the extending part 302 outwards extends from the guiding part 301, it expands the heat dispersing area of the heat dispersing unit 300. When the heat is transferred from the guiding part 301 to the extending part 302, the extending part 302 can rapidly transfer the heat to the outside and accelerate the heat dissipation of the chip component 200. In order to increase the heat dispersing area of the heat dispersing unit 300, preferably, the area of the extending part 302 of the heat dispersing unit 300 is as big as the area of the pedestal 101 of the circuit board. The heat dispersing unit 300 is able to promptly radiate heat production of chip component 200 out and reduce the temperature of the chip component 200 through the heat dispersing unit 300, which is adapted for effective heat dissipation of the projection device. As a result, it helps the heat generated by the projection light source to be highly efficiently dispersed, which is suitable for solving the heat-dissipation problem of the structured light technology. The heat-removable circuit board device is a circuit board device of the projection device.

Figure 28A:
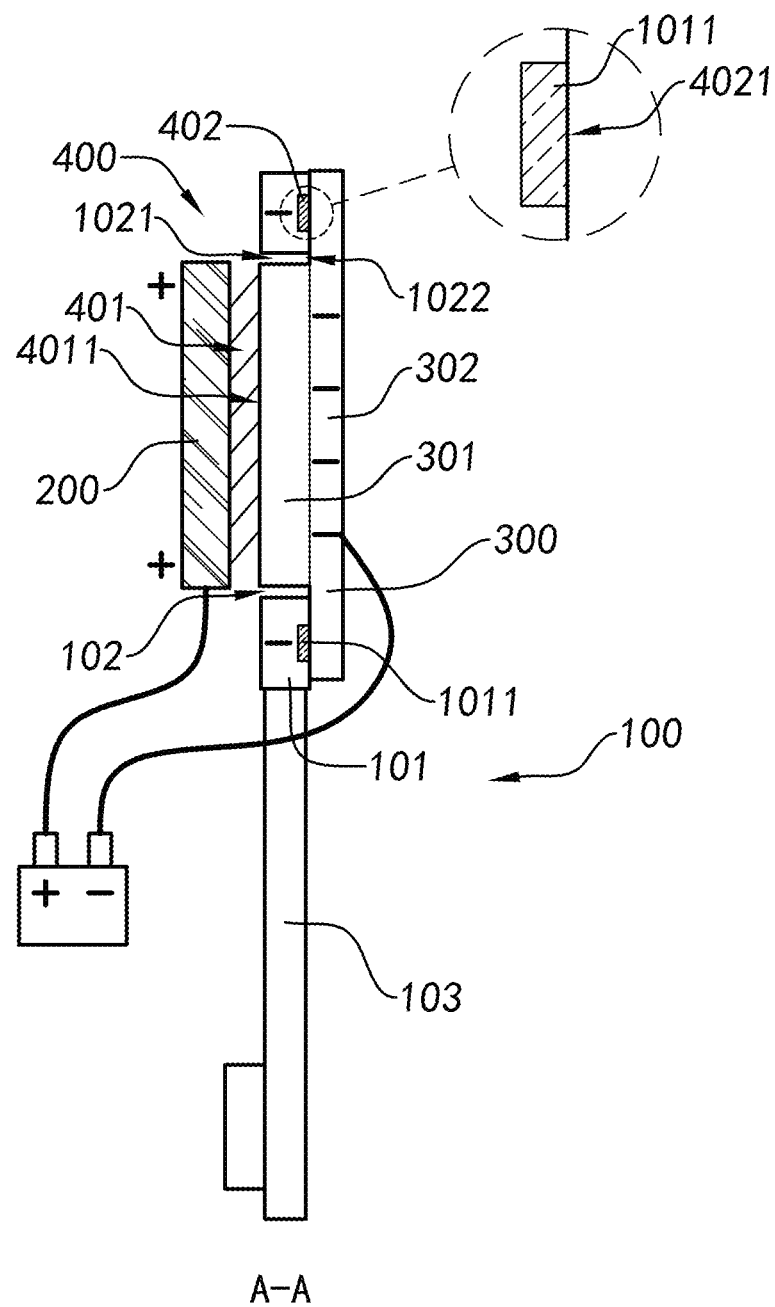
FIG. 28A is a sectional view of FIG. 27 according to the above preferred embodiment of the present invention along A-A' direction.

FIG. 28A refers to a sectional view along A-A' direction of the heat-removable circuit board device of FIG. 27. The pedestal 101 of the main circuit board 100 is placed in between the chip component 200 and the heat dispersing unit 300. The pedestal 101 has a first attaching surface 4011 and a second attaching surface 4021 respectively formed thereon. The first attaching surface 4011 upwards faces the chip component 200, while the second attaching surface 4021 downwards faces the heat dispersing unit 300. To fix the chip component 200 with the first attaching surface 4011 and to fix the second attaching surface 4021 with the heat dispersing unit 300 can make the chip component 200 tightly butt couple with the heat dispersing unit 300, so as for the heat dispersing unit 300 to promptly disperse the radiated heat of the chip component 200 to the outside.

The heat-removable circuit board device further comprises at least an attaching layer 400 400 respectively arranged among the chip component 200, the heat dispersing unit 300, and the main circuit board 100, for attaching the main circuit board 100, the chip component 200, and the heat dispersing unit 300, so as to stabilize the structure of the heat-removable circuit board device. The attaching layer 400 comprises a first attaching layer 401 and a second attaching layer 402, wherein the first attaching layer 401 is arranged between the chip component 200 and the first attaching surface 4011, so as to tightly butt couple the chip component 200 and the guiding part 301 of the heat dispersing unit 300, wherein the second attaching layer 402 is arranged between the second attaching surface 4021 and the heat dispersing unit 300, so as to attach the heat dispersing unit 300 to the main circuit board 100.

The first attaching layer 401 is a tin solder layer that employs tin solder material(s) that heat conductibly butt couples with the chip component 200 and the heat dispersing unit 300 by welding and soldering with soldering paste. Here, the first attaching surface 4011 is arranged on the guiding part 301 of the heat dispersing unit 300. When the guiding part 301 passes the inside of the heat dispersing cavity 102, the first attaching surface 4011 will be formed on the upper surface of the guiding part 301. The chip component 200 can be tightly butt coupled or attached with the guiding part 301 of the heat dispersing unit 300 through tin solder connection. Because the thermal conductivity of tin solder material is much greater than it of D/A glue, the heat generated by the chip component 200 can be promptly conducted to the heat dispersing unit 300 through the tin solder material, which avoids internal overheating caused by using D/A glue and helps to accelerate the heat conduction speed between the chip component 200 and the heat dispersing unit 300.

The second attaching layer 402 employs a conducting resin layer and it utilizes the conducting resin to conduct the heat dispersing unit 300 with the bonding pad of the pedestal 101 by opening a window at the bottom of the pedestal 101. Here, the second attaching surface 4021 of the second attaching layer 402 is arranged on the lower surface of the pedestal 101. When the heat dispersing unit 300 enters the heat dispersing cavity 102 until the extending part 302 of the heat dispersing unit 300 reaches the second attaching surface 4021, the heat dispersing unit 300 can be fixed on the main circuit board 100 through gluing, so as to reinforcing the strength of the pedestal 101 of the main circuit board 100, to avoid distortion due to high temperature, and to improve the evenness of the circuit board device. Because conventional circuit board employs PCB, which hardness is low, when the pedestal 101 becomes seriously distorted after reflow, it will cause the circuit board distort. The present invention applies the heat dispersing unit 300 to reinforce the bottom layer of the pedestal 101, so that the overall intensity of the pedestal 101 of the circuit board is significantly strengthened.

In other words, the first attaching layer 401 is arranged between the chip component 200 and the guiding part 301 of the heat dispersing unit 300, so as to heat conductibly butt couple the chip component 200 and the heat dispersing unit 300, wherein the second attaching layer 402 is arranged between the extending part 302 of the heat dispersing unit 300 and the pedestal 101 of the main circuit board 100, so as to attach the heat dispersing unit 300 to the main circuit board 100.

The material of the heat dispersing unit 300 is selected from high thermal conductivity and high hardness materials, such as sheet steel, sheet copper, hard aluminum, high strength ceramics, etc., or other alloy materials that have these qualities. Comprehensively, the heat dispersing unit 300 can be a whole sheet steel, a whole sheet copper, or a combination of sheet steel and sheet copper type of heat dispersing unit 300. If the materials of the guiding part 301 of the heat dispersing unit 300 and the extending part 302 of the heat dispersing unit 300 are the same, the heat dispersing unit 300 can be made of a whole sheet steel or a whole sheet copper. If the materials of the guiding part 301 of the heat dispersing unit 300 and the extending part 302 of the heat dispersing unit 300 are different, the heat dispersing unit 300 can be formed by a combination of sheet steel and sheet copper. For instance, if the guiding part 301 uses steel, while the extending part 302 uses copper, it can be benefited from the coordination of these two materials. That is, it is able to not only promptly disperse the heat of the chip component 200, but also maintain the intensity of the main circuit board 100. Based on the designated circumstances, the guiding part 301 can also employs copper, while the extending part 302 uses steel. Preferably, the heat dispersing unit 300 is heat dissipating sheet steel(s).

Here, the guiding part 301 of the heat dispersing unit 300 protrudes from the extending part 302 by the method of sheet steel etching. The protruding height of the guiding part 301 is corresponding to the height of the heat dispersing cavity 102. When the extending part 302 is adhered on the first attaching surface 4011 of the pedestal 101, the height of the guiding part 301 of the heat dispersing unit is consistent to the heat dispersing cavity 102. The chip component 200 is adhered on the sheet steel that forms the guiding part 301 by means of tin solder. The heat production of the chip component 200 is conducted to the integrally synthesized extending part 302 through the sheet steel and is then timely conducted to the connected external heat dissipating device through the heat dispersing sheet steel. Besides, the heat dissipating sheet steel can reinforce the intensity of the pedestal 101 of the main circuit board 100 in a relatively larger degree, so as to reduce the distortion thereof.

Because when the laser emitter on the chip component 200 is functioning, it requires heavy current, the chip component 200 and the heat dispersing unit 300 or the pedestal 101 of the main circuit board 100 are electrically conducted. Preferably, the chip component 200 contains positive charge, while the heat dispersing unit 300 or the pedestal 101 of the main circuit board 100 contains negative charge. With the conductivity of the bonding pad of the pedestal 101 and the heat dispersing unit 300, the negative charge on the bonding pad of the pedestal 101 and the negative charge on the heat dispersing unit 300 can both be conducted.

Figure 28B:
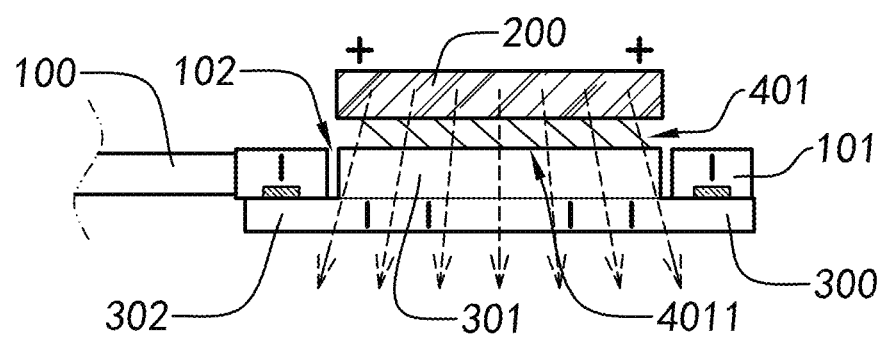
FIG. 28B is a perspective view of the heat radiation of the above preferred embodiment according to the present invention.

The chip component 200 is aligned with the heat dispersing cavity 102 of the pedestal 101 and is facing towards the heat dispersing unit 300 in the heat dispersing cavity 102. When the chip component 200 generates heat, the heat will be transferred to the butt coupled heat dispersing unit 300 through the tin solder layer of the first attaching layer 401. The guiding part 301 of the heat dispersing unit 300 will downwards transfer the heat to the expanded extending part 302. Here, the heat transferred from the guiding part 301 is radially transferred to the extending part 302. The extending part 302 will rapidly transfer the heat to the outside, which means to transfer the heat to the connected external heat dissipating device. This helps to promptly reduce the temperature of the chip component 200, as FIG. 28B illustrated.

Because the area of the guiding part 301 of the heat dispersing unit 300 is smaller than the extending part 302, when the heat is transmitted from the guiding part 301 to the extending part 302, along with the increase of the area of the extending part 302, the heat will not only disperse outward, but be radially conducted from the center of the extending part 302 to the periphery of the extending part 302. Such design helps to enlarge the area to share heat conduction and reduces the overall volume of the heat dispersing unit. As the butt couple area between the chip component 200 and the guiding part 301 is decreased, the overall mass of the circuit board device can be reduced.

Figure 29:
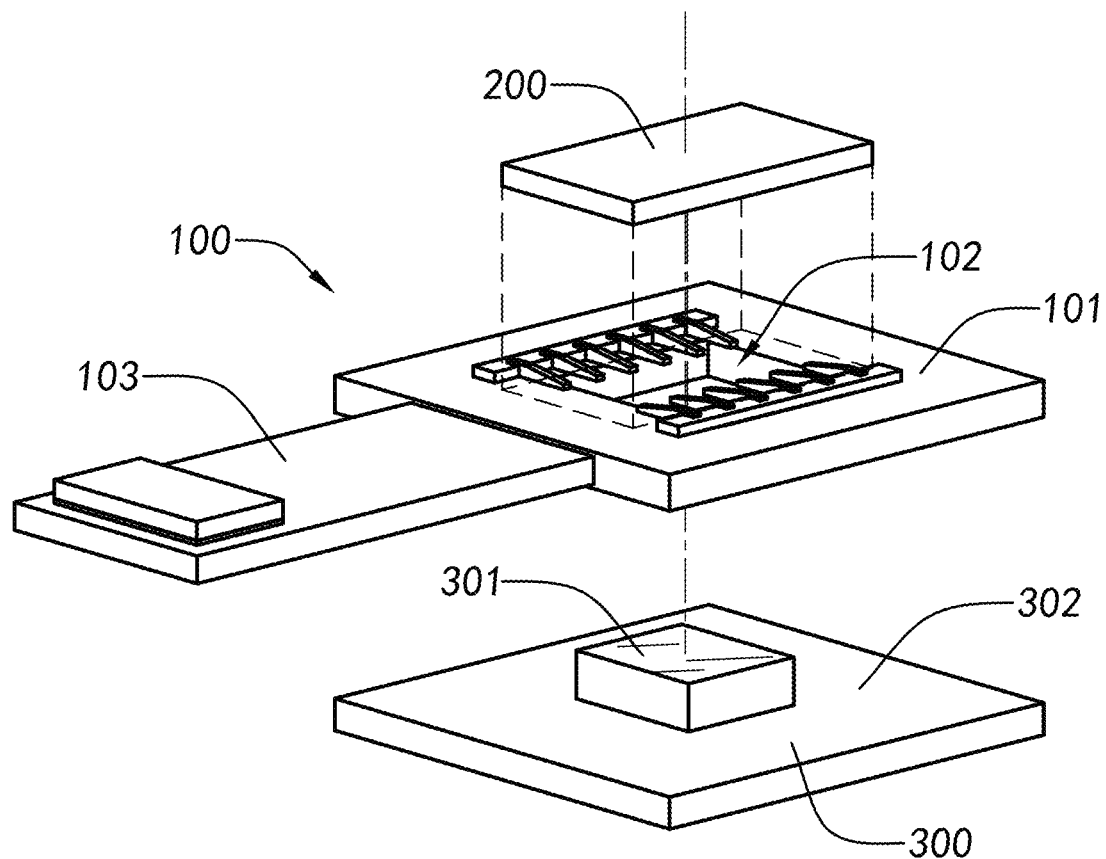
FIG. 29 is an exploded view of the structure of a first alternative according to the above preferred embodiment of the present invention.
Figure 30A:
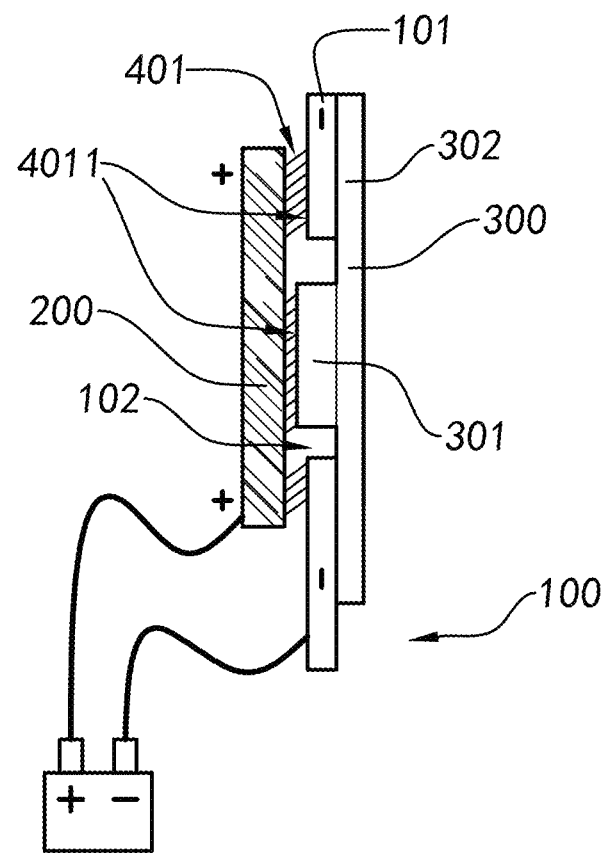
FIG. 30A is an exploded view of the structure of a first alternative according to the above preferred embodiment of the present invention.

FIGS. 29 to 30A illustrated a first alternative of the heat-removable circuit board device. The chip component 200A is spacingly adhered on the heat dispersing unit 300A and the pedestal 101A of the main circuit board 100A. The chip component 200A is not only butt coupled with the heat dispersing unit 300A, but also symmetrically butt coupled with the pedestal 101A of the circuit board at the two sides of the heat dispersing unit 300A, which can effectively prevent lateral movement of the chip component 200A, so as to make the chip component 200A parallel to the pedestal 101A of the circuit board after positioning.

Because the first attaching layer 401A employs soldering paste attachment to weld and solder the chip component 200A and the heat dispersing unit 300A, the soldering paste will stretch when reflow during the operating process and result in deviation of the chip component 200A. This makes the chip component 200A move in one direction and the chip component 200A can move horizontally, deviate laterally, such as tilt, etc., which causes the laser emitter on the chip component 200A fail to project light source from the designated position and direction and possibly affects the normal use of the projection device. The deviation of the chip component 200A after the soldering paste was reflowed can be effectively solved by symmetrical and spacingly adhering the chip component 200A on the heat dispersing unit 300A and the pedestal 101A.

The area of the chip component 200A is larger than the area of the heat dispersing cavity 102A of the pedestal 101A. That is, the area of the chip component 200A is larger than the area of the inner aperture 1021A of the heat dispersing cavity 102A. Therefore, when the chip component 200A is stacked on the heat dispersing cavity 102A, the chip component 200A can cover the heat dispersing cavity 102A and butt couple with the pedestal 101A around the heat dispersing cavity 102A. With the heat dispersing cavity 102A as an interval, the chip component 200A is symmetrically welded and soldered on the pedestal 101A of the main circuit board 100A.

The guiding part 301A of the heat dispersing unit 300A extends to the chip component 200A through the heat dispersing cavity 102A. The size of the guiding part 301A is smaller than the chip component 200A. When the heat dispersing unit 300A is attached on the main circuit board 100A by means of the second attaching layer 402A, the guiding part 301A of the heat dispersing unit 300A spacingly penetrates the heat dispersing cavity 102A. In other words, the diameter of the guiding part 301A of the heat dispersing unit 300A is smaller than the cavity of the heat dispersing cavity 102A, so that it forms a designated gap between the guiding part 301A of the heat dispersing unit 300A and the inner wall of the heat dispersing cavity 102A, which helps the welding operation for the chip component 200A and the heat dispersing unit 300A, such that the structure of the circuit board device becomes more stable. Here, the height of the guiding part 301A of the heat dispersing unit 300A is higher than the heat dispersing cavity 102A, which makes the heat dispersing unit 300A closer to the chip component 200A, which helps to shorten the heat conduction distance between the chip component 200A and the heat dispersing cavity 102A. Besides, because the chip component 200A is symmetrically butt coupled with the pedestal 101A, the shortened heat conduction distance between the chip component 200A and the heat dispersing cavity 102A will not cause instability of the welding and soldering or failure of positioning.

The first attaching surface 4011A is formed on the guiding part 301A of the heat dispersing unit 300A and the upper surface of the circuit board 101A. It can tightly butt couple the chip component 200A with the heat dispersing unit 300A through welding and soldering. The soldering paste of the first attaching layer 401A will opposite stretch the chip component 200A when reflow, so that the chip component 200A cannot laterally move or make one direction deviation, so as to effectively reduce the deviation of the chip component 200A.

In other words, in the first attaching layer 401A, the chip component 200A is symmetrically butt coupled with the pedestal 101A of the main circuit board 100A and the heat dispersing unit 300A, so as to decrease the soldering deviation of the chip component 200A.

The pedestal 101A of the main circuit board 100A applies flexibility circuit board, which is FPC bonding pad, as a material thereof. FPC bonding pad has great heat dissipation ability that heat can be conducted to the heat dispersing unit 300A through the FPC bonding pad. When the chip component 200A is symmetrically adhered on the pedestal 101A, the heat generated by the chip component 200A can be conducted to the heat dispersing unit 300A through the pedestal 101A. Also, the quality of reinforcement of the heat dispersing unit 300A helps to prevent the pedestal 101A formed by the FPC bonding pad from being distorted because of high temperature and to reinforce the hardness of the pedestal 101A. The pedestal 101A designed with the symmetrical FPC bonding pad is able to decrease the uncontrollability of the stretching of the reflowed soldering paste, which effectively solves the heat dissipation issue of the chip component 200A and decreases the deviation of the attachment of the chip component 200A, so as to ensure favorable degree of parallelism of the chip component 200A and the pedestal 101A.

Because when the laser emitter on the chip component 200A is functioning, it requires heavy current, the chip component 200A and the pedestal 101A of the main circuit board 100A are electrically conducted. Preferably, the chip component 200A contains positive charge, while the pedestal 101A, that is the FPC bonding pad 200A, contains negative charge. Then the FPC cathode bonding pad and the chip component 200A are electrically conducted.

Figure 30B:
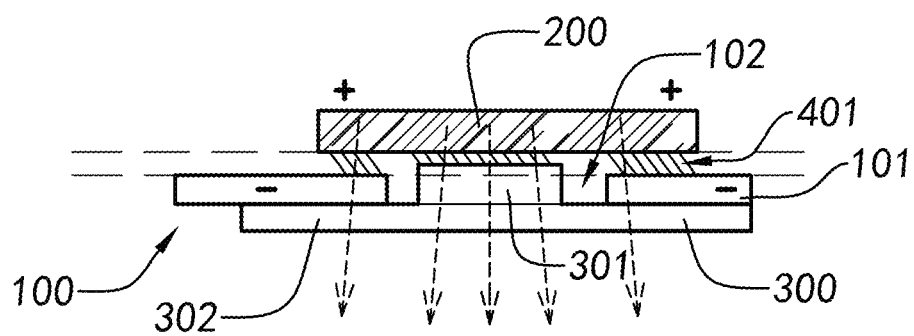
FIG. 30B is a perspective view of the heat radiation of the above first alternative according to the above preferred embodiment of the present invention.
Figure 31:
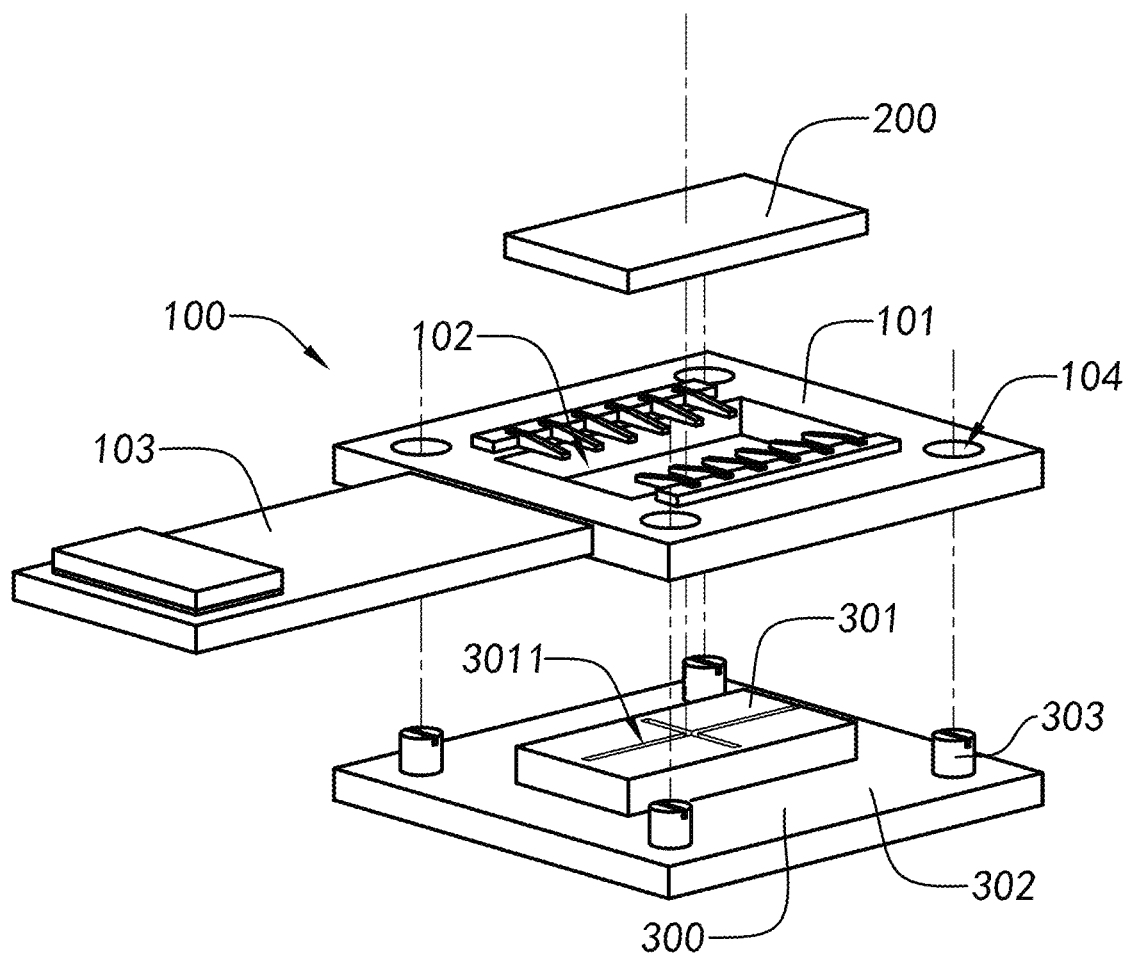
FIG. 31 is an exploded view of the structure of a second alternative according to the above preferred embodiment of the present invention.

FIG. 30B illustrated the heat dissipation process of the heat-removable circuit board device. The chip component 200A is aligned with the heat dispersing cavity 102A of the pedestal 101A and is parallel towards the heat dispersing unit 300A and the pedestal 101A. When the chip component 200A generates heat, the heat will be symmetrically transferred to the butt coupled heat dispersing unit 300A and the pedestal 101A through the tin solder layer of the first attaching layer 401A. The pedestal 101A and the guiding part 301A of the heat dispersing unit 300A will transfer the heat to the expanded extending part 302A of the heat dispersing unit 300A. Here, the heat transferred from the guiding part 301A is radially transferred to the extending part 302A. The extending part 302A will rapidly transfer the heat to the outside, which is to transfer the heat to the connected external heat dissipating device. This helps to promptly reduce the temperature of the chip component 200A. Also, the chip component 200A is symmetrically welded and soldered with the pedestal 101A and the heat dispersing unit 300A, so that the degree of parallelism between the chip component 200A and the FPC bonding pad pedestal 101A are high and there is no tilt. Besides, the reinforcement of the pedestal 101A by the extending part 302A of the heat dispersing unit 300A shows no obvious distortion. Therefore, the problem of tilt deviation of the attachment causing by the welding and soldering process of the chip component 200A has been effectively solved.

Because the area of the guiding part 301A of the heat dispersing unit 300A is smaller than the extending part 302A, when the heat is transmitted from the guiding part 301A to the extending part 302A, along with the increase of the area of the extending part 302A, the heat will not only disperse outward, but be radially conducted from the center of the extending part 302A to the periphery of the extending part 302A. Such design helps to enlarge the area to share heat conduction and reduces the overall volume of the heat dispersing unit. As the butt couple area between the chip component 200A and the guiding part 301A is decreased, the overall mass of the circuit board device A can be reduced.

FIGS. 31-33B illustrated a second alternative of the heat-removable circuit board device, wherein the chip component 200B is symmetrically attached to the heat dispersing unit 300B. The chip component 200B is symmetrically butt coupled with the guiding part 301B of the heat dispersing unit 300B by welding and soldering. Here, the guiding part 301B of the heat dispersing unit 300B has a recess 3011B for symmetrically separating the guiding part 301B of the heat dispersing unit 300B, so as to make the guiding part 301B a symmetrical bonding pad. When the chip component 200B is symmetrically welded and soldered on the guiding part 301B, the symmetrically separated structure of the guiding part 301B helps on the deviation of the chip component 200B when the soldering paste reflows, which effectively prevents the side movement tilt of the chip component 200B and remains good degree of parallel between the chip component 200B and the heat dispersing unit 300B and the circuit board 101B.

In other words, in the first attaching layer 401B, the chip component 200B is symmetrically butt coupled with the pedestal 101B of the main circuit board 100B and the heat dispersing unit 300B, so as to decrease the soldering deviation of the chip component 200B. The recess 3011B is formed on the guiding part 301B of the heat dispersing unit 300B with a symmetrically shape so as for the chip component 200B to be symmetrically welded and soldered on the guiding part 301B of the heat dispersing unit 300B.

The recess 3011B can be a cruciform structure, chiasma type structure, ladder-type structure, etc., for providing a symmetrical bonding pad type first attaching surface 4011B for the guiding part 301B of the heat dispersing unit 300B. The area of the chip component 200B and the area of the heat dispersing cavity 102B of the pedestal 101B can be the same, so when the chip component 200B is stacked on the heat dispersing cavity 102B, the chip component 200B can cover the heat dispersing cavity 102B and symmetrically be attached on the bonding pad region of the guiding part 301B in the heat dispersing cavity 102B. Rather, it does not have to extend the bonding pad region to the pedestal 101B around the heat dispersing cavity 102B. Therefore, the welding operation of the heat dispersing unit 300B and the chip component 200B can be easier and the application range of the heat dispersing unit 300B can be expanded. Even the material of the pedestal 101B of the circuit board can hardly conduct the heat, the heat can also be conducted by symmetrically butt coupling the heat dispersing unit 300B with the chip component 200B, which not only effectively decreases the deviation of the chip component 200B and its laser emitter, but also increases the heat dispersing area. When the butt coupling area of the chip component 200B and the guiding part 301B of the heat dispersing unit 300B is increased, the heat conduction rate will also be increased.

The first attaching surface 4011B is formed on the guiding part 301B of the heat dispersing unit 300B. It can tightly butt couple the chip component 200B with the heat dispersing unit 300B through having the recess 3011B symmetrically divide the guiding part 301B as well as symmetrically welding and soldering the chip component 200B on the heat dispersing unit 300B. Therefore, when soldering paste of the first attaching layer 401B reflow, it will opposite stretch the chip component 200B, so that the chip component 200B cannot laterally move or make one direction deviation, which reduces the uncontrollability of the reflowing soldering of the soldering paste and effectively decreases the deviation of the chip component 200B.

Figure 32:
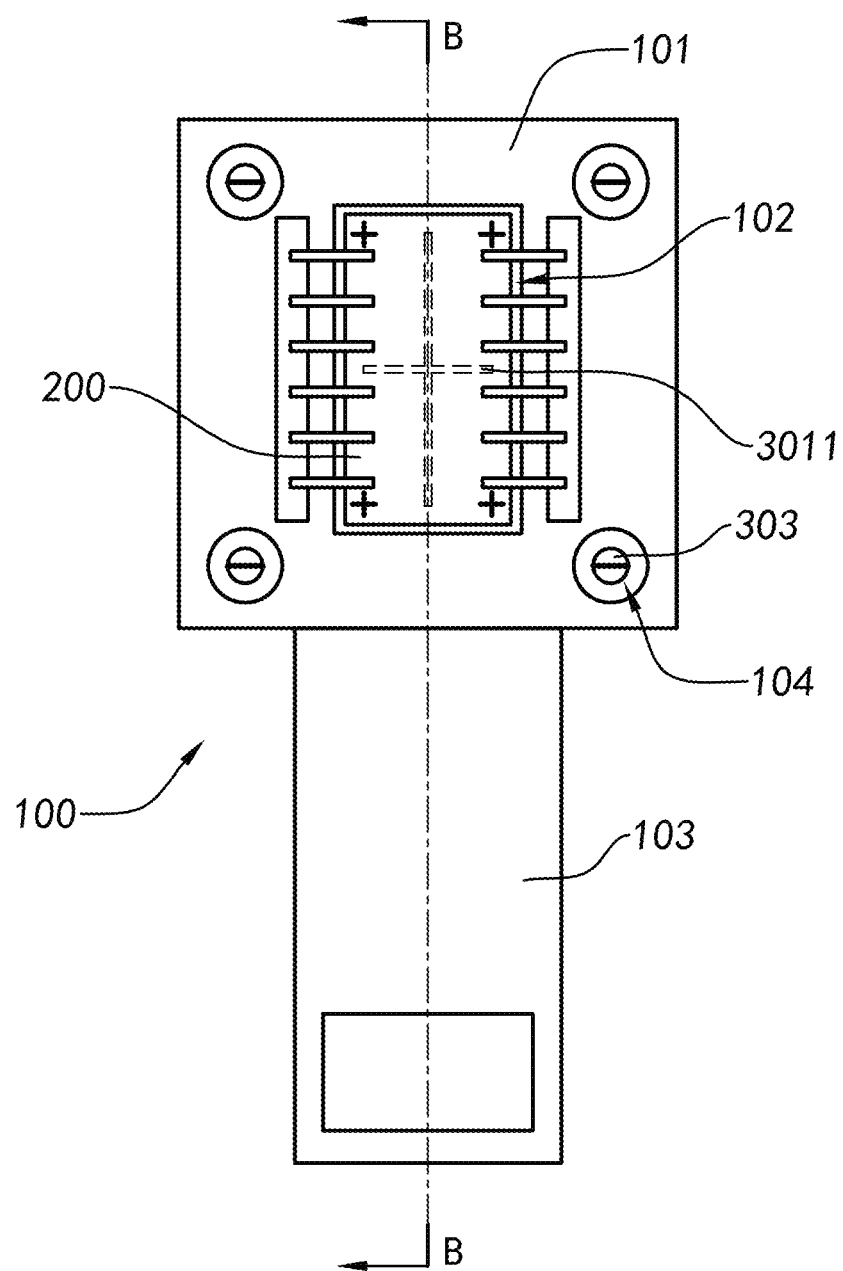
FIG. 32 is an exploded view of the structure of the above second alternative according to the above preferred embodiment of the present invention.
Figure 33A:
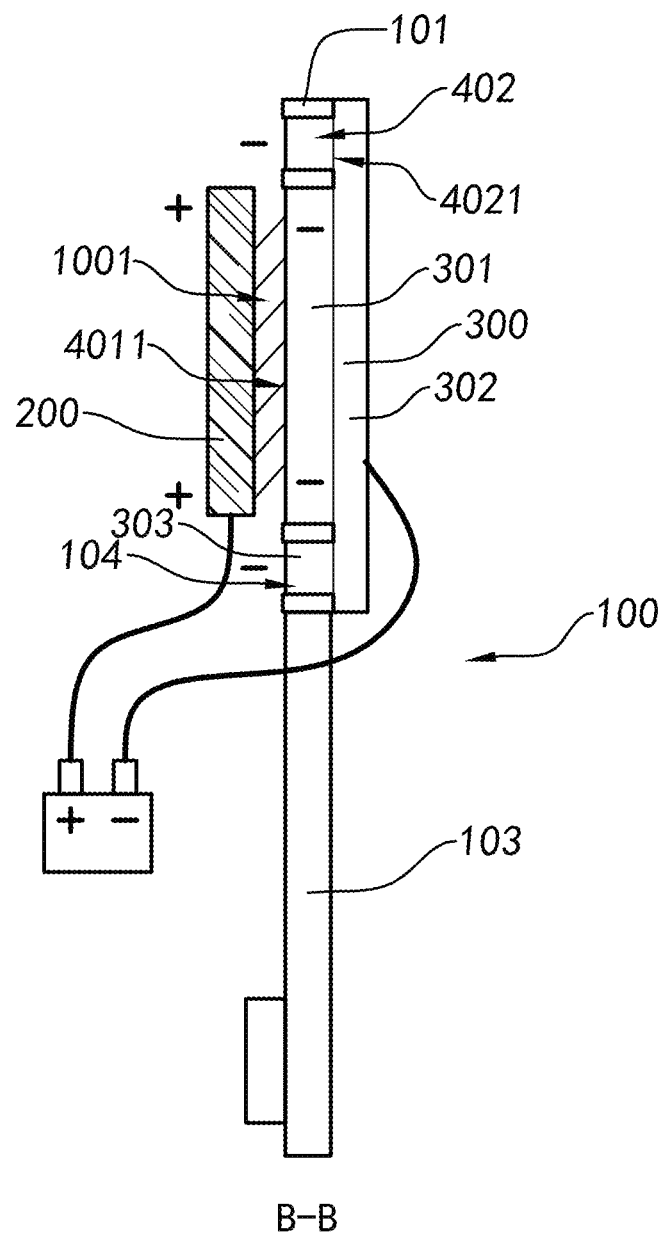
FIG. 33A is a sectional view of FIG. 32 according to the second alternative of the above preferred embodiment of the present invention along B-B' direction.

FIG. 33A is the sectional view of FIG. 32 along the B-B' direction. Because when the laser emitter on the chip component 200B is working, it requires great electric current support. The chip component 200B is electrically conducted with the heat dispersing unit 300B and the circuit board pedestal 101B. Preferably, the chip component 200B carries positive charge, while the heat dispersing unit 300B and the pedestal 101B carry negative charge.

The heat dispersing unit further comprises at least a protruding 303B.

Correspondingly, the pedestal 101B of the main circuit board 100B comprises at least a through hole 104B therearound. That is, a through hole bonding pad is designed on the periphery of the pedestal 101B. The protruding 303B extends from the extending part 302B of the heat dispersing unit 300B toward the through hole 104B of the pedestal 101B, so as to join the heat dispersing unit 300B and the pedestal 101B of the main circuit board 100B, which attaches the extending part 302B of the heat dispersing unit 300B to the main circuit board 100B and adheres the heat dispersing unit 300B to the pedestal 101B through the connection of the through hole 104B without using conducting resin. Because the resistance of the conducting resin is greater and the through hole bonding pad of the pedestal 101B and the chip component 200B are electrically conducted with each other, if the conducting resin is utilized to attach the heat dispersing unit 300B with the circuit board 101B, then the electric charge transfer among the chip component 200B, the pedestal 101B, and the heat dispersing unit 300B will increase the heat production and cause more energy loss, which somehow influences the timely heat conduction of the heat dispersing unit 300B.

In other words, the second attaching layer 402B employs a direct conducting layer. The direct conducting layer does not require additional glue to adhere the heat dispersing unit 300B on the main circuit board 100B. The heat dispersing unit 300B utilizes the protruding 303B around it to connect with the through hole 104B on the pedestal 101B. The extending part 302B of the heat dispersing unit 300B is tight attached on the bottom layer of the pedestal 101B, which helps to prevent the pedestal 101B of the main circuit board 100B from distortion and to avoid the issue of higher resistance of the conducting resin. The direct conducting layer uses the way of electroplating and solder fillet on the protruding 303B of the heat dispersing unit 300B to directly conduct the heat dispersing unit 300B and the bonding pad circuit of the pedestal 101B, which effectively avoid the issue of higher resistance of the conducting resin directly connected with the windowing bonding pad, so as to satisfy the heavy current demand of the chip component 200B.

The material of the protruding 303B of the heat dispersing unit 300B is selected from high thermal conductivity and high hardness materials, which can be copper or steel. Preferably, the material of the protruding 303B is steel. The height of the protruding 303B is the same with the height of the guiding part 301B and is corresponding to the depth of the through hole 104B of the pedestal 101B. The protruding 303B can be utilized to transfer the negative charge on the through hole bonding pad of the pedestal 101B to the heat dispersing unit 300B, so that the chip component 200B and the heat dispersing unit 300B are electrically conducted with each other without losing more energy. Also, it can promptly transfer the heat around the protruding 303B to the heat dispersing unit 300B, which expands the heat conduction area of the heat dispersing unit 300B.

Figure 33B:
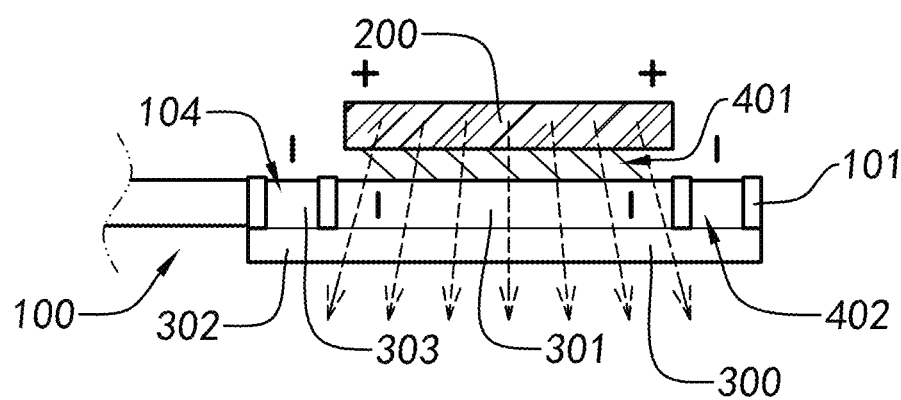
FIG. 33B is a perspective view of the heat radiation of the above second alternative according to the above preferred embodiment of the present invention.

FIG. 33B illustrated the heat dissipation process of the heat-removable circuit board device. The chip component 200B is aligned with the heat dispersing cavity 102B of the pedestal 101B and is parallel towards the guiding part 301B of the heat dispersing unit 300B. When the chip component 200B works and generates heat, the heat will be symmetrically transferred to the butt coupled heat dispersing unit 300B through the tin solder layer of the first attaching layer 401B. The pedestal 101B and the guiding part 301B of the heat dispersing unit 300B will transfer the heat to the expanded extending part 302B of the heat dispersing unit 300B. Here, the heat transferred from the guiding part 301B is radially transferred to the extending part 302B. The extending part 302B will rapidly transfer the heat to the outside, which is to transfer the heat to the connected external heat dissipating device. This helps to promptly reduce the temperature of the chip component 200B. Also, the chip component 200B and the heat dispersing unit 300B are symmetrically welded and soldered with each other, so as to effectively solve the problem of tilt deviation of the attachment causing by the welding and soldering process of the chip component 200B.

Because the area of the guiding part 301B of the heat dispersing unit 300B is smaller than the extending part 302B, when the heat is transmitted from the guiding part 301B to the extending part 302B, along with the increase of the area of the extending part 302B, the heat will not only disperse outward, but be radially conducted from the center of the extending part 302B to the periphery of the extending part 302B. Such design helps to enlarge the area to share heat conduction and reduces the overall volume of the heat dispersing unit. As the butt couple area between the chip component 200B and the guiding part 301B is decreased, the overall mass of the circuit board device can be reduced.

The heat-removable circuit board device can effectively solve the issue of the stability of great heat production of the projection devices, optimize the heat dissipation of the chip component 200B, and help to keep the evenness of the main circuit board 100B. The heat production of the chip component 200B can be dissipated timely, such that the internal temperature can be improved from 60~70° C. to 40~50° C., which working temperature achieves an acceptable range.

A heat dissipation method of heat-removable circuit board device comprises the following step: conducting the heat of the chip component 200 that is connected with the main circuit board 100 of the circuit board device the outside by means of a heat dispersing unit 300 arranged the heat dispersing cavity 102 of the pedestal 101.

Here, the method comprises the following step: conducting the heat of the chip component 200 to the guiding part 301 of the heat dispersing unit 300 through a first attaching layer 401, wherein the first attaching layer 401 is a heat conductible tin solder layer.

Here, the method further comprises the following steps:

transmitting the heat outward from the guiding part 301 of the heat dispersing unit 300 to the extending part 302 of the heat dispersing unit 300; and radially conducting the heat outward from the extending part 302 to the outside, so as to expand the area for radiating heat.

Here, the method further comprises the following step: conducting the heat of the chip component 200 to the main circuit board 100 through the first attaching layer 401, wherein the main circuit board 100 is a heat conductible flexible printed circuit.

Here, the method further comprises the following step: joining the heat dispersing unit 300 with the pedestal 101 of the main circuit board 100 by means of the protruding 303 arranged on the bonding pad and the through hole of the main circuit board 100, so as to attach the extending part 302 of the heat dispersing unit 300 to the main circuit board 100.

A manufacturing method of heat-removable circuit board device, comprising the following steps:

(o) providing a main circuit board 100, having a heat dispersing cavity 102; and (p) butt coupling a chip component 200 and a heat dispersing unit 300 with the heat dispersing cavity 102, for radiating heat for the chip component 200.

Here, the manufacturing method further comprises step (q): attaching the main circuit board 100, the chip component 200, and the heat dispersing unit 300 with at least an attaching layer 400.

Here, the manufacturing method further comprises step (r): electrically conducting the chip component 200 and the heat dispersing unit 300 and/or the main circuit board 100.

Here, the step (q) comprises the following steps:

(q.1) welding and soldering the chip component 200 and the heat dispersing unit 300 by means of a first attaching layer 401, so as to heat conductibly connect the chip component 200 with a guiding part 301 of the heat dispersing unit 300; and (q.2) attaching the heat dispersing unit 300 to the main circuit board 100 by means of a second attaching layer 402, so as to attach the extending part 302 of the heat dispersing unit 300 with the main circuit board 100, which is adapted for expanding the heat dispersing area of the heat dispersing unit 300 and reinforcing the main circuit board 100.

Here, the step (p) comprises step (p.1): symmetrically butt coupling the chip component 200 with the heat dispersing unit 300, so as to decrease the deviation generated when butt coupling the chip component 200.

Here, the step (p.1) comprises the following steps:

(p.1.1) welding and soldering the chip component 200 on the heat dispersing unit 300; and (p.1.2) symmetrically butt coupling the chip component 200 and the main circuit board 100 by welding and soldering, so as to reduce the deviation of the soldering of the chip component 200.

Here, the step (p.1) further comprises the following steps:

(p.1.3) recessing on the guiding part 301 of the heat dispersing unit for forming a symmetrical bonding pad on the heat dispersing unit 300; and (p.1.4) symmetrically butt coupling the chip component 200 and the guiding part 301 of the heat dispersing unit 300 by welding and soldering, so as to reduce the deviation of the soldering of the chip component 200.

Here, the step (q.2) comprises the following steps:

(q.2.1) correspondingly joining the protruding 303B of the heat dispersing unit 300 with the through hole 104B of the main circuit board 100; and (q.2.2) directly conducting the protruding 303B of the heat dispersing unit 300 to the bonding pad circuit of the main circuit board 100 by means of electroplating and solder fillet.

Figure 34:
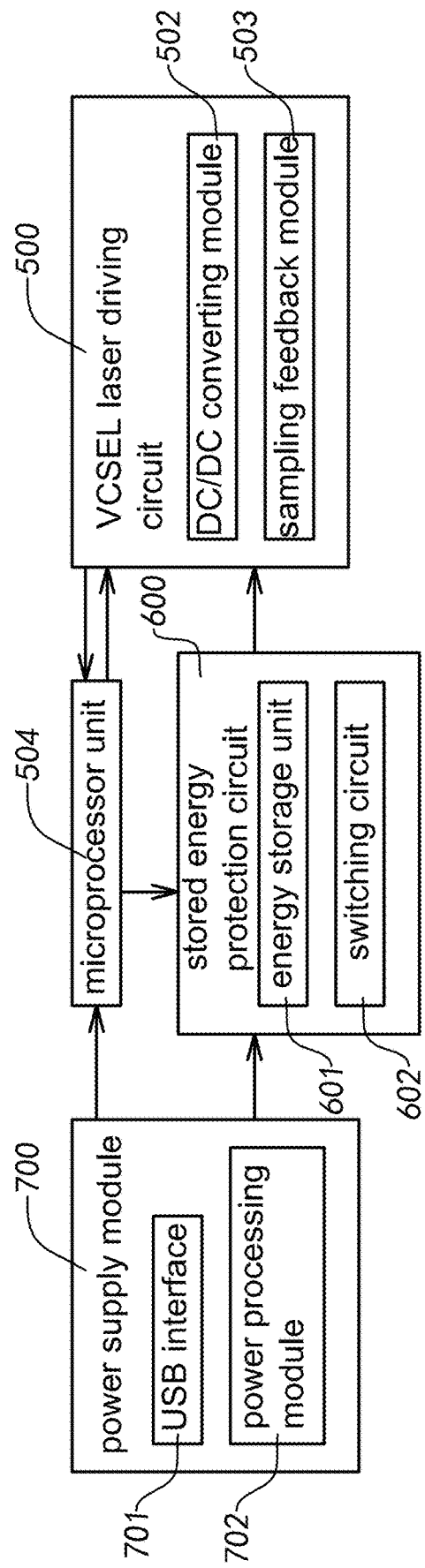
FIG. 34 is a circuit module diagram of a pulse VCSEL laser driving circuit based on USB power supply according to a preferred embodiment of the present invention.
Figure 35:
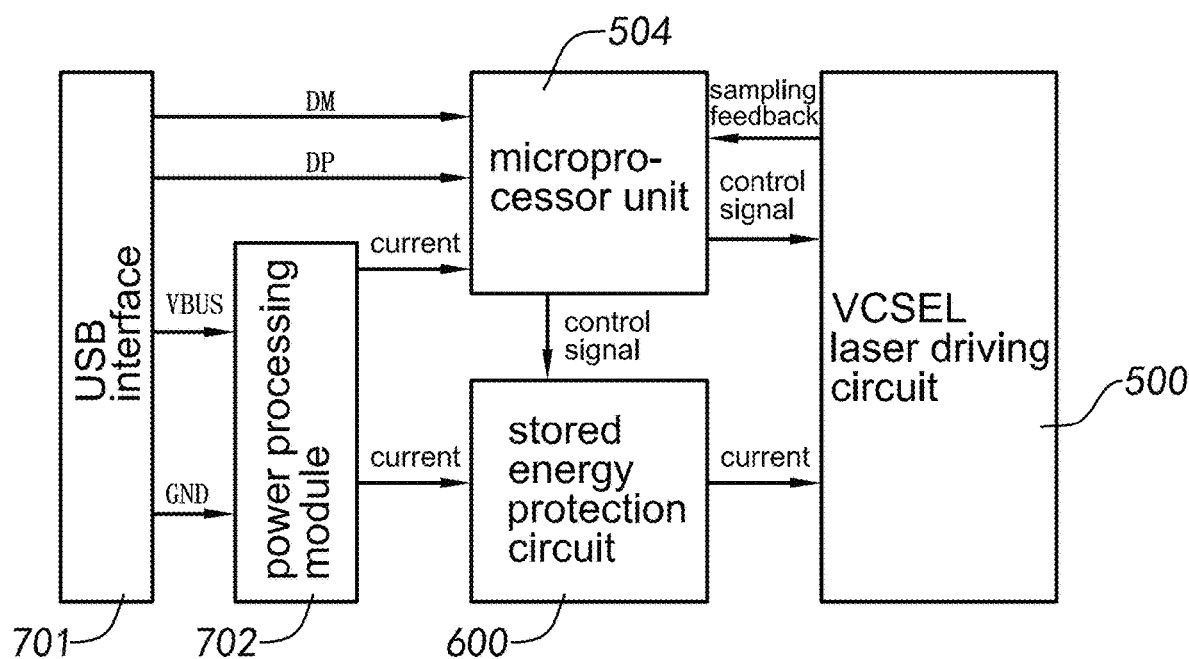
FIG. 35 is another circuit module diagram of the pulse VCSEL laser driving circuit based on USB power supply according to a preferred embodiment of the present invention.
Figure 36:
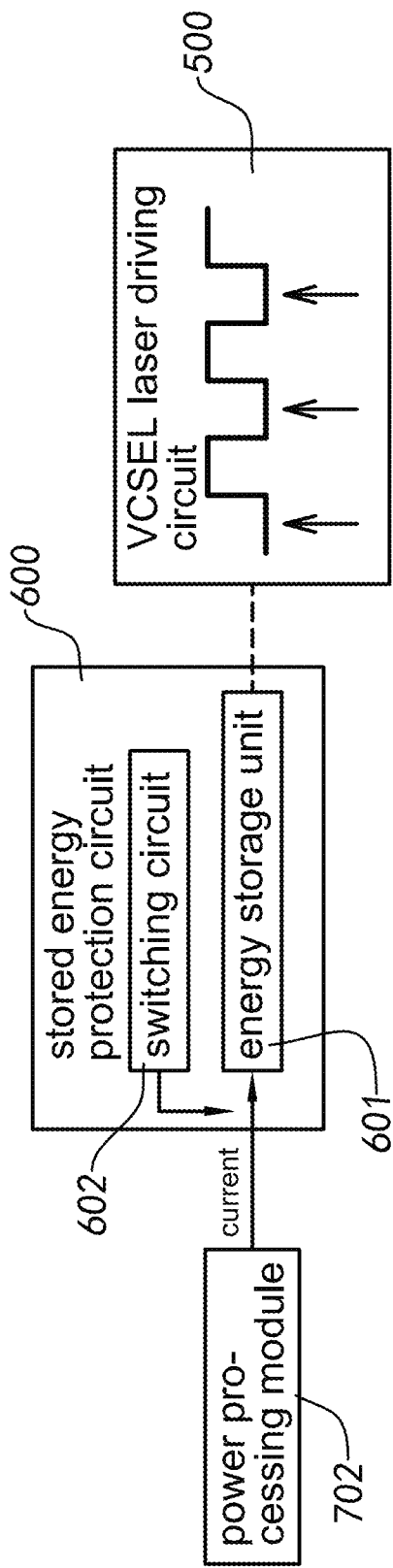
FIG. 36 is a perspective view illustrating the energy storing of the pulse VCSEL laser driving circuit based on USB power supply according to a preferred embodiment of the present invention.
Figure 37:
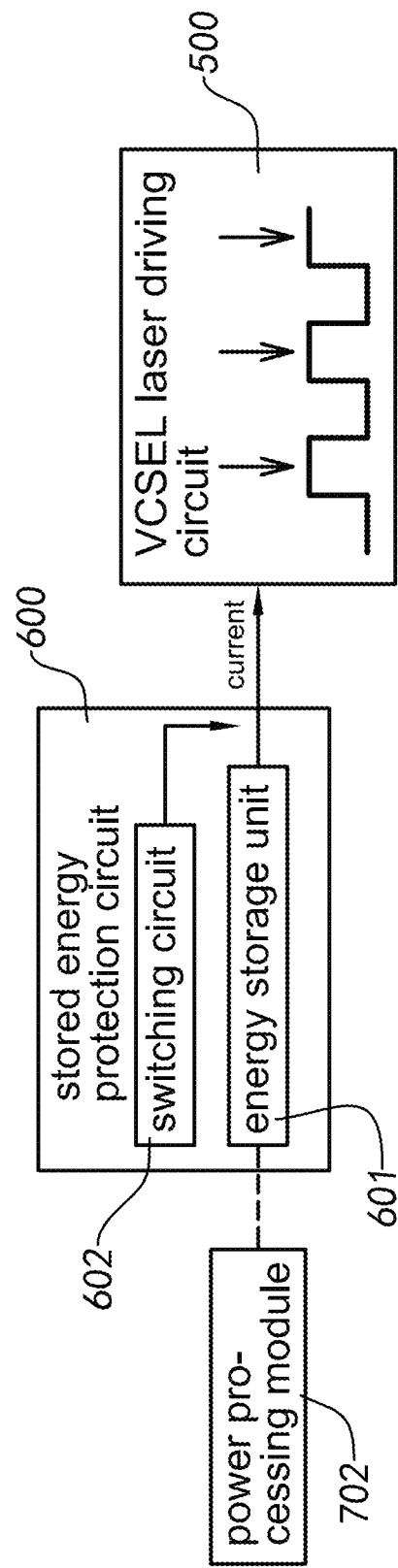
FIG. 37 is a perspective view illustrating the driving of the pulse VCSEL laser driving circuit based on USB power supply according to a preferred embodiment of the present invention.

FIGS. 34 and 35 are a circuit module diagrams of the pulse VCSEL laser driving circuit based on USB power supply according to a preferred embodiment of the present invention. The pulse VCSEL laser driving circuit based on USB power supply comprises a VCSEL laser driving circuit 500 for driving a VCSEL array, a stored energy protection circuit 600 electrically connected with the VCSEL laser driving circuit 500 for providing driving current to the VCSEL laser driving circuit 500, and a power supply module 700 electrically connected with the stored energy protection circuit 600 for providing electric power to the stored energy protection circuit 600. Those skilled in the art can understand that the pulse VCSEL laser driving circuit based on USB power supply can also be utilized in other electric devices. That is, the present invention shall not be limited in this aspect.

It is worth mentioning that when the pulse VCSEL laser driving circuit based on USB power supply 500 is applied to the electric devices, the power supply module 700 can obtain electric power from external device, so as to provide power to the stored energy protection circuit 600. Besides, the power supply module 700 can provide power to the stored energy protection circuit 600 by using integrated direct current power source on itself, so as to provide power to the VCSEL laser driving circuit 500 to drive the VCSEL laser driving circuit 500 to work. Also, another way is that the power supply module 700 can be directly connected with the original power source of the electric device, so as to provide power to the VCSEL laser driving circuit 500 via the conversion of the power supply module 700. For example, for handhold portable devices, the batteries of the handhold portable device can be integrated in the power supply module 700, so as to directly provide low voltage electric power. In other words, the pulse VCSEL laser driving circuit 500 allows low voltage power device to drive VCSEL array to work, so that a VCSEL array that had to be driven by high-power driving device can be driven under low voltage, rather than being limited by the types of input voltage. The following specifically illustrates the embodiment.

According to a preferred embodiment of the present invention, the power supply module 700 comprises a USB interface 701 and a power processing module 702 electrically connected with the USB interface 701. The USB interface 701 is for electric connecting with external devices. In other words, the USB interface 701 is able to be electrically connected with external device that provides power through connection wire, so as to obtain the electric power for providing the stored energy protection circuit 600.

According to basic knowledge of electricity, different electrical elements or electric devices have different electricity parameters, such as rated working voltage, rated operating current, etc. If various electrical elements or electric devices are to be connected with the same stage of circuit, they have to meet the same voltage class, so as to ensure that every electrical element works normally. According to a preferred embodiment of the present invention, the power processing module 702 is to convert electric power, so as to make the input voltage of the USB interface 701 suitable for the stored energy protection circuit 600.

The power processing module 702 can be a voltage-current converter that converts the electric current or voltage leaded in from the USB interface 701 into adaptable electric current or voltage to the stored energy protection circuit 600.

It is worth mentioning that the way to lead in the power source is Preferably in the form of USB interface. In addition, the driving circuit is able to not only take power source from the outside, but also have power source internally, such as having a battery module to provide power source internally, such that external power connection is not required.

According to a preferred embodiment of the present invention, the stored energy protection circuit 600 comprises an energy storage unit 601 and a switching circuit 602. The energy storage unit 601 is for storing electric power and providing electric power to the VCSEL laser driving circuit 500. The switching circuit 602 that controls the make-and-break of the circuit between the energy storage unit 601 and the power processing module 702 and the VCSEL laser driving circuit 500.

Figure 38:
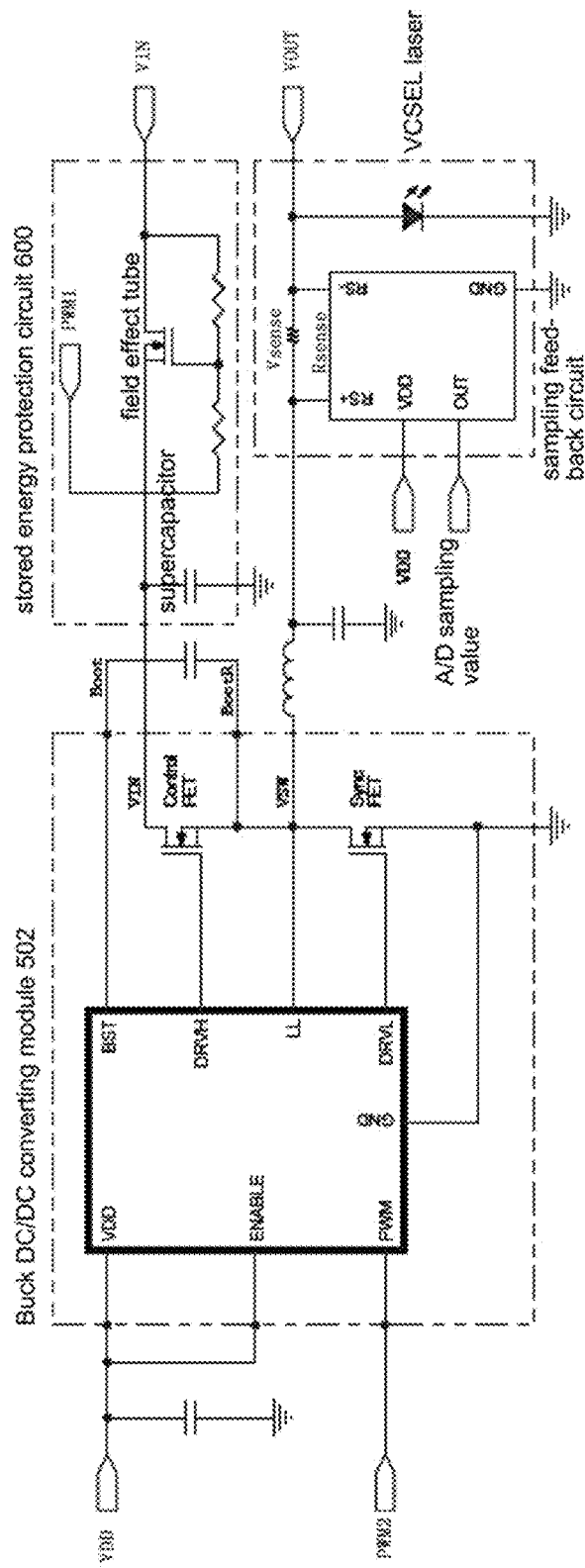
FIG. 38 is a circuit diagram of the pulse VCSEL laser driving circuit based on USB power supply according to a preferred embodiment of the present invention.

Referring to FIG. 38, the VCSEL laser driving circuit 500 based on low voltage comprises a VCSEL laser 501, wherein the VCSEL laser driving circuit 500 drives the VCSEL laser 501 to work. The VCSEL laser 501 comprises a VCSEL array. In other words, the VCSEL laser driving circuit 500 drive the VCSEL array to work.

Further, the VCSEL output drive pulse drives the VCSEL laser 501 with pulse, which changes the original direct current drive mode into pulse drive mode, so that the VCSEL array does not have to constantly stay in a constant current power on state, which, therefore, reduces the heat production of the array of the VCSEL laser 501, makes it work more stably, and increases its reliability.

When the VCSEL laser driving circuit 500 outputs high level pulse, or in other words, needs to drive the VCSEL array to work, because the VCSEL array is a high-power constant current driving component, usually, it requires special external high-power constant current circuit for the driving. Therefore, directly inputting low voltage current cannot provide enough driving energy. According to a preferred embodiment of the present invention, when the VCSEL laser driving circuit 500 outputs high level pulse, the switching circuit 602 will electrically connect the energy storage unit 601 to the VCSEL laser driving circuit 500 to provide driving power to the VCSEL laser driving circuit 500, so as to drive the VCSEL laser 501. When the VCSEL laser driving circuit 500 outputs low level pulse in the interval, the switching circuit 602 will control the energy storage unit 601 to disconnect with the VCSEL laser driving circuit 500. Here, the power processing module 702 is electrically connected with the energy storage unit 601 to recharge the energy storage unit 601.

Further, in other words, when the VCSEL laser 501 has to be driven to work, the energy storage unit 601 of the stored energy protection circuit 600 will use the stored power to provide sufficient driving energy to the VCSEL laser driving circuit 500, so as to have the VCSEL laser driving circuit 500 to drive the laser to work. When the VCSEL laser 501 is in the low level interval of the pulses, the energy storage unit 601 of the stored energy protection circuit 600 will store the power that was leaded in from the USB interface 701 and converted by the power processing module 702 for the functioning of the VCSEL laser driving circuit 500. The make-and-break of the circuit between the energy storage unit 601 and the power processing module 702 and the VCSEL laser driving circuit 500 is controlled by the switching circuit 602.

Based on the above description, the low voltage electricity imported from the USB interface 701 via the stored energy protection circuit indirectly provide satisfied electric power to drive the VCSEL laser driving circuit 500 to function, such that the low voltage leaded in from the USB interface 701 can drive the VCSEL laser driving circuit 500 to work, so as to drive the VCSEL laser 501 to work, which solved the issue that the VCSEL laser 501 can be driven to work with low voltage.

Further, electric power storage issue has to be solved. According to an embodiment of the present invention, the energy storage unit 601 comprises at least a supercapacitor for storing electric power. The switching circuit 602 comprises a field effect tube. Referring to FIG. 38, the supercapacitor is electrically connected with the stored energy protection circuit 600, wherein the field effect tube is also electrically connected with the stored energy protection circuit 600.

Furthermore, the VCSEL laser driving circuit 500 applies dual-output Pulse Width Modulation (PWM) pulse, which are respectively marked as PWM1 and PWM2, as FIG. 38 illustrated. A PMW1 pulse is output from the stored energy protection circuit 600. When the PMW1 pulse output by the stored energy protection circuit 600 is in the low level pulse interval, the field effect tube of the stored energy protection circuit 600 will connect the power processing module 702 to the supercapacitor. That is to say, the field effect tube will connect the external power source of the USB interface 701 to the supercapacitor, referring to FIG. 38. Here, VIN is the voltage leaded into the stored energy protection circuit 600, which is also the voltage that was converted with the power processing module 702 and input from the USB interface. The voltage VIN is leaded into the supercapacitor through the USB interface 701. When the PMW1 pulse output by the stored energy protection circuit 600 is in high level, the field effect tube of the stored energy protection circuit 600 will disconnect the power processing module 702 from the supercapacitor. The supercapacitor is connected with the VCSEL laser driving circuit 500, so the supercapacitor will fast discharge to provide driving power to the VCSEL laser driving circuit 500.

According to a preferred embodiment of the present invention, referring to FIG. 38, the pulse VCSEL laser driving circuit based on USB power supply 500 further comprises a microprocessor unit 504 to provide control signals to the stored energy protection circuit and the VCSEL laser driving circuit 500. The microprocessor unit 504 is signally connected with the USB interface 701. The microprocessor unit 504 is electrically connected with the power processing module 702. The microprocessor unit 504 is signally connected with the stored energy protection circuit 600 and the VCSEL laser driving circuit 500.

The VCSEL laser driving circuit 500 comprises a DC/DC converting module 502 and a sampling feedback module 503. The DC/DC power supply module 502 is to convert the power input from the energy storage unit 601 of the stored energy protection circuit 600. The sampling feedback module 503 is to feedback the information of the VCSEL laser driving circuit 500 to the microprocessor unit 504.

The other one, the PWM2 pulse, is arranged on the DC/DC converting module 502 of the VCSEL laser driving circuit 500. The coordination of the PWM1 pulse and the PWM2 pulse forms the dual-pulse output, which controls the streaking of the drive pulse at the falling edge.

The electric power leaded in via the USB interface 701 is processed by the power processing module and split into two. One is leaded in the microprocessor unit 504 to provide the microprocessor unit 504 operation energy. The other is leaded in the stored energy protection circuit 600 for providing storing energy for the energy storage unit 601. The microprocessor unit uses working power provided by the power processing module 702, receives signal input from the USB interface 701, provides control signal to the stored energy protection circuit 600 and the VCSEL laser driving circuit 500, and receives sampling feedback returning from the VCSEL laser driving circuit for the microprocessor unit 504 to further control the operation of the stored energy protection circuit 600.

Specifically, when the VCSEL laser 501 is in the pulse period, that is, during the pulse width time, the microprocessor unit 504 will provide control signal to the stored energy protection circuit 600 to disconnect the input current of the power processing module 702 by controlling the field effect tube, so as to protect the system from instability or failure caused by the low working voltage of the system decreased by the VCSEL laser 501 during the heavy current period. At this moment, the microprocessor unit 504 will provide control signal to the switching circuit 602 of the stored energy protection circuit 600 to connect the energy storage unit 601 of the stored energy protection circuit 600 and the VCSEL laser driving circuit 500, and to disconnect the energy storage unit 601 of the stored energy protection circuit from the power processing module 702, to let the electric power instantly released by the high-capacity supercapacitor of the stored energy protection circuit to provide the input current for the VCSEL laser driving circuit 500.

During the pulse interval of the VCSEL laser 501, the microprocessor unit 504 will provide control signal to the stored energy protection circuit 600 to switch on the input current of the power processing module 702 by controlling the field effect tube of the stored energy protection circuit 600. At this moment, the energy storage unit 601 is disconnected from the VCSEL laser driving circuit 500. The supercapacitor of the energy storage unit 601 of the stored energy protection circuit 600 is charged by obtaining electric power from the power processing module 702.

Based on the basic characteristics of supercapacitors, it is understandable that the electric capacity of a supercapacitor is great and because of the special structure thereof, it has high energy density to provide very heavy discharging current. For example, the rated discharging current of a 2700 F supercapacitor is not lower than 950 A and the peak discharging current thereof can reach 1680 A, while a regular accumulator or dry cell cannot have such high discharging current and some high discharging current accumulator will have much shorter life if working under such high current. A supercapacitor can be quick charged in tens of seconds to a few minutes, but such short time charging is particularly dangerous for accumulators. According to a preferred embodiment of the present invention, characteristics of supercapacitor are well utilized that the high-capacity supercapacitor is fast charged in the pulse intervals. While in the pulse width, the fast discharge and high energy density characteristics of the supercapacitor are used to fast discharge to the VCSEL laser driving circuit, which solved the issue of heavy current flow of the constant current during millisecond pulse.

According to a preferred embodiment of the present invention, the DC/DC converting module 502 of the VCSEL laser driving circuit 500 applies heavy current Synchronous Rectiner of Buck DC/DC converting module 502. The heavy current Synchronous Rectiner of Buck DC/DC converting module 502 is widely used in portable devices because of its high converting efficiency and high integration level.

It is worth mentioning that the control method of applying the PWM current peak on the VCSEL laser driving circuit 500 greatly increase the transient response of the power load. According to a preferred embodiment of the present invention, the PWM control method of the Buck DC/DC converting module 502 is to achieve the adjustment of the output voltage through controlling the duty ratio of the PWM pulse signal under a fixed frequency. The sampling feedback circuit collects the current of the VCSEL laser 501, when it is working, in a real time manner, to feedback to the microprocessor unit 504 to adjust the duty ratio of the PWM control signal, so as to adjust the output voltage and ensure the constant current of the VCSEL laser work normally.

It is also worth mentioning that according to a preferred embodiment of the present invention, the VCSEL laser driving circuit 500 is designed for adapting to the VCSEL laser 501 and the specific working conditions that the basic technical criteria of the VCSEL laser driving circuit 500 are: (1) the pulse width of output current is adjustable between 3 to 10 ms, (2) the pulse frequency of output current is adjustable between 5 to 10 hz, and (3) output driving current is adjustable constant current between 2 to 8 A. Based on the above technical criteria as well as the demands of portability, rationalization, and minimization of the system scale in technical application, the above pulse VCSEL laser driving circuit based on USB power supply 500 is employed, wherein it applies pulse interval to quick charge the high-capacity supercapacitor for storing energy and utilizes the rapid discharge feature and high energy density feature of supercapacitor during the pulse period. Because the width and frequency of the output current of the PMW pulse is adjustable, the selection of the capacity of the supercapacitor should be properly loosen. If the pulse width of the output current of the VCSEL laser driving circuit 500 is 10 ms, the frequency thereof is 10 hz, and the output current thereof is 8 A, then during a pulse cycle, the VCSEL laser 501 works for the 10 ms pulse time and the supercapacitor is charged for the remaining 90 ms pulse interval. According to the charge-discharge formula of supercapacitor: $C=I*dt/dv$, where I is the average maximum operating current, 8 A, dt is the discharging time, 10 ms, and dv is the voltage decrease, 5V, the required minimum capacity of the supercapacitor can thereby be roughly calculated. On the other hand, the charging time can also be calculated through the above theoretical formula. The switching speed of the field effect tube is extremely fast, which can reach an ns level switching speed without causing streaking of the current. Because of the above performance of the field effect tube, the field effect tube can completely satisfy the designing criteria of the VCSEL laser driving circuit 500.

It is also worth mentioning that the engineering applications of the supercapacitor and the field effect tube include to miniaturize the scale of the pulse VCSEL laser driving circuit based on USB power supply 500, so that its overall circuit volume becomes smaller and lighter, which is suitable for the applications of various electronic products, such as handhold laser projection, VCSEL array driver of 3D scanning products, and power supply module of the testing of inverse laser projection products.

Figure 39:
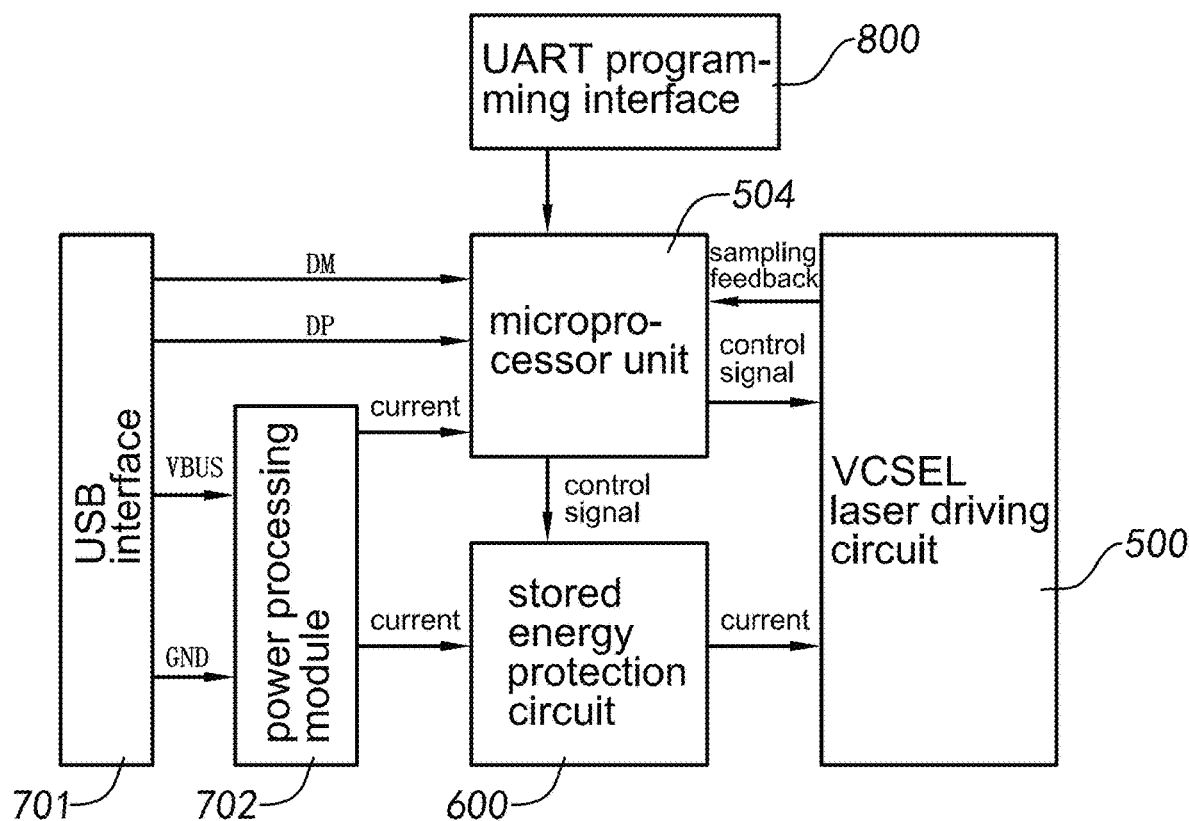
FIG. 39 is another circuit module diagram of the pulse VCSEL laser driving circuit based on USB power supply according to a preferred embodiment of the present invention.

It is also worth mentioning that, referring to FIG. 39, the pulse VCSEL laser driving circuit based on USB power supply 500 reserves a Universal Asynchronous Receiver/Transmitter (UART) programming interface 800, for accurately adjusting the magnitude of the driving current by modifying the duty ratio of the PWM drive pulse through the UART programming interface.

Figure 40:
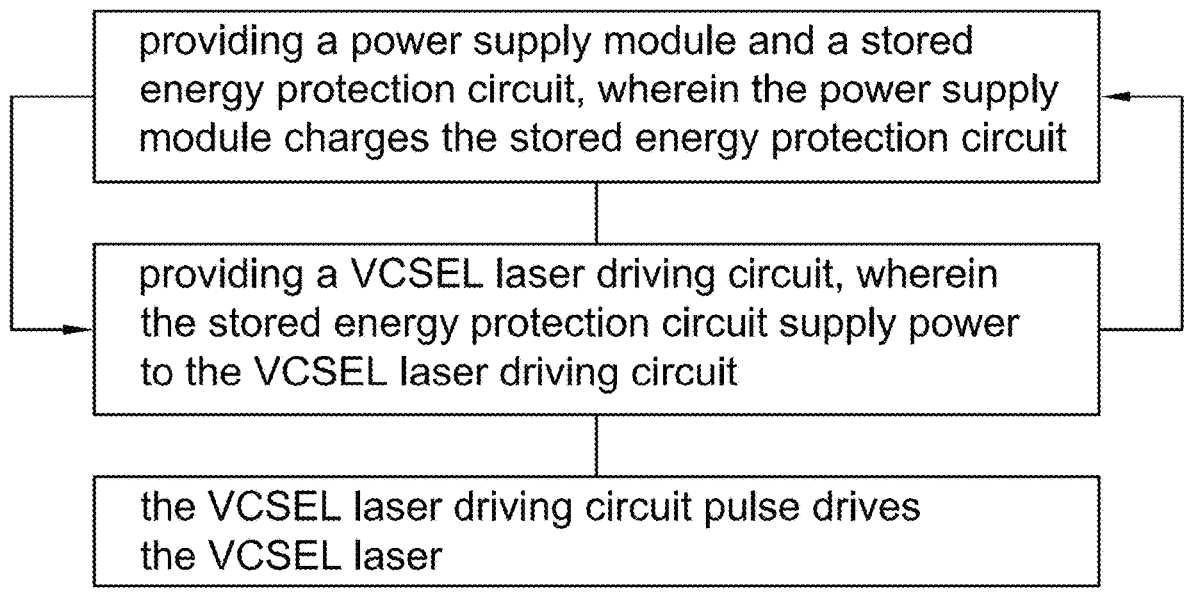
FIG. 40 is a flow diagram of the pulse VCSEL laser driving circuit based on USB power supply according to a preferred embodiment of the present invention.

Referring to FIG. 40, according to the above preferred embodiment, the present invention provides a VCSEL laser 501 drive method, which comprises the following steps:

($\alpha$) providing a power supply module 700 and a stored energy protection circuit 600, wherein the power supply module 700 charges the stored energy protection circuit 600.

($\beta$) providing a VCSEL laser driving circuit 500, wherein the stored energy protection circuit 600 supply power to the VCSEL laser driving circuit 500; and ($\gamma$) the VCSEL laser driving circuit 500 pulse drives the VCSEL laser 501.

Specially, the VCSEL laser 501 drive method is, preferably, adapted for USB power supply.

In step ($\alpha$), the power supply module 700 comprises a USB interface 701 and a power processing module 702 electrically connected with the USB interface 701.

In the step ($\alpha$), the stored energy protection circuit 600 comprises an energy storage unit 601 and a switching circuit 602 that controls the make-and-break between the energy storage unit 601 and the power supply module 700. The energy storage unit 601 comprises at least a supercapacitor. In other words, the power supply module 700 charges the supercapacitor, so as to have the supercapacitor store electric power for releasing electric power to the VCSEL laser driving circuit 500.

Because the VCSEL laser driving circuit 500 utilizes pulse to drive the VCSEL laser 501, namely, within a working cycle, there are low level pulse intervals in the high level pulse working period. In the step (B), when the output pulse of the VCSEL laser driving circuit 500 is in high level, the stored energy protection circuit will provide power to the VCSEL laser driving circuit 500, while when the output pulse of the VCSEL laser driving circuit 500 is of the low level pulse interval, the stored energy protection circuit 600 will stop providing power to the VCSEL laser driving circuit 500.

Specially, in the step ($\beta$), when the output pulse of the VCSEL laser driving circuit 500 is at high level, the supercapacitor will supply power to the VCSEL laser driving circuit, while when the output pulse of the VCSEL laser driving circuit 500 is at low level pulse interval, the supercapacitor will stop supplying power to the VCSEL laser driving circuit and the power supply module 700 will charge the supercapacitor.

Preferably, the switch circuit 602 comprises a field effect tube that controls the make-and-break between the supercapacitor and the power supply module 700 and the VCSEL laser driving circuit 500.

Preferably, the VCSEL laser driving circuit 500 utilizes dual PWM pulse output to control the streaking of the PWM pulse at the falling edge.

It is worth mentioning that a projector is a display device for displaying big screen. The imaging principle of projector is to convert the illuminating beam generated by the light source module into image light beam(s) through a light valve and then project the image light beam onto a screen or wall surface through a lens to form the image.

A basic task of computer vision is to calculate the geometric information of a object in a three-dimensional space with a image information captured by a camera, and then to reconstruct and identify the object. The calibration process of the camera is to determine the geometric and optical parameters of the camera and the position of the camera relative to the world coordinate system. The accuracy degree of the calibration will directly affect the accuracy of the computer vision.

In the application of machine vision, there are always issues like determining the relations between the spatial position of the object and the position on the image on the screen. The process of solving the relations between the object and the image is called calibration of the camera, which are also the parameters of the camera, comprising the internal parameter K and rotation matrix R, translation matrix T, etc. of the external parameter.

If the internal parameters of the camera is determined, both the internal and external parameters thereof can be solved by utilizing coordinates of a plurality of known object points and image points.

Figure 41:
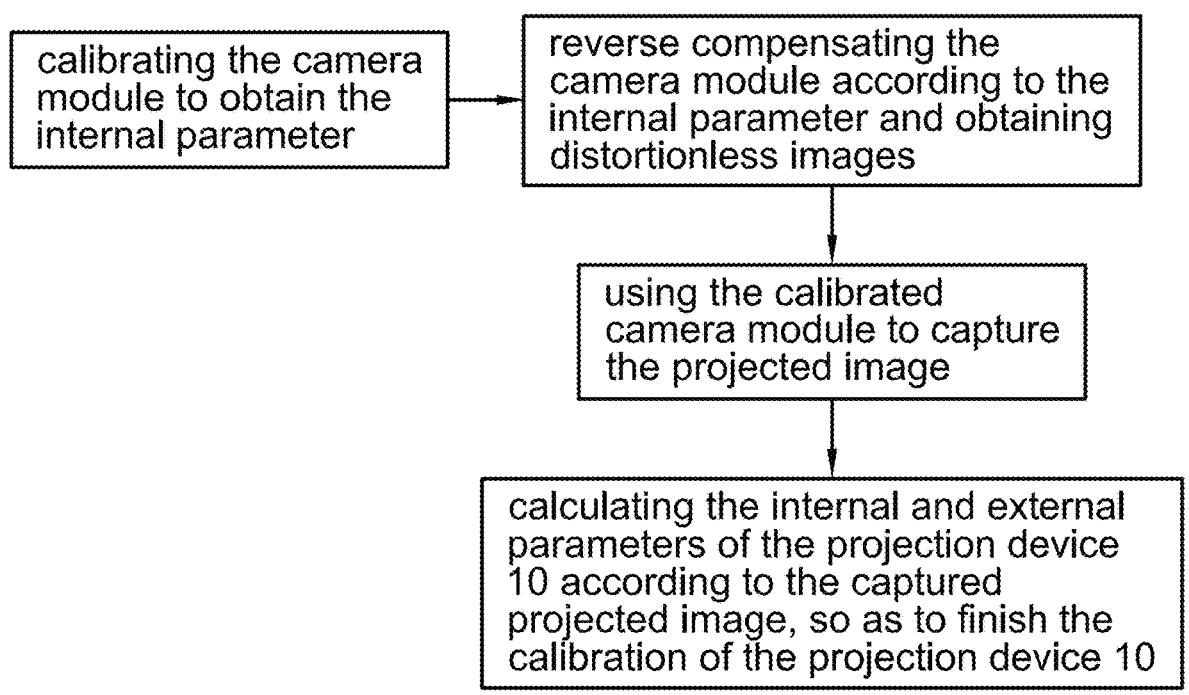
FIG. 41 is a flow diagram of calibrating the projection device according to a preferred embodiment of the present invention.

Currently, the calibration technology for camera module is mostly mature and there are many camera module calibration methods. In the present invention, the projection calibration is to consider the projection device 10 as a reverse camera module to conduct the calibration for the internal and external parameters thereof. That is, it also obtains the projected image with a coordinate calibrated camera module, so as to calculate the internal and external parameters of the projection device 10, so as to achieve the calibration for the projection device 10. Referring to FIG. 41, the specific process is as follows:

(1) calibrating the camera module to obtain the internal parameter;

(2) reverse compensating the camera module according to the internal parameter and obtaining distortionless images;

(3) using the calibrated camera module to capture the projected image;

(4) calculating the internal and external parameters of the projection device 10 according to the captured projected image, so as to finish the calibration of the projection device 10.

In the step (1), after the internal parameter of the camera module is obtained, the external parameter of the camera module can also be obtained, so as to achieve the calibration of the camera module, which facilitates the subsequent anti-distortion rectification of the image captured by the camera module. Here, there are many camera module calibration methods, comprising traditional calibration method, automatic vision calibration method, and self-calibration method.

Traditional calibration method comprises Direct Linear Transformation (DLT) method, Radial Alignment Constraint (RAC) method, and simple calibration method. Here, the RAC method uses radial consistency constraints to solve and determine the parameter(s) of the camera. The parameters of the camera, besides horizontal movement in the optic axis direction, can all be solved and determined with linear solution of the equation. Hence, the solving process becomes easier and shorter, and the results of the parameter becomes more accurate.

The active vision calibration for the internal parameters and external parameters of a camera is to put the camera on a freely movable platform and to obtain the parameters of the camera that has conducted special movements on the freely movable platform. At the same time, a plurality of images are captured when the camera was conducting the special movements. Then the images and the parameters of the camera conducting the special movements are utilized to determine the internal parameters and external parameters of the camera.

The self-calibration methods are to only use the images of the surrounding environment shot by the camera and the matching and corresponding relations between the images to calibrate the camera. Nowadays, the self-calibration techniques of the camera can roughly be classified into the following types: using the characters of epipolar transformation of absolute conic to ensure the Kruppa equation to self-calibrate the camera, stratified gradually calibration, self-calibration based on quadric method, self-calibration based on spatial geometric constraints. These techniques can all determine the internal parameters and external parameters of a camera.

The present invention can apply any of the above or other method to obtain the internal and external parameters of the camera module, so as to further achieve the calibration of the camera module. Therefore, for the present invention, any calibration method that can implement the calibration of the camera module will make.

Figure 42A:
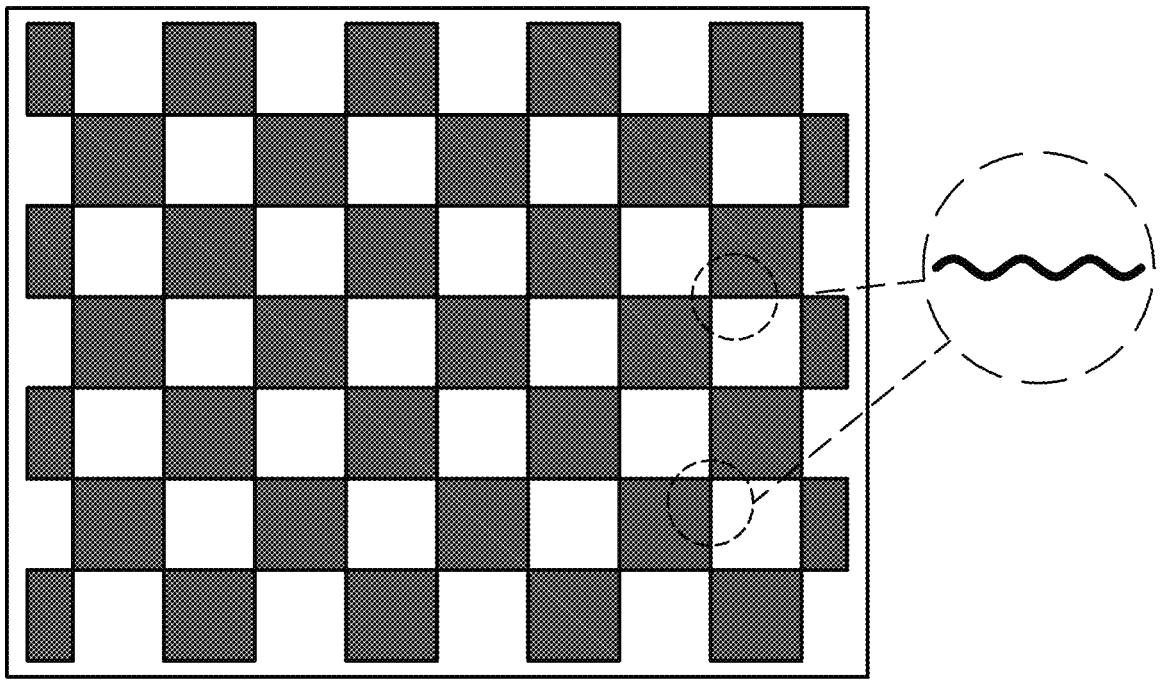
FIG. 42A and FIG. 42B are perspective views of the shot picture of a preferred embodiment according to the present invention respectively before and after the compensation.
Figure 42B:
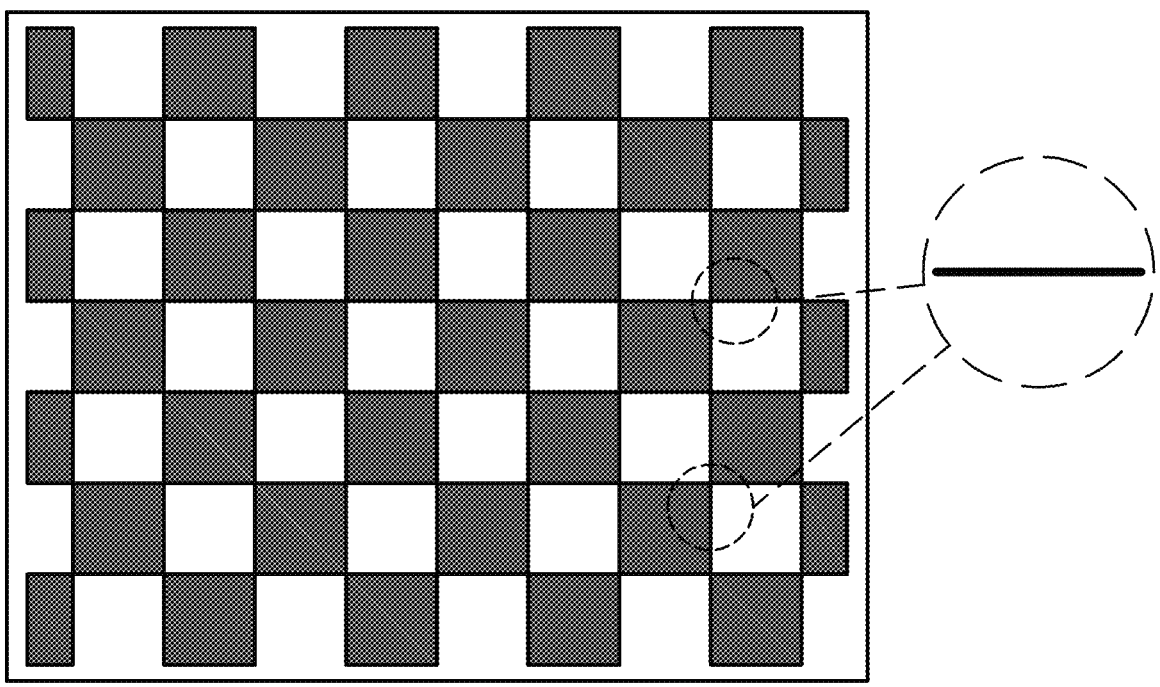

In the step (2), the internal parameter is utilized for the reverse compensation of the camera module and the anti-distortion rectification of the image captured by the camera module, so as to obtain distortionless image(s) and ensure that the images captured by the compensated camera module will no longer carry distortion caused by the camera module. FIGS. 42A and 42B refer to the images before and after the compensation.

In the step (3) and step (4), after the camera module is loaded with the compensation, the calibrated camera module is utilized to capture the projected image of the projection device 10. The internal and external parameters are calculated according to the calibration method of the camera module. The obtained data is the calibration data of the projection device 10.

Through the above method, the present invention achieved the obtaining of the internal and external parameters of the projection device 10 and achieve the calibration of the projection device 10, which greatly enhances the decoding rate of the projected image.

Figure 43:
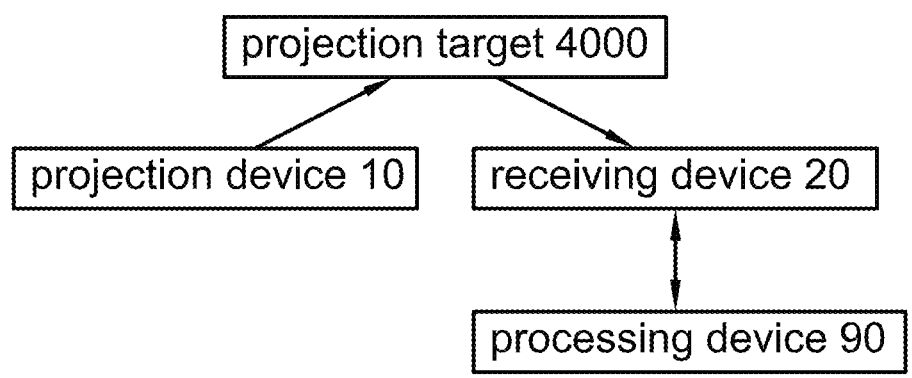
FIG. 43 is a module perspective view of a preferred embodiment according to the present invention.
Figure 44:
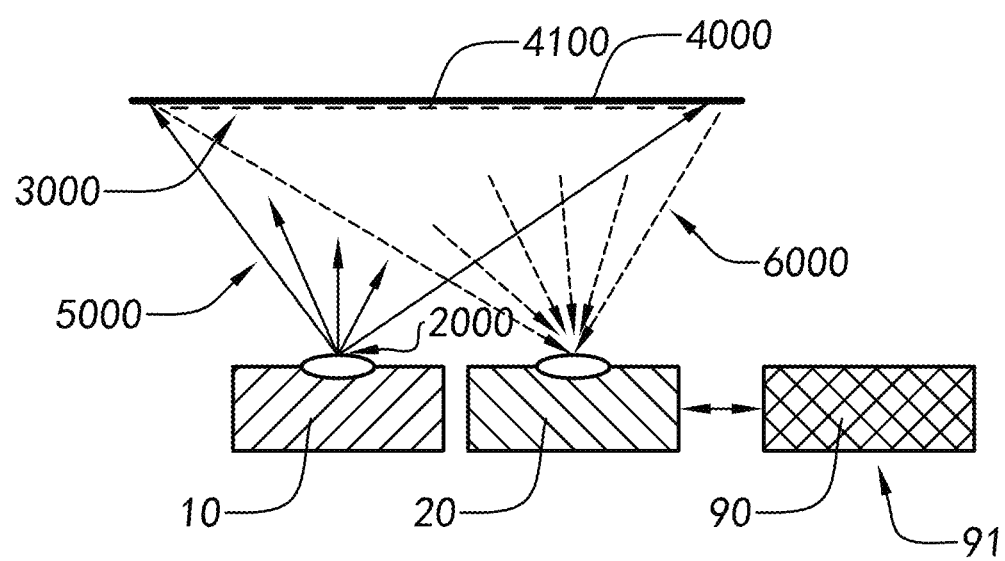
FIG. 44 is a structural perspective view of the above preferred embodiment according to the present invention.

FIGS. 43 and 44 refer to a testing device of structured light projection system. The testing device comprises a projection device 10 for projecting a projection mask 2000 to form a projected image 3000, a receiving device 20 for receiving the projected image 3000, a processing device 90 coupled with the receiving device 20 to automatically process the projected image 3000 transmitted from the receiving device 20 to obtain objective test result, and a projection target 4000 opposite to the projection device 10 and the receiving device 20, so as for the projection device 10 to project the projection mask 2000 on a projection plane 4100 of the projection target 4000 to form the projected image 3000.

The projection device 10 projects the projected image 3000 along a projection light path 5000 onto the projection plane 4100 of the projection target 4000. Then the projected image 3000 is reflected along a reflection light path 6000 to the receiving device 20 by means of the diffused reflection of the projection plane 4100 to be received by the receiving device 20. The receiving device 20 imports the data of the projected image 3000 to the processing device 90 to obtain the performance and parameter information of the projection device 10 by identifying the projected image 3000 with a testing software 91 in the processing device 90. The testing method tests the projected image of the projection device 10 with software automatically, so as to objectively identify the test results of the projection device 10, which increases the accuracy and efficiency of the test.

Here, the receiving device 20 is a camera 21 as opposed to the projection target 4000 to shoot the projected image 3000 on the projection plane 4100. The processing device 90 is a computer processor that can test the projected image 3000 with a build-in testing software 91, so as to obtain the data of the projection device 10. The testing method automatically captures definition, defective pixel, ration calibration and decoded data on projection device 10 through different testing software 91. An easy operation contributes to provide test data needed during production process.

The projection target 4000 is a projection plane test chart the projection plane test chart has even and high diffused reflection rate to ensure the projected image 3000 on the projection target 4000 to pass the diffused reflection and be received by the receiving device 20 as well as to ensure the accuracy and reproducibility of the projected image 3000 received by the receiving device 20.

A standard relative position model is established for the receiving device 20 and the projection device 10, so as to allow the receiving device 20 to receive the image projected by the projection device 10 when the field of view coverage of the receiving device 20 is greater than the projection plane 4100 of the projection device 10, which prevents that the projected image 3000 cannot be completely received by the receiving device 20. In other words, there is a designated position between the receiving device 20 and the projection device 10. There is a designated distance for the projection plane 4100 to the projection device 10 and the receiving device 20. The projecting angle of the projection device 10 and the receiving angle of the receiving device 20 are adjusted to make the projected image 3000 projected by the projection device 10 on the projection plane 4100 be totally received by the receiving device 20 through diffused reflection when the field of view coverage of the receiving device 20 is larger than the projection plane 4100 of the projection device 10.

After the receiving device 20 captured the projected image 3000, it will transmit the projected image 3000 to the processing device 90. The test result will be obtained after the processing device 90 analyzed the projected image 3000 with software, which does not require direct examination with naked eye, so as to decrease injure and hurt of human body and to greatly reduce the complexity of the test operation. Also, the performance of the affiliated projection device 10 is objectively evaluated and the data of the projected image 3000 of the projection device 10 is calculated with the software algorithm, so that the test results become more accurate, which effectively reduces the fatigue of the discrimination with naked eye and avoids the error rate caused by subjective judgement that result in quality losses of the projection device 10.

The testing method can be used for testing the clarity and definition of the projection device 10A instead of observing the projected image 3000A with naked eye, so as to make objective judgement. Here, the receiving device 20A is a photosensitive camera 21A, adapted for identifying the wavelength of the light source corresponding to the projection device 10A that projected the light, so as to break the limitation of naked eye tests and allow the testing method to not only test in the visible light wave band, but test in the wave band of non-visible light, such as infrared light, ultraviolet light, etc. Therefore, the testing method is adapted for evaluate projection devices 10A with various wave bands of light sources and is able to identify the definition and clarity of the projection mask 2000A of various wave bands.

During the automatic testing of the definition and clarity of the projection device 10A, the projection device 10A projects light of specific wave band to the projection target 4000A based on a certain direction, wherein the projection target 4000A is a projection plane test chart with even and high diffused reflection rate. According to the field of view of the projection device 10A and a fixed projection light path 5000A, the projection mask 2000A of the projection device 10A is projected onto the projection plane test chart. When the projection mask 2000A is projected onto the projection plane 4100A, it forms the projected image 3000A. After the projected image 3000A was diffusedly reflected by the projection plane test chart 41A, the reflected light formed therefrom is reflected to and received by the receiving device 20A along the reflection light path 6000A. Then the receiving device 20A transmits the received projected image 3000A to the processing device 90A, to be calculated for the resolution by the processing device 90A to objectively judge the effect of the projection device 10A. Then the definition and clarity of the projection mask 2000A of the projection device 10A can be obtained. Here, the testing software 91 of the processing device 90A is a definition and clarity testing software 91A for testing the definition and clarity of the pattern of the projection device 10A and automatically obtaining the test result, which avoids the subjective error rate caused by naked eye testing and the test limitation of visible light only. The automatic test is able to not only evaluate projection devices 10A of light sources of various wave bands, but objectively evaluate the definition and clarity of the projection mask 2000A of the projection device 10A with software(s), so as to make the evaluation results more accurate and effectively reduce the fatigue of the naked eye that directly conducts the identification works.

Because the receiving device 20A has established a standard relative position model with the projection device 10A, the field of view coverage of the photosensitive camera 21A is larger than the projecting angle of the projection device 10A, and the scope of the projection light path 5000A between the projection plane 4100A and the projection device 10A is smaller than the scope of the reflection light path 6000A between the projection plane 4100A and the receiving device 20A, therefore, the projected image 3000A formed on the projection plane 4100A can be fully reflected to the receiving device 20A and received by the receiving device 20A, so as to avoid from issues like deficient or incomplete image and to ensure the completeness of the projected image 3000A formed by the projection of the projection mask 2000A onto the projection plane 4100A.

The testing method can be used in the field of testing optics for the defective pixel of projection device 10B, which automatically determine the defective pixel for the projection mask 2000B. The projection device 10B projects the projected image 3000B to the projection target 4000B. The receiving device 20B is a camera 21B, which is utilized to capture the projected image 3000B and send the projected image 3000B to the processing device 90B. The testing software 91B, such as a defective pixel testing software 91B, of the processing device 90B automatically tests the projected image 3000B to objectively capture the defective pixel test result of the projection device 10B rather than to test the defective pixel of the projection device 10B with naked eye and microscope, so as to quickly obtain real time projected image 3000B and to greatly reduce the complexity of defective pixel testing of the projection device 10B and effectively decrease the vision losses of the workers. Besides, it also helps to enhance the test efficiency and lower the error rate.

The defective pixel testing method utilizes the receiving device 20B to capture the projected image 3000B and determines defective pixel(s) of the projected image 3000B. The receiving device 20B can quickly obtain real-time projected image 3000B, which operation is easy. After the processing device 90B obtained the projected image 3000B, the testing software 91B will convert the projected image 3000B into grayscale, so as for luminance difference extraction in the defective pixel testing for the projection device 10B. The block areas that are larger than the setting value of m*n are captured to be contrasted with the pattern of the projection mask 2000B of the projection device 10B, wherein the non-code-point type of block areas are defective pixels. In other words, the grayscale of the projection device 10B is automatically tested by comparing with the code point of projection mask 2000B, so as to objectively determine if there is defective pixel in an area. If there is an area differing from the code point, there is a defective pixel. This method effectively avoids omission of defective pixel caused by observation with naked eye. This objective and automatic testing method increases the accuracy of the defective pixel examination of the projection device 10B.

Figure 45A:
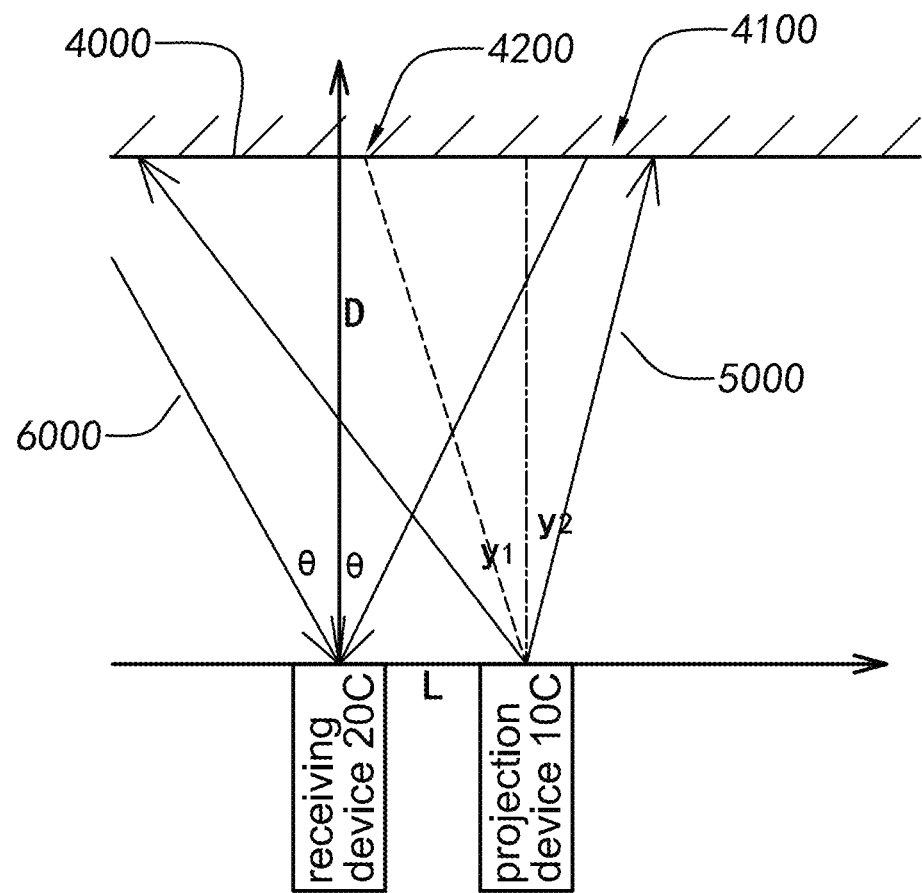
FIG. 45A is a perspective view of the structure for the calibration test of the above preferred embodiment according to the present invention.
Figure 45B:
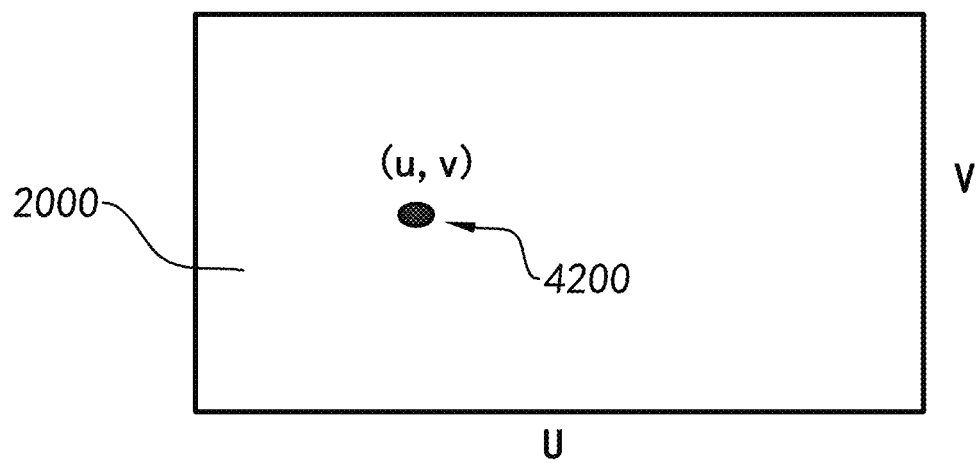
FIG. 45B is a perspective view illustrating an anchor point of the calibration test of the above preferred embodiment according to the present invention.

FIGS. 45A-45B refer to a calibration test of projection device 10C for automatically quantifying the calibration of the projection device 10C, to obtain the actual projection deviation and projecting angel of the projection device 10C. By establishing the standard relative position model for the receiving device 20C and the projection device 10C, the receiving device 20C and the projection device 10C have a designated distance therebetween, and the receiving device 20C and the projection plane 4100C of the projection target 4000C have a designated distance therebetween. A theoretical projection area of the projection device 10C is obtained through modeling and calculation, which can be combined with the picture to calculate and obtain the actual projection deviation, so as to calculate the actual projecting angel of the module.

In other words, there is an interval distance between the receiving device 20C and the projection device 10C. The distance of the optic axis between the receiving device 20C and the projection device 10C is L. There is an interval distance between the receiving device 20C and the projection plane 4100C. The distance between the receiving device 20C and the projection plane 4100C is D. The projection device 10C projects the projection mask 2000C with a designated projecting angle to the projection plane 4100C. The unilateral projecting angles of the projection device 10C are respectively y1 and y2. The projected image 3000C formed on the projection plane 4100C is received by the receiving device 20C through diffused reflection. Based on the field of view FOV of the receiving device 20C, the angle of emergence of the receiving device 20C θ=0.5*FOV.

Here, a designated theoretical projection scope is obtained based on the structure and projection distance of the projection device 10C. Then, an anchor point 4200C is arranged in the designated scope. That is, a theoretical anchor point 4200C is selected on the projection mask 2000C of the projection device 10C. The receiving device 20C imports the projected image 3000C that carries the theoretical anchor point 4200C to the processing device 90C. The testing software 91C of the processing device 90C is a calibration testing software 91C, which is able to look for the anchor point 4200C of the actual projected image 3000C, which is an actual anchor point 4200C, so as for positioning the actual projected image 3000C with the software to automatically calculate the deviance between the theoretical value and actual value, to obtain the projecting angel of the projection device 10C by inverse calculation, and to objectively obtain the quantitative calibration data of the projection device, which helps to implement the automatic calibration of the projection device 10C and to effectively enhance the calibration efficiency of the projection device 10C.

The calibration data saved through the processing device 90C can be directly used for rectifying semi-finished modules, and especially the projection angle adjustment of the semi-finished products. The calibration data can also be used for later stage software compensating the finished module, such as to transmit the calibration data to certain software as a reference for compensation data. Here, the testing method achieves the automatic calibration of the projection device 10C, so as to obtain the quantitative calibration data of the projection device 10C and expand the application scope of the calibration data, which is helpful in using the quantitative calibration in the field of optical image. Here, the actual projecting angel and deviation of the projection device 10C can be obtained by comparing the theoretical projection area with the positioning of the actual projected image 3000C positioned by the calibration testing software 91C, so as to objectively achieve the quantitative calibration of the projection device 10C and to provide effective reference data for the rectification and compensation for the products or semi-products of the subsequent projection device 10C.

FIG. 45B illustrated the position of the anchor point 4200C on the projection mask 2000C. If the length and width of the projection mask 2000 of the designated projection scope are respectively U and V, the coordinate of the anchor point 4200C on the projection mask 2000C will be (u, v). If v=0.5*V, then the theoretical projecting angel of the anchor point 4200C will be α=u/U*y1, (1C). Here, u is the lateral coordinate of the anchor point 4200C on the projection mask 2000C, U is the lateral length of the projection mask 2000C, and y1 is a theoretical projecting angel of the projection device 10C.

The length K and width H of the projected image 3000C of the receiving device 20C are known. Therefore, the coordinate of the anchor point 4200C on the actual projected image 3000C of the camera 21C or the receiving device 20C is (x'=W/2+L−D*tan α, y'=H/2).

The coordinate (x', y') of the anchor point 4200C is extracted from the projected image 3000C of the receiving device 20C with the method of circle center location. The coordinate is then substituted into the equation (1C) to obtain a through x' and to calculate and obtain y1'. The actual projecting angel of the projection device 10C is y1'. Through calculating the deviance between the theoretical value and the actual value, the projecting angel of the projection device 10C can be inverse calculated. The actual projecting angel y1' of the projection device 10C is applied as calibration data for the rectification of reverse deviance value of the half-finished product, so as to make the final projected image 3000C still fall in the theoretical projection area, which achieves the automatic quantitative calibration of the projection device 10C. Here, the objective calibration of the projection device 10C through software algorithm makes the quantized data more accurate.

FIGS. 46A-47C illustrated a preferred testing and identifying method for the mask pattern 1100D of the projection device 10D, for automatic decoding test of the image of the projection device 10D. The application of the mask pattern 1100D and decoding technology can achieve the decoding of the projections of static image and dynamic image. All the code points 1120D are required to be globally unique in dynamic scenario. The code formed by the mask pattern 1100D of the projection device 10D will directly affect the accuracy and resolution of the test. Only if the code points 1120D are unique, the projection device 10D can possibly process dynamic images. Here, the uniqueness of the code points 1120D in the coding scheme of the projection device 10D does not indicate the uniqueness of each symbol code. Rather, it indicates the shift of the codes in a decoding window 1130D. The position of the light source window on the light source side is ensured through the codes of the decoding window 1130D. Therefore, the positions of each symbol and each key check point are further confirmed.

Figure 46A:
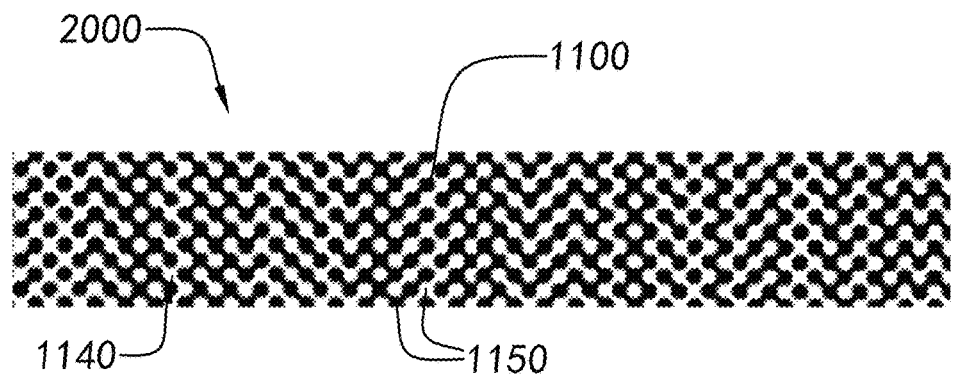
FIG. 46A illustrates a masked projection of the above preferred embodiment according to the present invention.

FIG. 46A is a mask pattern 1100D, which is a preferred projection mask 2000D of the present invention being projected on the target surface by the projection device 10D. The projected image 3000D is then received by the receiving device 20D. Next, the projected image 3000D is decoded by a testing software 91D of the processing device 90D, so as to form a 3D image. In other words, the mask pattern 1100D is a preferred specific projection mask 2000D. When the projected image 3000D is captured with the receiving device 20D, the decoding testing software 91D on the processing device 90D can conduct various processes, such as averaging and correlation, to the projected image 3000D and obtain the decoded data through a decoding algorithm. Here, the receiving device 20D is a camera 21D. By combining the parameters of the camera with the decoded data, the three-dimensional point cloud information can be obtained, so as to establish 3D model, survey and map object or scene, or even build colored model by combining with color data. Here, the point cloud refers to a collection or set of the three-dimensional coordinate information of every collecting point on the object surface captured with all kinds of 3D measurement devices. That is, the projection device 3000D projects the mask pattern 1100D onto the projection target 4000D. Then the receiving device 20D receives the projected image 3000D by obtaining the projected image 3000D on the projection target 4000D, so as to obtain the three-dimensional coordinate information. Due to the disorder of the point cloud, the static or dynamic images actually formed cannot be directly used. When a software is processing the data, it has to first combine the decoded data with the parameters of the camera to obtain effective 3D point cloud information, so the decoding algorithm can achieve the unique determination of the code point coordinates.

Then, the decoding algorithm can achieve both dynamic decoding and dynamic decoding, so as to process projected images 3000D based on static picture or dynamic video, which becomes more flexible and applicable.

The mask pattern 1100D is formed of a series of black and white code points 1120D. The decoded data can be obtained based on different combinations of the black and white code points 1120D. As the projected images 3000D are converted into the decoded data, the projected images 3000D can first be imported into static images or dynamic images, and then each be converted into decoded data. The first is to import the data of the projected image 3000D, for the preprocessing of the projected image 3000D, so as to obtain the centers of each of the black and white code points 1120D by obtaining the local maximum values. Then the decoding algorithm will be utilized to convert the data of the code point 1120D into the decoded data of the projected image 3000D.

Figure 46B:
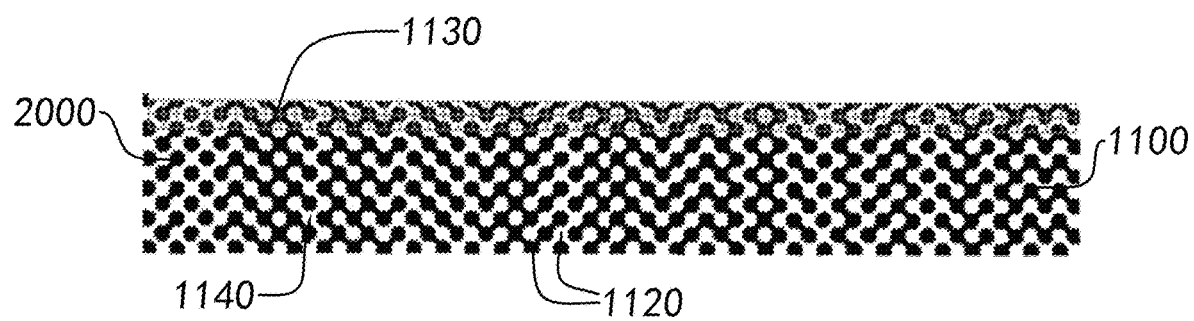
FIG. 46B is a perspective view of a mask window of the above preferred embodiment according to the present invention.

FIG. 46B illustrated that a decoding window 1130D is established in the mask pattern 1100D for seeking for the code element 1140D of the decoding window 1130D to capture the coordinate data of the matched projected image 3000D. The decoding window 1130D is Preferably a window with the extent of 2*3, so as to ensure that the decoded data corresponding to the decoding window 1130D of each extent is the unique determination at the position of the sequence of the mask pattern 1100D, which is adapted for dynamic decoding. The decoding algorithm applies the code element(s) 1140D constructed by pseudorandom m-sequence. Preferably, the pseudorandom m-sequence applies 6-stage pseudorandom sequence. Here, the form columns of the decoding window 1130D are black and white spacing periodic columns will globally unique codes, which is adapted for the testing in dynamic scenario and is able to process projected images 3000 based on static picture or dynamic video and achieve static decoding and dynamic decoding.

Figure 47A:
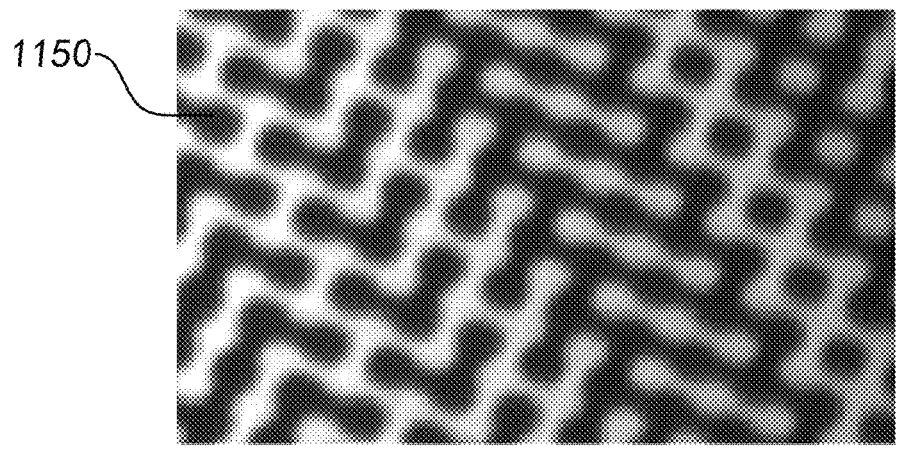
FIG. 47A is an original projected image of the above preferred embodiment according to the present invention.
Figure 47B:
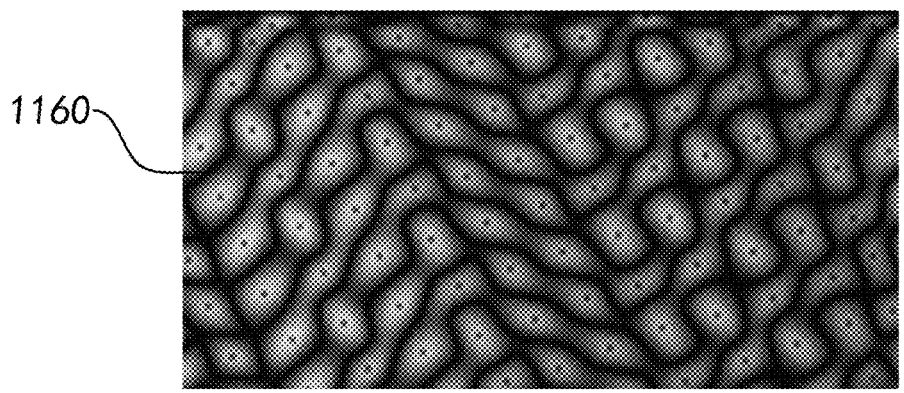
FIG. 47B is a preprocessed image according to the above preferred embodiment of the present invention.

Before conducting the decoding algorithm, the data of the projected image 3000D is preprocessed, in order to increase the recognition rate of the code element 1140D, so that the code points 1120D projected by the projection device 10D are more easy to be extracted, which greatly enhances the final decoding rate. Here, FIG. 47A illustrated an original image 1150D of the projected image 3000D. Based on the figure, the original image is vaguer, so it is harder to extract the code points 1120D therefrom. If the original image is used directly, it will be harder to extract the code point 1120D, and result in low decoding rate. FIG. 47B illustrated the preprocessed image 1160D obtained by preprocessing the original image. The preprocessed image 1160D is more clear and is able to show effective testing centers for locating and aligning the code points 1120D, which helps to enhance the decoding rate.

Here, the preprocessing is to first import the original image, to conduct averaging and correlating processes to the original image, and to mark the local maximum gray values for clearly display the preprocessed image 1160D. Therefore, the center of each black and white code points 1120D can be obtained, so as to enhance the recognition rate of the code elements 1140D and make it more easily to extract the projection code point 1120D.

Figure 47C:
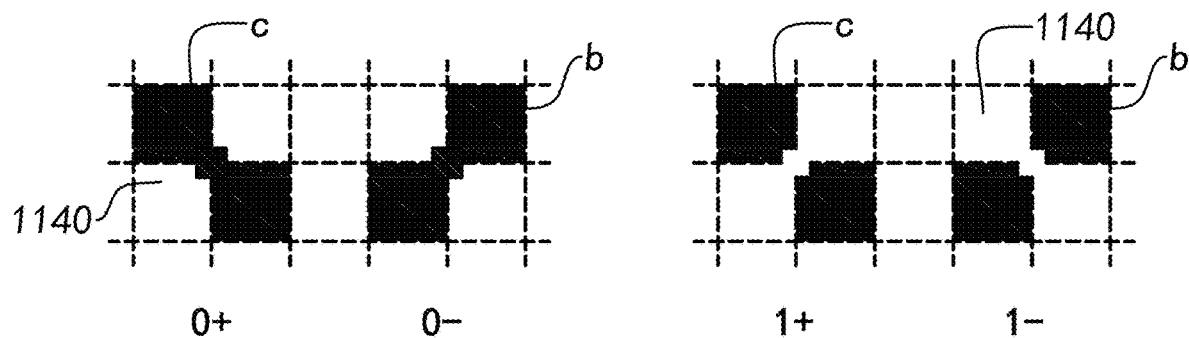
FIG. 47C illustrates images of the types of the code elements according to the above preferred embodiment of the present invention.
Figure 48:
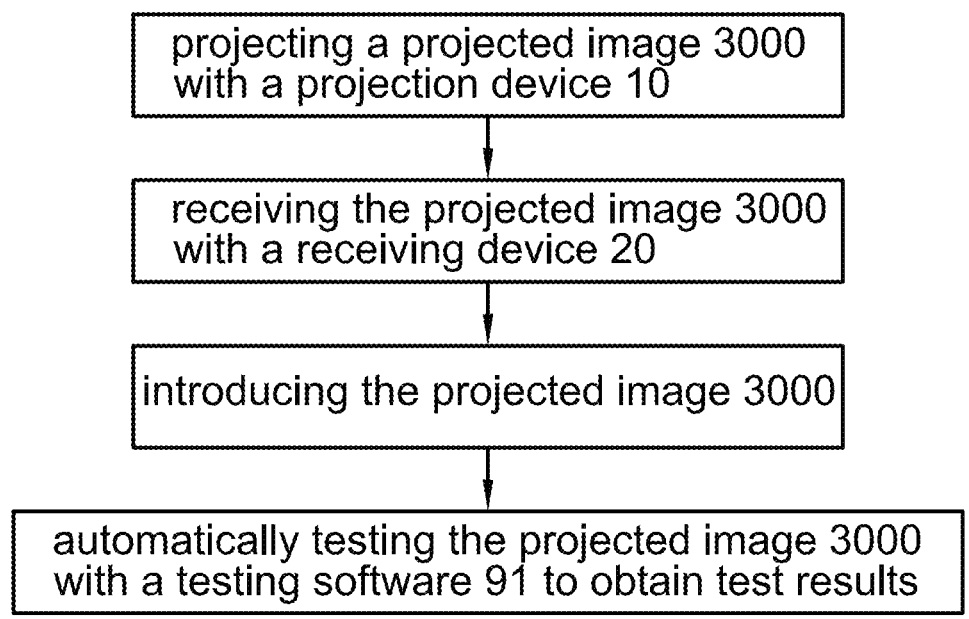
FIG. 48 is a flow diagram of the above preferred embodiment according to the present invention.
Figure 49:
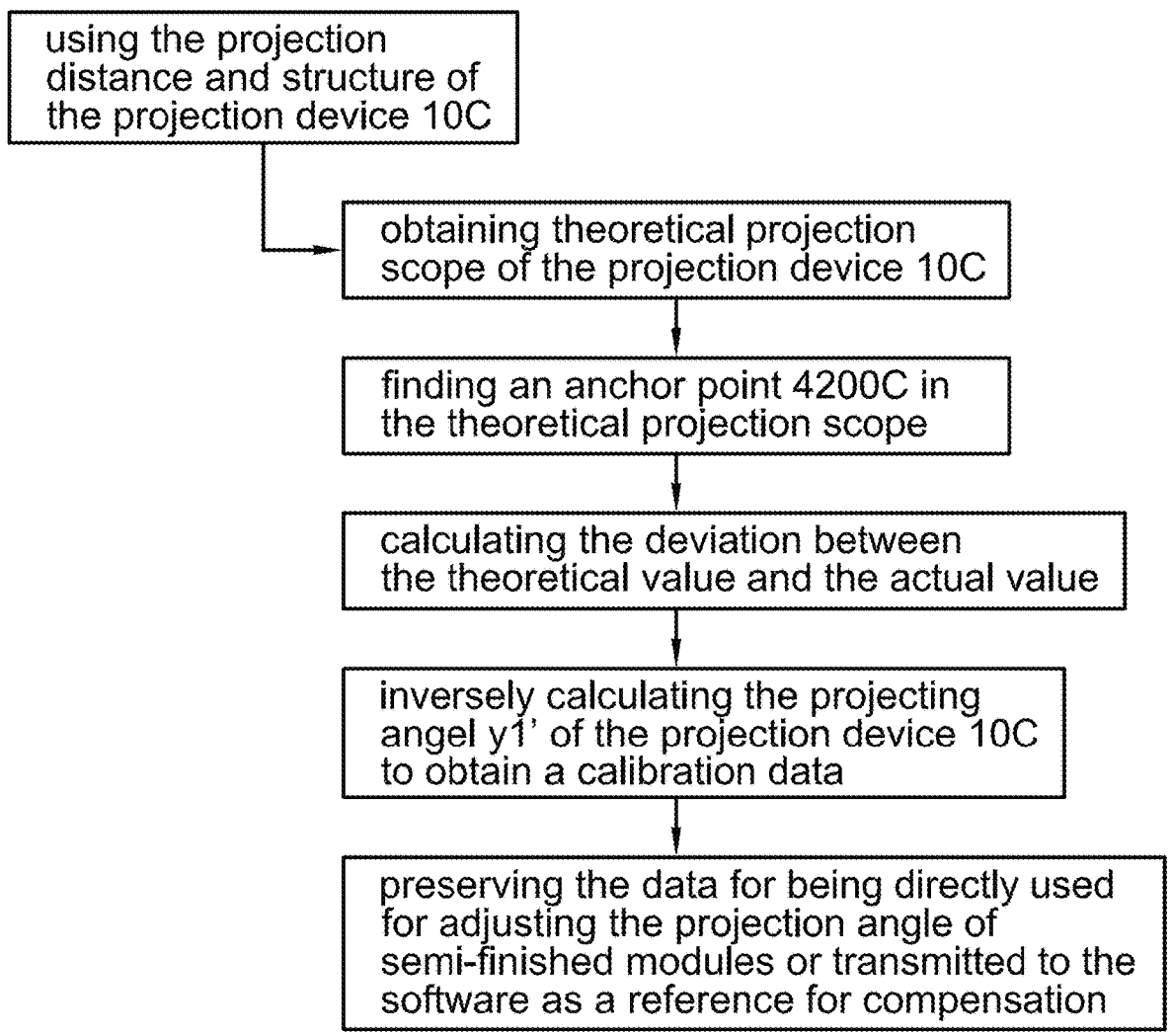
FIG. 49 is a flow diagram of the calibration test of the above preferred embodiment according to the present invention.
Figure 50:
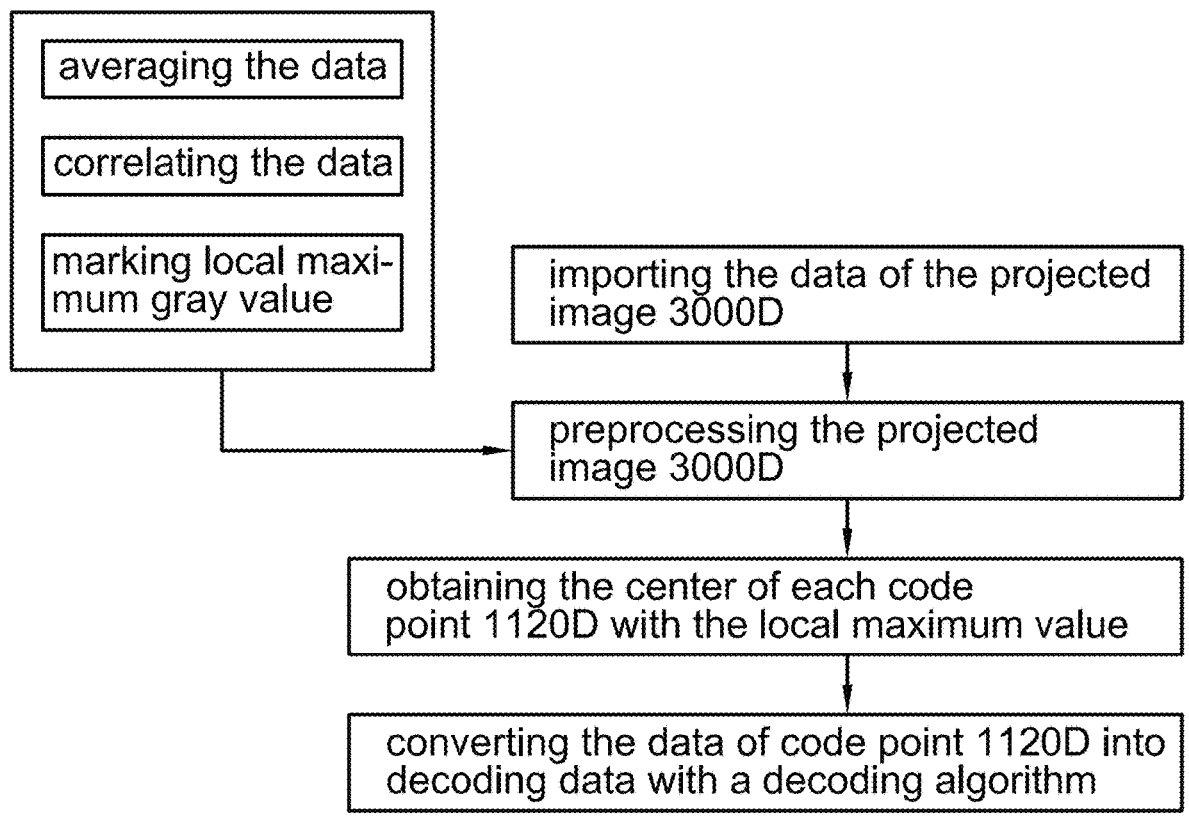
FIG. 50 is a flow diagram of the decoding test of the above preferred embodiment according to the present invention.

FIG. 47C refers to the expression of the types of the code element 1140D. Preferably, there are four types of the code element 1140D as defined in FIG. 47C, which are respectively 0+, 0−, 1+, and 1−. The projected image 3000D are modelized into the decoding sequence through classification, wherein 0+ and 1+ are classified as c, and 0− and 1− are classified as b, so as to obtain the decoding sequence as follows:

$$c_0\ b_1\ c_2\ \boxed{b_3\ c_4\ b_5}\ c_6\ b_7\ c_8\ b_9\ c_{10}\ b_{11}\ c_{12}\ b_{13}\ c_{14}\ b_{15} \\ b_0\ c_1\ b_2\ \boxed{c_3\ b_4\ c_5}\ b_6\ c_7\ b_8\ c_9\ b_{10}\ c_{11}\ b_{12}\ c_{13}\ b_{14}\ c_{15} \\ c_0\ b_1\ c_2\ \boxed{b_3\ c_4\ b_5}\ c_6\ b_7\ c_8\ b_9\ c_{10}\ b_{11}\ c_{12}\ b_{13}\ c_{14}\ b_{15} \\ b_0\ c_1\ b_2\ c_3\ b_4\ c_5\ b_6\ c_7\ b_8\ c_9\ b_{10}\ c_{11}\ b_{12}\ c_{13}\ b_{14}\ c_{15} \tag{1D}$$

The following equations can be obtained through sequence (1D).

$$\boxed{\begin{array}{c} c_3\ b_4\ c_5 \\ b_3\ c_4\ b_5 \\ c_3\ b_4\ c_5 \end{array}}\ ((c_3, c_4, c_5), (b_3, b_4, b_5)) \rightarrow j = 4 \tag{2D}$$

$$\boxed{\begin{array}{c} b_3\ c_4\ b_5 \\ c_3\ b_4\ c_5 \\ b_3\ c_4\ b_5 \end{array}}\ ((c_3, c_4, c_5), (b_3, b_4, b_5)) \rightarrow j = 4 \tag{3D}$$

According to (2D) and (3D), any pairing of 2*3 of the decoding windows 1130D of a column are identical, and any pairing of 2*3 of the decoding windows 1130D of the same two rows are unique. In other words, codes of all 2*3 of the decoding windows 1130D are all unique, which satisfies the requirement of the nature of M-array, so as to achieve the unique determination of the coordinate of the code point 1120D for the projection decoding of static images and dynamic images.

The pairing data of each 2*3 decoding window 1130D are captured through the preprocessed projected image. The number of columns of the paired data in the projection mask 2000D and the coordinate data of the paired data in the projected image 3000D are found, for converting the code point data into decoded data with the decoding algorithm. In other words, the decoded data is obtained through seeking for the code point data of the decoding window 1130D through the paired data, pairing the data with the window of the predesigned coding scheme, and extracting the coordinate position of the row and row of the code point data in the coding scheme. The decoding algorithm is applied to the projected image 3000D to extract the code point information in the image and converts them into decoded data, so as to make the decoded data more accurate that is useful for future development and the expansion of the application scope of the decoding algorithm.

It is worth mentioning that the definition and clarity testing software, the defective pixel testing software, the calibration testing software, and the decoding testing software of the testing software 91 can be sub-softwares of a testing software system or four independent testing softwares.

A testing method of structured light projection system, for testing a projection device, comprising the following steps:

(S100) forming a projected image 3000 on a projection target 4000 through the projecting of the projection device 10;

(S200) receiving the projected image 3000 with a receiving device 20; and (S300) introducing the projected image 3000 to a processing device 90 and automatically identifying the projected image 3000 with a testing software 91 in the processing device 90, so as to objectively obtain the parameter information and performance of the projection device 10.

Here, the method further comprises step (S400): preserving the data of the projection device 10, so as to provide objective reference of the projection device 10.

Here, the method further comprises step (S500): establishing standard relative position model for the receiving device 20 and the projection device 10, so as to obtain the projected image 3000.

Here, the step (S100) comprises step (S101): projecting a projection mask 2000 of the projection device 10 to the projection target 4000 to form the projected image 3000.

Here, the step (S300) comprises step (S310): calculating the resolution of the projected image 3000A with the testing software 91A, so as to automatically obtain the pattern definition of the projection mask 2000A of the projection device 10A.

Here, the step (S200) comprises step (S210): having the receiving device 20A to receive the projected image 3000A on the projection target 4000A through diffused reflection.

Here, in the step (S200) the receiving device 20A is a photosensitive camera 21A for correspondingly identify the wavelength of the light projected by the projection device 10A.

Here, the step (S500) comprises step (S510): establishing standard relative position model for the photosensitive camera 21A and the projection device 10A through modeling, so that the field of view coverage of the receiving device 20A is larger than the projection plane 4100A of the projection device 10A.

Here, the step (S300) comprises step (S320): testing the projected image 3000B with the testing software 91B, so as to automatically obtain the test result for the defective pixel of the projection device 10B.

Here, the step (S320) comprises the following steps:

(S321) converting the projected image 3000B into a grayscale, so as to extract the luminance difference of the projected image 3000B;

(S322) obtaining a survey area in the projected image 3000B that is greater than the setting value; and (S323) contrasting the projection masks 2000B between the survey area and the projection device 10B, so as to objectively identify the defective pixel(s) in the projection mask 2000B.

Here, in the step (S320), the survey area is a block area with the size of m*n. When the block area differs from the code point of the projection mask 2000B, the block area will be automatically determined as a defective pixel.

In the step (S200), the projected image 3000B is obtained through the receiving device 20B for conducting fast and real time defective pixel test for the projected image 3000B.

The step (S300) comprises step (S330): testing the projected image 3000C with the testing software 91C, so as to automatically obtain the quantitative calibration data of the projection device 10C.

Here, the step (S330) comprises the following steps:

(S331) obtaining a theoretical projection area of the projection device 10C through modeling and calculation;

(S332) calculating the deviance between the theoretical value and the actual value by combining the calculation method of the projected image 3000C to obtain the deviation of the projection of the projection device 10C; and (S333) obtaining the actual projecting angel and calibration data of the projection device 10C through inverse calculation.

The step (S331) comprises step (S3311): obtaining theoretical projection scope with the distance and structure of the projection device 10C.

Here, the step (S332) further comprises the following steps:

(S3321) finding an anchor point 4200C in the theoretical projection scope, wherein the anchor point 4200C is selected at a preset coordinate in the projection mask 2000C

(S3322) calculating the projecting angel of the anchor point 4200C as $\alpha = u/U * y1$ (1C), wherein u is the lateral coordinate of the anchor point 4200C on the projection mask 2000C, U is the lateral length of the projection mask 2000C, and y1 is a theoretical projecting angel of the projection device 10C; and (S3323) calculating the actual coordinate of the anchor point 4200C on the projected image 3000C as $(x'=W/2+L-D*\tan\alpha, y'=H/2)$, whereas W is the length of the projected image 3000C, H is the width of the projected image 3000C, L is the optic axis distance between the receiving device 20C and the projection device 10C, and D is a projection plane 4100C distance between the projection target 4000C and the receiving device 20C.

Here, the step (S333) comprises the following steps:

(S3331) extracting the coordinate (x', y') for the actual anchor point 4200C from the projected image 3000C of the receiving device 20C by circle center location.

(S3332) substituting the coordinate of the actual anchor point 4200C into (1C) to obtain the actual projecting angel y1' of the projection device 10C; and (S3333) applying the actual projecting angel y1' of the projection device 10C as a calibration data, for utilizing the reverse deviance value to adjust the projection angle of the projection device 10C, so as to rectify the projected image 3000C to the theoretical projection area.

The step (S400) comprises step (S430): transmitting the calibration data to the compensation software of the finished module, so as to objectively provide reference for the software compensation data of the later stage of the finished module.

The step (S300) comprises step (S340): testing the projected image 3000D with the testing software 91D, so as to automatically obtain the decoded data of the projected image 3000D.

Here, the step (S340) comprises the following steps:

(S341) preprocessing the imported projected image 3000D, so as to extract the code point 1120D of the projection of the projection device 10D;

(S342) obtaining the center of each code point 1120D for obtaining the code point data; and (S343) converting the code point data into decoded data with a decoding algorithm.

Here, the step (S341) comprises the following steps:

(S3411) averaging the data of the projected image;

(S3412) correlating the data of the projected image; and (S3413) marking local maximum gray value, for identifying the code element 1140D(s) of the projected image 3000D.

Here, the decoding algorithm of the step (S343) comprises the following steps:

(S3431) organizing a decoding window 1130D on the projection mask 2000D to achieve a unique determination of the code point 1120D coordinate;

(S3412) seeking for the code element 1140D(s) of the decoding window 1130D, so as for the projected image 3000D to obtain the pairing data of the decoding window 1130D; and (S3413) extracting the number of columns of the projection mask 2000D from the pairing data of the decoding window 1130D and the coordinate data of the pairing data in the projected image 3000D.

The decoding window 1130D of the step (S343) applies a window with the extent of 2*3.

The decoding applies the code element 1140D constructed with pseudorandom m-sequence, so that the position of the decoded data corresponding to each 2*3 decoding window 1130D in the projection mask 2000D sequence is uniquely determined, which is adapted for both dynamic decoding and static decoding.

Here, the pseudorandom m-sequence applies 6-stage pseudorandom sequence.

Here, the decoding algorithm of the step (S343) further comprises step (S3434): defining the types of code element 1140D as 0+, 0−, 1+, 1−, classifying 0+ and 1+ as c, and classifying 0− and 1− as b, so as to convert the projected image model into decoding sequence(s).

It is worth mentioning that the testing method can apply for not only the test of projection device, but also other structured light projection system to increase the scope of application.

The above content are examples of specific embodiment of the present invention. Those devices and structures that have not described in detail shall be understood as being applied with regular and universal device and method in the present field.

Also, the above mentioned embodiments of the present invention are examples to describe technical solutions of the present invention, rather than to limit the technical solutions or the scope of the present invention. Improvements that apply equivalent technique, equivalent device, etc. to the technical solution disclosed in the claims and specification of the present invention shall be considered as not exceeding the scope disclosed in the claims and specification of the present invention.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. An imaging device which is installed in an electronic mobile device which is selected from the group consisting of a mobile phone, a laptop and a tablet computer, comprising:
   a light deflection projection device comprising a light source which emits a projective light, at least a light deflection device which comprises a fixed light deflection element deflecting said projective light, a grating, a condensing lens group, and an emission lens, wherein when said projective light emitted by said light source passes through said grating, said projective light is then refracted and aggregated by said condensing lens group, wherein said projective light is then deflected by said light deflection element and eventually emitted out of said light deflection projection device from said emission lens, wherein a relative position between said light source and said light deflection element is fixed, wherein after the deflection of said light deflection element, said deflected projective light is projected to the outside of the light projection device from a side thereof in such a manner that a projection direction of said deflected projective light is transversely changed to a direction along a thickness of said light deflection projection device, wherein a thickness of said light deflection projection device is corresponding to a total thickness of said light deflection element and said emission lens, so as to reduce a thickness of the electronic mobile device;
   at least a receiving device; and
   a processor, wherein said projective light emitted from said light projection device is reflected after reaching a surface of a target object, wherein said receiving device receives said projective light reflected by the surface of the target object and transmits an information of said projective light to said processor, wherein said processor processes the information to obtain a 3D image information.

2. The light imaging device, as recited in claim 1, wherein said light deflection element has a reflecting surface which is arranged aslope relatively with said projection direction of said light source, wherein at least part of said projective light arriving said light deflection element is emitted from said emission lens to said light deflection projection device after reflect, wherein said light deflection element comprises a dioptric lens which is a triple prism, wherein at least part of said projective light that arrived said light deflection element will be emitted from said emission lens to said light deflection projection device after refraction.

3. The imaging device, as recited in claim 2, wherein the thickness of said light deflection projection device is not greater than 6 mm.

4. The imaging device, as recited in claim 1, wherein said imaging device is installed in the electronic mobile device that has a display screen, wherein said projection device and said receiving device are on the front side or back side of the electronic mobile device, wherein the display screen is adapted for displaying said 3D image information.

5. The imaging device, as recited in claim 4, wherein said light deflection element is to reflect and/or refract said projective light, wherein an end of said light deflection projection device along a longitudinal direction has said light source arranged thereon, while the other end of an opposite side of said light deflection projection device has said light deflection element and said emission lens arranged thereon, wherein said light source provides said projective light projected along the longitudinal direction, wherein by the deflection of said light deflection element, at least part of said projective light is emitted from said emission lens along the lateral direction.

6. An electronic device, comprising:
   an electronic mobile device which is selected from the group consisting of a mobile phone, a laptop and a tablet computer; and
   an imaging device, which is installed in said electronic mobile device, comprising:
   a light deflection projection device comprising a light source which emits a projective light, at least a light deflection device which comprises a fixed light deflection element deflecting said projective light, a grating, a condensing lens group, and an emission lens, wherein when said projective light emitted by said light source passes through said grating, said projective light is then refracted and aggregated by said condensing lens group, wherein said projective light is then deflected by said light deflection element and eventually emitted out of said light deflection projection device from said emission lens, wherein a relative position between said light source and said light deflection element is fixed, wherein after the deflection of said light deflection element, said deflected projective light is projected to the outside of the light projection device from a side thereof in such a manner that a projection direction of said deflected projective light is transversely changed to a direction along a thickness of said light deflection projection device, wherein a thickness of said light deflection projection device is corresponding to a total thickness of said light deflection element and said emission lens, so as to reduce a thickness of said electronic mobile device;

at least a receiving device; and a processor, wherein said projective light emitted from said light projection device is reflected after reaching a surface of a target object, wherein said receiving device receives said projective light reflected by the surface of the target object and transmits an information of said projective light to said processor, wherein said processor processes the information to obtain a 3D image information.

7. The electronic device, as recited in claim 6, wherein said electronic mobile device has a display screen, wherein said projection device and said receiving device are on one of the front side and back side of said electronic mobile device, wherein the display screen is adapted for displaying said 3D image information.

8. The electronic device, as recited in claim 6, wherein said light deflection element comprises a triple prism for refracting said projective light, wherein said light source provides said projective light projected along the longitudinal direction, wherein by the refraction of said prism, at least a part of said projective light is emitted from said emission lens along the lateral direction.

* * * * *